US012628532B2

(12) United States Patent
Lee et al.

(10) Patent No.: US 12,628,532 B2
(45) Date of Patent: May 12, 2026

(54) LIGHT EMITTING ELEMENT AND METHOD FOR MANUFACTURING THE SAME

(71) Applicants: Samsung Display Co., Ltd., Yongin-si (KR); KOREA UNIVERSITY Research and Business Foundation, Seoul (KR)

(72) Inventors: Youngtak Lee, Yongin-si (KR); Seungwon Lee, Seoul (KR); Byeong-Kwon Ju, Seoul (KR); Jaewon Park, Seoul (KR); Jun-Young Park, Seoul (KR); Jae Young Lee, Yongin-si (KR); Young Hyun Hwang, Seoul (KR); Ha Hwang, Seoul (KR)

(73) Assignees: SAMSUNG DISPLAY CO., LTD., Gyeonggi-Do (KR); KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 476 days.

(21) Appl. No.: 18/305,530

(22) Filed: Apr. 24, 2023

(65) Prior Publication Data

US 2023/0397476 A1 Dec. 7, 2023

(30) Foreign Application Priority Data

Jun. 3, 2022 (KR) ........................ 10-2022-0068208

(51) Int. Cl.
*H10K 59/80* (2023.01)
*H10K 50/818* (2023.01)
(Continued)

(52) U.S. Cl.
CPC ......... *H10K 59/876* (2023.02); *H10K 50/818* (2023.02); *H10K 50/822* (2023.02);
(Continued)

(58) Field of Classification Search
CPC ......... H10K 50/852; H10K 50/81–818; H10K 59/876; H10K 59/8051–80518
See application file for complete search history.

(56) References Cited

U.S. PATENT DOCUMENTS

| | | | |
|---|---|---|---|
| 9,064,825 | B2 | 6/2015 | Kim |
| 9,583,734 | B2 | 2/2017 | Shim et al. |

(Continued)

FOREIGN PATENT DOCUMENTS

| | | |
|---|---|---|
| KR | 10-1478313 | 12/2014 |
| KR | 10-2017-0023368 | 3/2017 |

(Continued)

OTHER PUBLICATIONS

X. Fu et al., Recovering cavity effects in corrugated organic light emitting diodes, Oct. 12, 2020, Optics Express, vol. 28, No. 12 , pp. 32214-32225. (Year: 2020).*

(Continued)

*Primary Examiner* — Victoria K. Hall
(74) *Attorney, Agent, or Firm* — CANTOR COLBURN LLP

(57) ABSTRACT

Embodiments provide a light emitting element that includes a base layer, a first electrode disposed on the base layer, a second electrode facing the first electrode, and functional layers disposed between the first electrode and the second electrode. The first electrode includes a first layer disposed on the base layer, and a second layer disposed on the first layer and including a reflective metal. Photonic crystal pore patterns, each spaced apart along a first direction and extending along a second direction crossing the first direction, are defined between the base layer and the first layer.

20 Claims, 11 Drawing Sheets

(51) Int. Cl.

| | |
|---|---|
| ***H10K 50/822*** | (2023.01) |
| ***H10K 50/852*** | (2023.01) |
| ***H10K 59/12*** | (2023.01) |
| ***H10K 71/00*** | (2023.01) |
| ***H10K 71/60*** | (2023.01) |
| ***H10K 77/10*** | (2023.01) |
| *H10K 50/15* | (2023.01) |
| *H10K 50/16* | (2023.01) |
| *H10K 50/82* | (2023.01) |
| *H10K 50/856* | (2023.01) |

(52) U.S. Cl.

CPC ....... *H10K 50/852* (2023.02); *H10K 59/1201* (2023.02); *H10K 71/00* (2023.02); *H10K 71/60* (2023.02); *H10K 71/621* (2023.02); *H10K 77/111* (2023.02); *H10K 50/15* (2023.02); *H10K 50/16* (2023.02); *H10K 50/82* (2023.02); *H10K 50/856* (2023.02)

(56) References Cited

U.S. PATENT DOCUMENTS

| | | | | |
|---|---|---|---|---|
| 10,014,481 | B2 | 7/2018 | Lee et al. | |
| 10,388,224 | B2 | 8/2019 | Kim et al. | |
| 11,031,450 | B2 | 6/2021 | Kim | |
| 11,217,776 | B2 | 1/2022 | Kim | |
| 2011/0140114 | A1* | 6/2011 | Ko | H10K 59/80518 438/23 |
| 2020/0136092 | A1* | 4/2020 | Kim | H10K 59/876 |

FOREIGN PATENT DOCUMENTS

| | | |
|---|---|---|
| KR | 10-2018-0040038 | 4/2018 |
| KR | 10-1854186 | 5/2018 |
| KR | 10-1988217 | 6/2019 |
| KR | 10-2036326 | 10/2019 |
| KR | 10-2020-0025618 | 3/2020 |
| KR | 10-2020-0048310 | 5/2020 |

OTHER PUBLICATIONS

M. Fujita et al., Reduction of operating voltage in organic light-emitting diode by corrugated photonic crystal structure, Dec. 6, 2004, Applied Physics Letters, vol. 85, No. 23, pp. 5769-5771. (Year: 2004).*

Y. Shim et al., An extremely low-index photonic crystal layer for enhanced light extraction from organic light-emitting diodes, Jan. 15, 2016, Nanoscale, vol. 8, pp. 4113-4120. (Year: 2016).*

Yong Sub Shim et al., "Extremely Low-Index Photonic Crystal Layer for Enhanced Light Extraction from Organic Light-Emitting Diodes", Nanoscale, Jan. 15, 2016, pp. 1-7.

* cited by examiner

LIGHT EMITTING ELEMENT AND METHOD FOR MANUFACTURING THE SAME

CROSS-REFERENCE TO RELATED APPLICATION(S)

This application claims priority to and benefits of Korean Patent Application No. 10-2022-0068208 under 35 U.S.C. § 119, filed on Jun. 3, 2022 in the Korean Intellectual Property Office, the entire contents of which are incorporated herein by reference.

BACKGROUND

1. Technical Field

The disclosure relates to a light emitting element which is usable as a stretchable electrode, and a method for manufacturing the same.

2. Description of the Related Art

There is currently a continuous demand for a flexible and readily deformable stretchable electronic element technology, and such stretchable electronic element technology is expected to be highly applicable to technical fields such as wearable elements and robot sensor skin.

Stretchable electronic element technology goes beyond simply having excellent bendable or flexible properties to show high light transmittance, and requires electrodes with excellent electrical and mechanical properties even in a stretched or contracted form.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light emitting element having increased luminous efficiency and improved optical properties such as viewing angle and color purity.

The disclosure further provides a method for manufacturing a light emitting element, whereby the method is capable of manufacturing a light emitting element having high luminous efficiency and improved optical properties while reducing process costs through a simple process.

An embodiment provides a light emitting element which may include a base layer, a first electrode disposed on a base layer, a second electrode facing the first electrode, and functional layers disposed between the first electrode and the second electrode, wherein the first electrode may include a first layer disposed on the base layer, and a second layer disposed on the first layer and including a reflective metal, and photonic crystal pore patterns, each spaced apart along a first direction and extending along a second direction crossing the first direction, may be defined between the base layer and the first layer.

In an embodiment, the photonic crystal pore patterns may each have a width in the first direction in a range of about 50 nm to about 550 nm.

In an embodiment, the photonic crystal pore patterns may each have a height in a third direction crossing each of the first direction and the second direction in a range of about 20 nm to about 110 nm.

In an embodiment, the first electrode may further include a third layer disposed on the second layer and including a transparent conductive oxide.

In an embodiment, an upper surface of the third layer may be a flat surface.

In an embodiment, the photonic crystal pore patterns may each be in a vacuum state.

In an embodiment, the first layer may include a first portion disposed between the photonic crystal pore patterns, and a second portion extending from the first portion and disposed on the photonic crystal pore patterns.

In an embodiment, the second layer may include a third portion disposed on the first portion, and a fourth portion extending from the third portion and disposed on the second portion.

In an embodiment, a thickness of the first portion and a thickness of the second portion may be substantially the same.

In an embodiment, the first portion may contact an upper surface of the base layer, and the photonic crystal pore patterns may be defined between the base layer and the second portion.

In an embodiment, the first layer may include indium zinc oxide, indium tin oxide, or any combination thereof, and the second layer may include silver (Ag), gold (Au), aluminum (Al), or any combination thereof.

In an embodiment, the functional layers may include a hole transport region disposed on the first electrode, an emission layer disposed on the hole transport region, and an electron transport region disposed on the emission layer.

In an embodiment, an upper surface of the base layer may be a flat surface.

An embodiment provides a light emitting element which may include a base layer, a first electrode disposed on the base layer, a second electrode facing the first electrode, and functional layers disposed between the first electrode and the second electrode, wherein the first electrode may include: a first layer disposed on the base layer, and having a portion thereof disposed directly on the base layer and a remaining portion thereof disposed to be spaced apart from the base layer; a second layer disposed on the first layer and including a reflective metal; and a third layer disposed on the second layer and including a transparent conductive oxide.

An embodiment provides a method for manufacturing a display device which may include forming a first electrode on a base layer, forming functional layers on the first electrode, and forming a second electrode on the functional layers, wherein the forming of the first electrode may include forming photoresist patterns each spaced apart along a first direction on the base layer and extending in a second direction crossing the first direction, providing a transparent conductive oxide to cover the photoresist patterns to form a first layer, removing the photoresist patterns after the forming of the first layer, and providing a reflective metal on the first layer to form a second layer.

In an embodiment, the forming of the first electrode may further include providing a transparent conductive oxide on the second layer to form a third layer.

In an embodiment, in the removing of the photoresist patterns, photonic crystal pore patterns in a vacuum state may be formed between the base layer and the first layer.

In an embodiment, the first layer may include a first portion disposed between the photonic crystal pore patterns, and a second portion extending from the first portion and disposed on the photonic crystal pore patterns, wherein the first portion may contact an upper surface of the base layer, and the photonic crystal pore patterns may be defined between the base layer and the second portion.

In an embodiment, the transparent conductive oxide may include indium zinc oxide, indium tin oxide, or any combination thereof, and the reflective metal may include silver (Ag), gold (Au), aluminum (Al), or any combination thereof.

In an embodiment, the forming of the photoresist patterns may be performed through laser interference lithography.

It is to be understood that the embodiments above are described in a generic and explanatory sense only and not for the purpose of limitation, and the disclosure is not limited to the embodiments described above.

BRIEF DESCRIPTION OF THE DRAWINGS

The accompanying drawings are included to provide a further understanding of the embodiments, and are incorporated in and constitute a part of this specification. The drawings illustrate embodiments of the disclosure and principles thereof. The above and other aspects and features of the disclosure will become more apparent by describing in detail embodiments thereof with reference to the accompanying drawings, in which.

DETAILED DESCRIPTION OF THE EMBODIMENTS

Figure 1:
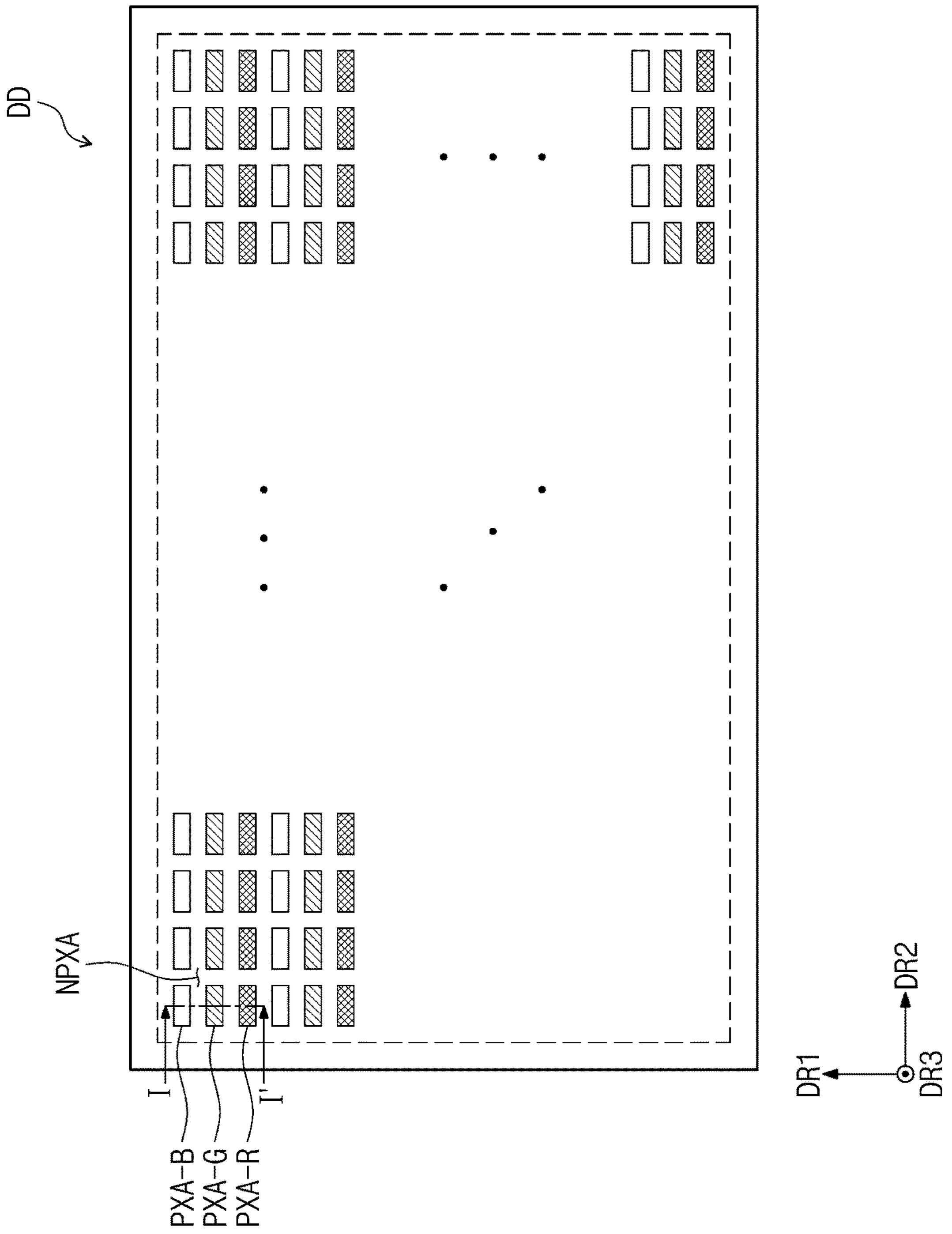
FIG. 1 is a schematic plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the specification, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the specification, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group consisting of" for the purpose of its meaning and interpretation. For example, "at least one of A, B, and C" may be understood to mean A only, B only, C only, or any combination of two or more of A, B, and C, such as ABC, ACC, BC, or CC. When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments will be described with reference to the accompanying drawings.

Figure 2:
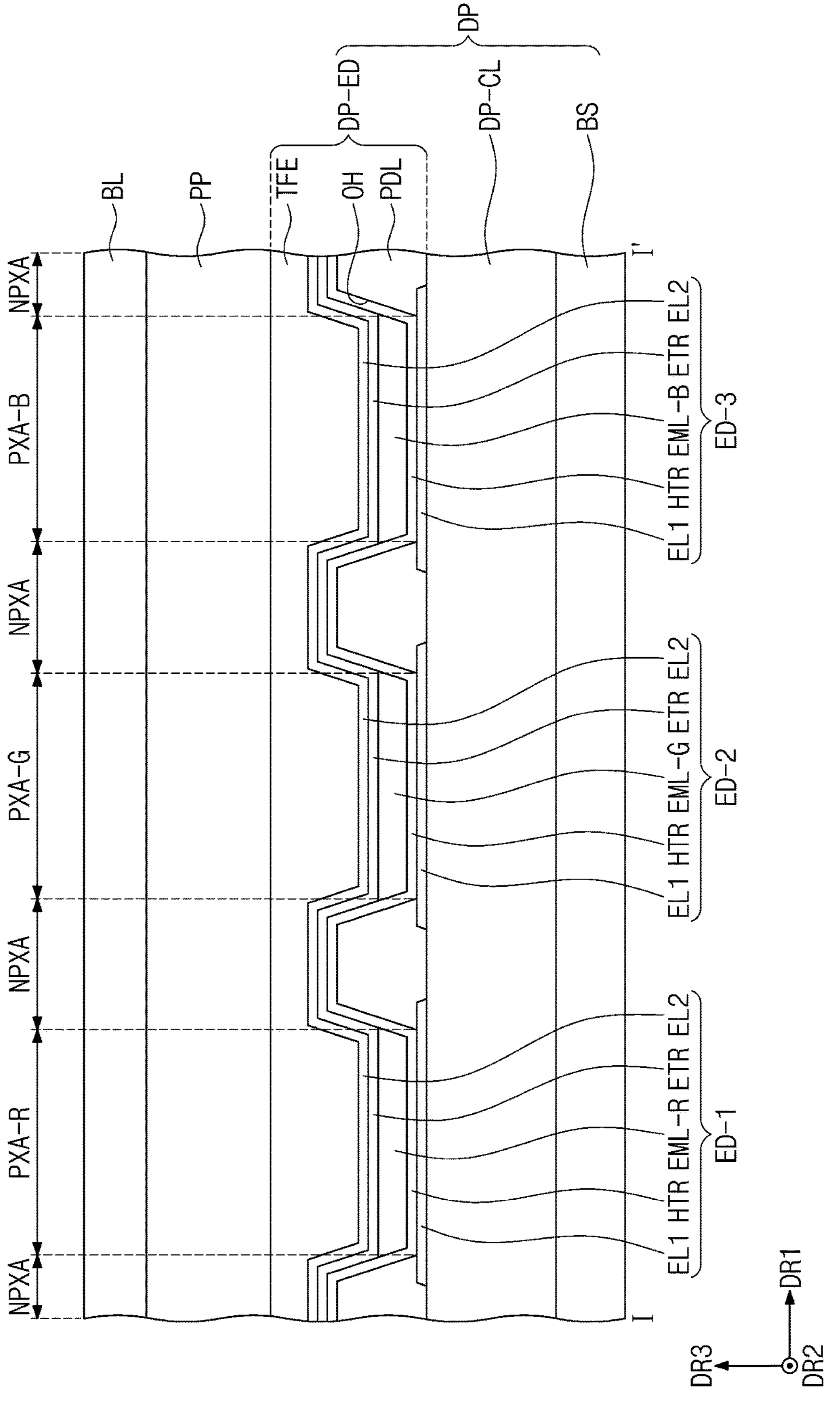
FIG. 2 is a schematic cross-sectional view of a display device according to an embodiment of the inventive concept.

FIG. 1 is a schematic plan view of a display device according to an embodiment. FIG. 2 is a schematic cross-sectional view of a display device according to an embodiment. FIG. 2 is a schematic cross-sectional view showing a portion corresponding to line I-I' of FIG. 1.

A display device DD may include a display panel DP and an optical layer PP disposed on the display panel DP. The display panel DP includes light emitting elements ED-1, ED-2, and ED-3. The display device DD may include multiples of each of the light emitting elements ED-1, ED-2, and ED-3. The optical layer PP may be disposed on the display panel DP and may control light that is reflected at the display panel DP from an external light. The optical layer PP may include, for example, a polarizing layer or a color filter layer. Although not shown in the drawings, in an embodiment, the optical layer PP may be omitted from the display device DD.

A second base substrate BL may be disposed on the optical layer PP. The second base substrate BL may provide a base surface on which the optical layer PP is disposed. The second base substrate BL may be a glass substrate, a metal substrate, a plastic substrate, etc. However, embodiments are not limited thereto, and the second base substrate BL may include an inorganic layer, an organic layer, or a composite material layer. Although not shown in the drawings, in an embodiment, the second base substrate BL may be omitted.

The display device DD according to an embodiment may further include a filling layer (not shown). The filling layer (not shown) may be disposed between a display element layer DP-ED and the second base substrate BL. The filling layer (not shown) may be disposed between an encapsulation layer TFE and the optical layer PP. The filling layer (not shown) may be an organic material layer. The filling layer (not shown) may include at least one of an acrylic resin, a silicone-based resin, or an epoxy-based resin.

The display panel DP may include a first base substrate BS, a circuit layer DP-CL provided on the first base substrate BS, and a display element layer DP-ED. The display element layer DP-ED may include pixel defining films PDL, light emitting elements ED-1, ED-2, and ED-3 disposed between the pixel defining films PDL, and an encapsulation layer TFE disposed on the light emitting elements ED-1, ED-2, and ED-3.

The first base substrate BS may provide a base surface on which the display element layer DP-ED is disposed. The first base substrate BS may be a glass substrate, a metal substrate, a plastic substrate, etc. However, embodiments are not limited thereto, and the first base substrate BS may include an inorganic layer, an organic layer, or a composite material layer.

In an embodiment, the circuit layer DP-CL may be disposed on the first base substrate BS, and the circuit layer DP-CL may include transistors (not shown). The transistors (not shown) may each include a control electrode, an input electrode, and an output electrode. For example, the circuit layer DP-CL may include a switching transistor and a driving transistor for driving the light emitting elements ED-1, ED-2, and ED-3 of the display element layer DP-ED.

The light emitting elements ED-1, ED-2, and ED-3 may each have a structure of a light emitting element ED of an embodiment according to any of FIGS. 3A and 3B, which will be described later. The light emitting elements ED-1, ED-2, and ED-3 may each include a first electrode EL1, a hole transport region HTR, emission layers EML-R, EML-G, and EML-B, an electron transport region ETR, and a second electrode EL2.

FIG. 2 shows an embodiment in which the emission layers EML-R, EML-G, and EML-B of the light emitting elements ED-1, ED-2, and ED-3 are disposed in openings OH defined in the pixel defining films PDL, and a hole transport region HTR, an electron transport region ETR, and a second electrode EL2 are each provided as a common layer for all of the light emitting elements ED-1, ED-2, and ED-3. However, embodiments are not limited thereto. Although not shown in FIG. 2, in an embodiment, the hole transport region HTR and the electron transport region ETR may each be patterned and provided in the openings OH defined in the pixel defining films PDL. For example, in an embodiment, the hole transport region HTR, the emission layers EML-R, EML-G, and EML-B, and the electron transport region ETR, etc., of the light emitting elements ED-1, ED-2, and ED-3 may each be patterned and provided through an inkjet printing method.

The encapsulation layer TFE may cover the light emitting elements ED-1, ED-2, and ED-3. The encapsulation layer TFE may seal the display element layer DP-ED. The encapsulation layer TFE may be a thin film encapsulation layer. The encapsulation layer TFE may be a single layer or a stack of multiple layers. The encapsulation layer TFE may include at least one insulating layer. The encapsulation layer TFE according to an embodiment may include at least one inorganic film (hereinafter, an encapsulation inorganic film). In an embodiment, the encapsulation layer TFE may include at least one organic film (hereinafter, an encapsulation organic film) and at least one encapsulation inorganic film.

The encapsulation inorganic film may protect the display element layer DP-ED from moisture and/or oxygen, and the encapsulation organic film may protect the display element layer DP-ED from foreign substances such as dust particles. The encapsulation inorganic film may include silicon nitride, silicon oxy nitride, silicon oxide, titanium oxide, aluminum oxide, etc., but is not limited thereto. The encapsulation organic layer may include an acrylic compound, an epoxy-based compound, etc. The encapsulation organic layer may include a photopolymerizable organic material, without limitation.

The encapsulation layer TFE may be disposed on the second electrode EL2, and may be disposed to fill the openings OH.

Referring to FIGS. 1 and 2, the display device DD may include non-light emitting regions NPXA and light emitting regions PXA-R, PXA-G, and PXA-B. The light emitting regions PXA-R, PXA-G, and PXA-B may each be a region emitting light generated from each of the light emitting elements ED-1, ED-2, and ED-3. The light emitting regions PXA-R, PXA-G, and PXA-B may be spaced apart from each other in a plan view.

The light emitting regions PXA-R, PXA-G, and PXA-B may each be a region separated by the pixel defining films PDL. The non-light emitting regions NPXA may be regions between neighboring light emitting regions PXA-R, PXA-G, and PXA-B, and may correspond to the pixel defining films PDL. For example, in an embodiment, the light emitting regions PXA-R, PXA-G, and PXA-B may each respectively correspond to a pixel. The pixel defining films PDL may separate the light emitting elements ED-1, ED-2, and ED-3. The emission layers EML-R, EML-G, and EML-B of the luminescence elements ED-1, ED-2 and ED-3 may be disposed in the openings OH defined by the pixel defining films PDL and separated from each other.

The light emitting regions PXA-R, PXA-G, and PXA-B may be arranged into groups according to the color of light generated from the light emitting elements ED-1, ED-2, and ED-3. In the display device DD according to an embodiment shown in FIGS. 1 and 2, three light emitting regions PXA-R, PXA-G, and PXA-B which respectively emit red light, green light, and blue light are illustrated as an example. For example, the display device DD may include a red light emitting region PXA-R, a green light emitting region PXA-G, and a blue light emitting region PXA-B, which are separated from one another.

In the display device DD according to an embodiment, the light emitting elements ED-1, ED-2, and ED-3 may emit light having wavelength ranges that are different from each other. For example, in an embodiment, the display device DD may include a first light emitting element ED-1 emitting red light, a second light emitting element ED-2 emitting green light, and a third light emitting element ED-3 emitting blue light. For example, the red light emitting region PXA-R, the green light emitting region PXA-G, and the blue light emitting region PXA-B of the display device DD may respectively correspond to the first light emitting element ED-1, the second light emitting element ED-2, and the third light emitting element ED-3.

However, embodiments are not limited thereto, and the first to third light emitting elements ED-1, ED-2 and ED-3 may emit light in a same wavelength range or at least one thereof may emit light in a different wavelength range. For example, the first to third light emitting elements ED-1, ED-2, and ED-3 may all emit blue light.

The light emitting regions PXA-R, PXA-G, and PXA-B in the display device DD according to an embodiment may be arranged in a stripe configuration. Referring to FIG. 1, the red light emitting regions PXA-R, the green light emitting regions PXA-G, and the blue light emitting regions PXA-B may each be arranged along a second direction DR2. In another embodiment, the red light emitting region PXA-R, the green light emitting region PXA-G, and the blue light emitting region PXA-B may be alternately arranged by turns along a first direction DR1.

FIGS. 1 and 2 show that the light emitting regions PXA-R, PXA-G, and PXA-B are all similar in size, but embodiments are not limited thereto. The light emitting regions PXA-R, PXA-G and PXA-B may be different in size from each other according to a wavelength range of emitted light. For example, the areas of the light emitting regions PXA-R, PXA-G, and PXA-B may be areas in a plan view that are defined by the first direction DR1 and the second direction DR2.

An arrangement of the light emitting regions PXA-R, PXA-G, and PXA-B is not limited to what is shown in FIG. 1, and the order in which the red light emitting region PXA-R, the green light emitting region PXA-G, and the blue light emitting region PXA-B are arranged may be provided in various combinations according to the display quality characteristics which are required for the display device DD. For example, the light emitting regions PXA-R, PXA-G, and PXA-B may be arranged in a pentile configuration (such as a PENTILE™ configuration) or in a diamond configuration (such as a Diamond Pixel™ configuration).

The areas of each of the light emitting regions PXA-R, PXA-G, and PXA-B may be different in size from one another. For example, in an embodiment, the area of the green light emitting region PXA-G may be smaller than the area of the blue light emitting region PXA-B, but embodiments are not limited thereto.

Figure 3A:
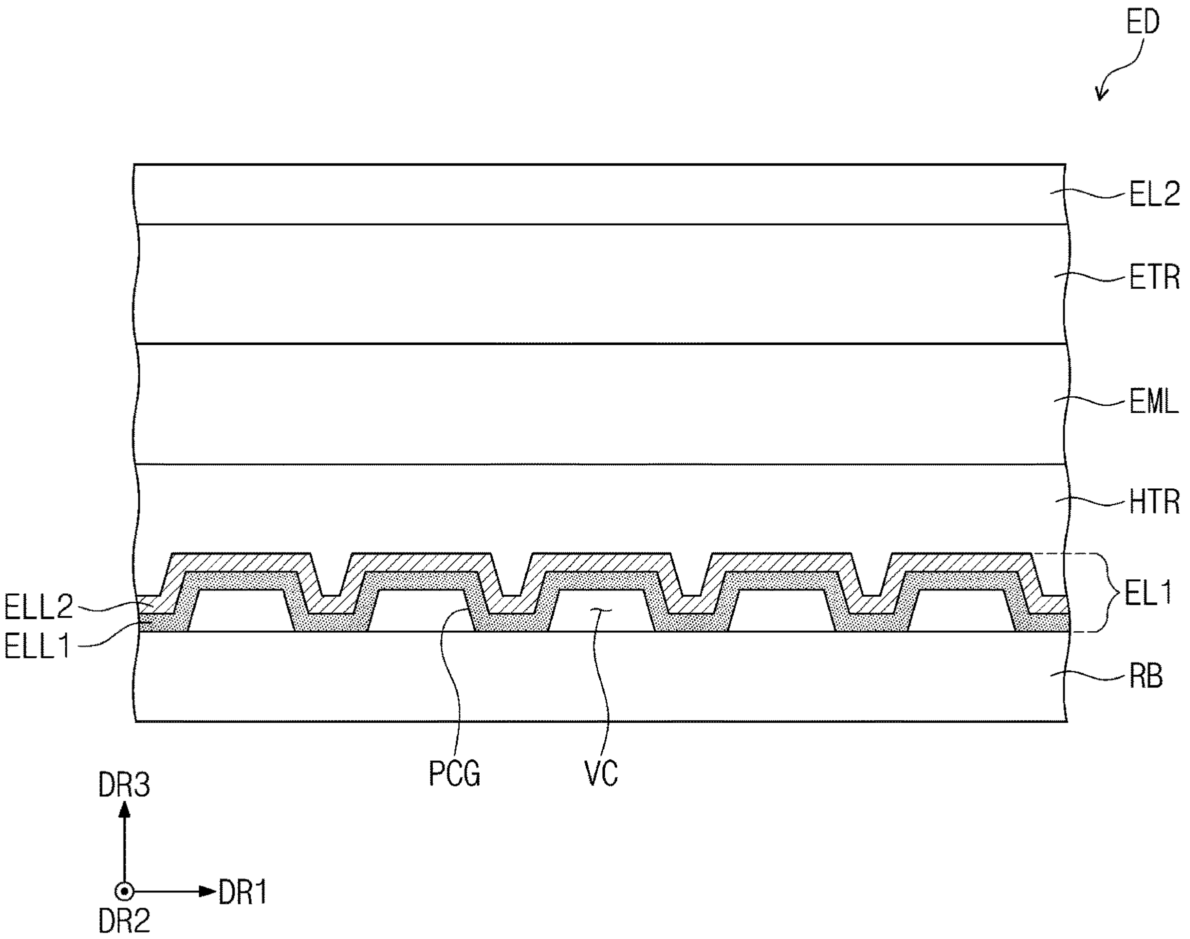
FIGS. 3A and 3B are each a schematic cross-sectional view of a light emitting element according to an embodiment.
Figure 3B:
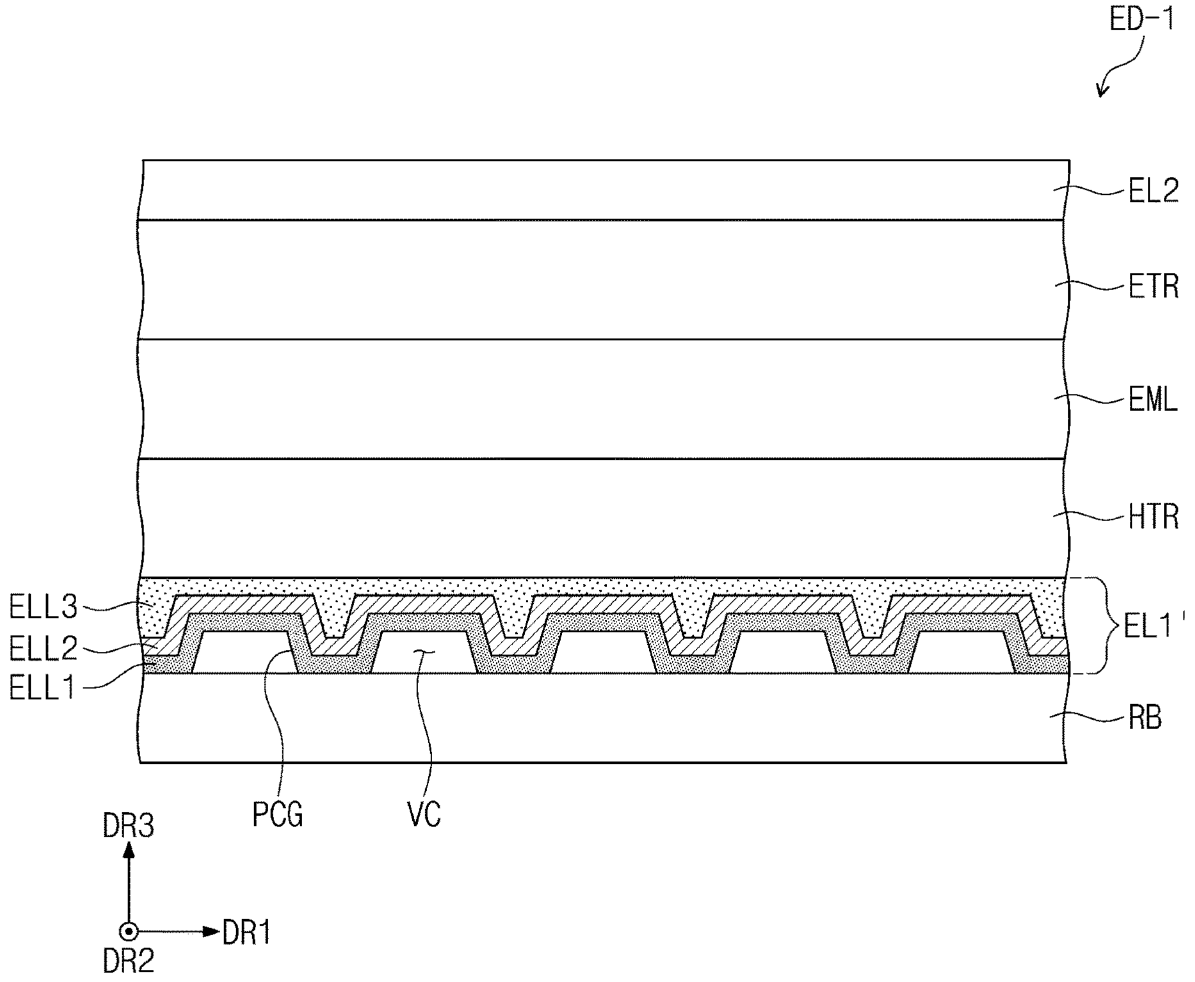
Figure 4A:
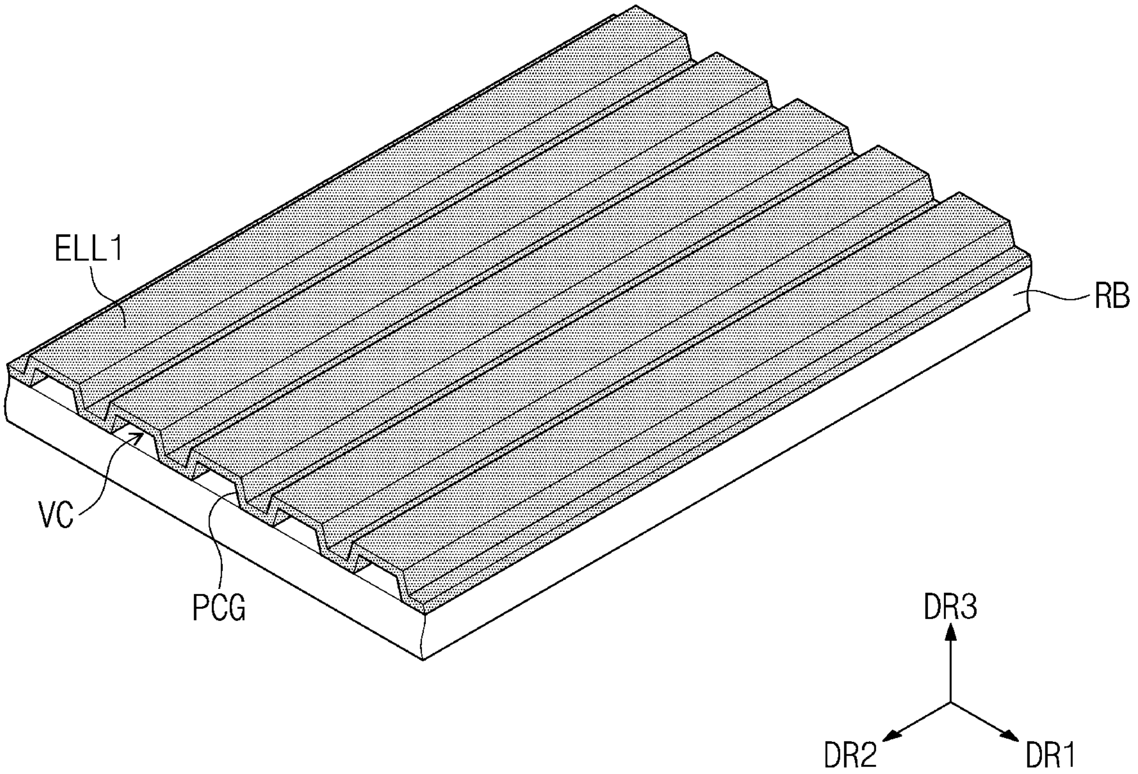
FIG. 4A is a schematic perspective view of components of a light emitting element according to an embodiment.
Figure 4B:
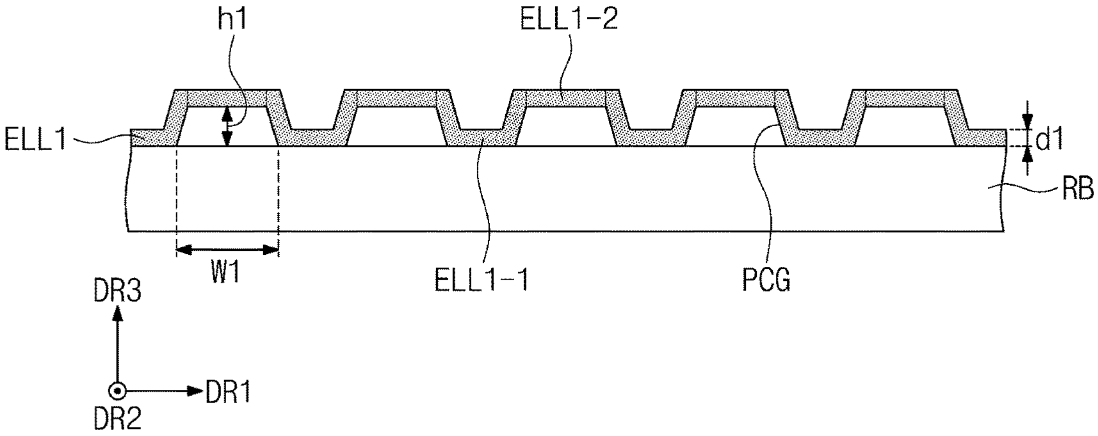
FIGS. 4B to 4D are each a schematic cross-sectional view of components of a light emitting element according to an embodiment.
Figure 4C:
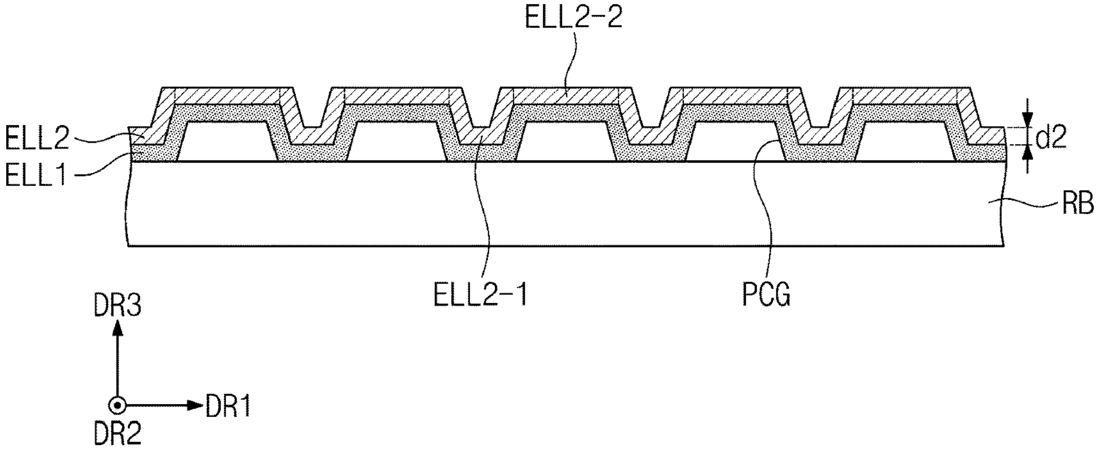
Figure 4D:
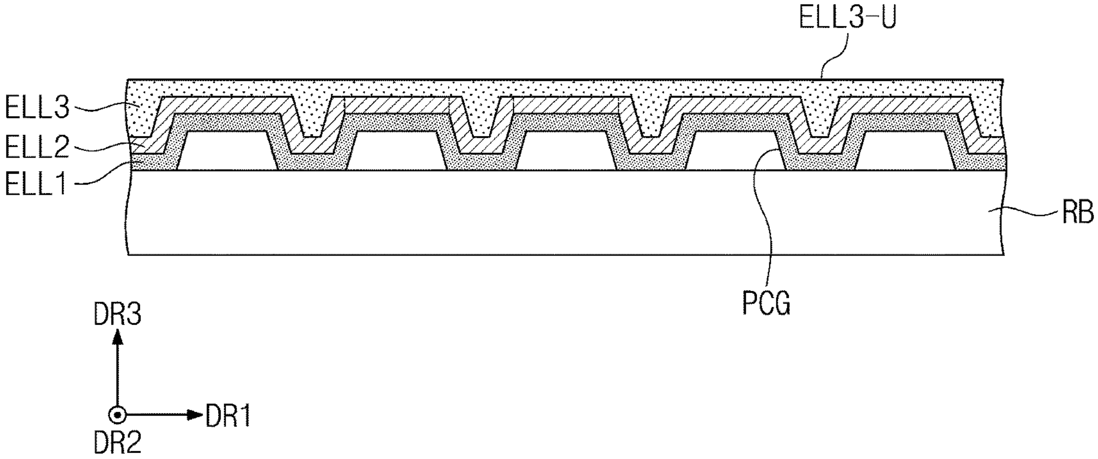

FIGS. 3A and 3B are each a schematic cross-sectional view of a light emitting element according to an embodiment. FIG. 4A is a schematic perspective view of components of a light emitting element according to an embodiment. FIGS. 4B to 4D are each a schematic cross-sectional view of components of a light emitting element according to an embodiment.

Referring to FIG. 3A, a light emitting element ED according to an embodiment may include a first electrode EL1, a hole transport region HTR, an emission layer EML, an electron transport region ETR, and a second electrode EL2. In an embodiment, the first electrode EL1 of the light emitting element ED may include a structure of multiple layers, which will be described later.

Referring to FIG. 3A, the first electrode EL1 includes a first layer ELL1 disposed on the base layer RB and a second layer ELL2 disposed on the first layer ELL1. At least a portion of the first layer ELL1 may be directly disposed on the base layer RB. The second layer ELL2 may be directly disposed on the first layer ELL1.

A portion of the first layer ELL1 may contact the base layer RB and the remaining portion thereof may include a structure spaced apart from the base layer RB. Accordingly, photonic crystal pore patterns PCG are defined between the base layer RB and the first layer ELL1. The photonic crystal pore patterns PCG may be defined by an upper surface of the base layer RB and a lower surface of the first layer ELL1. In the specification, the term "upper surface" may be a surface placed on an upper portion with respect to a third direction DR3, and the term "lower surface" may be a surface placed on a lower portion with respect to the third direction DR3.

The first layer ELL1 may include a transparent conductive oxide (TCO). The first layer ELL1 may include, for example, indium zinc oxide, indium tin oxide, or any combination thereof.

Referring to FIGS. 3A, 4A, and 4B together, the first layer ELL1 may include a first portion ELL1-1 disposed directly on the base layer RB, and a second portion ELL1-2 disposed on the photonic crystal pore patterns PCG. The second portion ELL1-2 may extend from the first portion ELL1-1. The first portion ELL1-1 and the second portion ELL1-2 may have a single-body shape and may be disposed on the base layer RB. The first portion ELL1-1 and the second portion ELL1-2 may include a same material. The first portion ELL1-1 and the second portion ELL1-2 may include a transparent conductive oxide (TCO), for example, indium zinc oxide, indium tin oxide, or any combination thereof.

The first layer ELL1 may have a nanoscale thickness. Each of the first portion ELL1-1 and the second portion ELL1-2 included in the first layer ELL1 may have a substantially same thickness. In the specification, it should be understood that the term "substantially same" indicates that numerical ranges such as width and thickness are the same, including not only a case in which numerical ranges such as width and thickness are physically the same, but also errors upon processes or manufacturing tolerances that may occur.

The first layer ELL1 may have a first thickness d1. In an embodiment, the first thickness d1 may be in a range of about 100 nm to about 300 nm. When the first thickness d1 of the first layer ELL1 satisfies the above-described range, transmittance may increase, and a color reproduction effect may be achieved through a photonic crystal structure.

Photonic crystal pore patterns PCG are defined below the first layer ELL1. The photonic crystal pore patterns PCG are each spaced apart from each other along a first direction DR1 and each extend along a second direction DR2. The photonic crystal pore patterns PCG may each be arranged in the form of a stripe, which extends along the second direction DR2. The photonic crystal pore patterns PCG may each be provided in a vacuum state VC. For example, the inside of each of the photonic crystal pore patterns PCG may be a gap or void in an empty vacuum state VC without other materials and components disposed therein. The photonic crystal pore patterns PCG may be arranged in the form of a stripe having a nanoscale pitch and height. The photonic crystal pore patterns PCG may be formed by removing photoresist patterns after the first layer ELL1 is formed on the photoresist pattern. The process of forming the photonic crystal pore patterns PCG will be described later with reference to FIGS. 6A to 6E, and the like.

The photonic crystal pore patterns PCG may each be defined between the base layer RB and the second portion ELL1-2. The photonic crystal pore patterns PCG may each be defined between an upper surface of the base layer RB and a lower surface of the second portion ELL1-2. In an embodiment, the upper surface of the base layer RB may be provided as a flat surface that is parallel to each of the first direction DR1 and the second direction DR2. As the photonic crystal pore patterns PCG are provided between the first layer ELL1 and the base layer RB, an upper surface of the first layer ELL1 may be provided as an uneven surface rather than a flat surface. For example, the upper surface of the first layer ELL1 may be provided as a stepped surface having a step between the first portion ELL1-1 and the second portion ELL1-2.

The photonic crystal pore patterns PCG may each have a first width W1 along the first direction DR1. The first width W1 may be, for example, in a range of about 50 nm to about 550 nm. When the first width W1 of each of the photonic crystal pore patterns PCG satisfies the above-described range, color reproduction may be improved through a photonic crystal structure.

The photonic crystal pore patterns PCG may each have a first height h1 along the third direction DR3. The first height h1 may be, for example, in a range of about 20 nm to about 110 nm. When the first height h1 of each of the photonic crystal pore patterns PCG satisfies the above-described range, color reproduction may be improved through a photonic crystal structure.

Referring to FIGS. 3A, and 4A to 4C together, a second layer ELL2 is disposed on the first layer ELL1 and includes a reflective metal. The second layer ELL2 may include silver (Ag), gold (Au), aluminum (Al), or any combination thereof, which are reflective metals, and the second layer ELL2 may be provided as an ultra-thin film having a small thickness. The second layer ELL2 may be a semi-permeable metal thin film. The second layer ELL2 may be directly disposed on the first layer ELL1, and may be entirely provided on the first layer ELL1. The second layer ELL2 may contact an upper surface of the first layer ELL1.

The second layer ELL2 may include a third portion ELL2-1 disposed on the first portion ELL1-1 of the first layer ELL1 and a fourth portion ELL2-2 disposed on the second portion ELL1-2 of the first layer ELL1. The fourth portion ELL2-2 may extend from the third portion ELL2-1. The third portion ELL2-1 and the fourth portion ELL2-2 may have a single-body form and may be disposed on the first layer ELL1. For example, the third portion ELL2-1 and the fourth portion ELL2-2 may be integral with each other. The third portion ELL2-1 and the fourth portion ELL2-2 may each include a same material. The third portion ELL2-1 and the fourth portion ELL2-2 may include a reflective metal, for example, silver (Ag), gold (Au), aluminum (Al), or any combination thereof.

The second layer ELL2 may have a nanoscale thickness. Each of the third portion ELL2-1 and the fourth portion ELL2-2 included in the second layer ELL2 may have a substantially same thickness.

The second layer ELL2 may have a second thickness d2. In an embodiment, the second thickness d2 may be in a range of about 5 nm to about 30 nm. When the second thickness d2 of the second layer ELL2 satisfies the above-described range, transmittance may increase and a micro-cavity effect may be achieved, thereby improving luminance of a light emitting element.

The second layer ELL2 may be provided as a thin layer (for example, having a nanoscale thickness), and may be disposed on the upper surface of the first layer ELL1 and provided as having an uneven surface. Accordingly, as with the first layer ELL1, an upper surface of the second layer ELL2 may also be provided as an uneven surface instead of a flat surface. For example, the upper surface of the second layer ELL2 may be provided as a stepped surface having a step between the third portion ELL2-1 and the fourth portion ELL2-2.

Referring to FIGS. 3B, and 4A to 4D together, a first electrode EL1' of a light emitting element ED-1 according to an embodiment may further include a third layer ELL3 disposed on the second layer ELL2. The third layer ELL3 may be directly disposed on the upper surface of the second layer ELL2.

The third layer ELL3 may include a transparent conductive oxide (TCO), for example, indium zinc oxide, indium tin oxide, or any combination thereof.

Unlike the first layer ELL1 and the second layer ELL2, the third layer ELL3 may include a flat upper surface. For example, an upper surface ELL3-U of the third layer ELL3 may be provided as a flat surface. However, embodiments are not limited thereto, and the upper surface ELL3-U of the third layer ELL3 may be provided as an uneven surface. For example, the upper surface ELL3-U of the third layer ELL3 may be provided as a stepped surface, like the upper surface of each of the first layer ELL1 and the second layer ELL2. The third layer ELL3 may be a buffer layer that provides uniform current supply to the light emitting element ED-1 by forming a parallel resistance with the second layer ELL2 disposed in a lower portion. The third layer ELL3 may protect the first layer ELL1 and the second layer ELL2 disposed in the lower portion from an external environment. When the upper surface of the third layer ELL3 is provided as a flat surface, the third layer ELL3 may remove steps formed by the first layer ELL1 and the second layer ELL2, and provide a flat reference surface to members disposed on an upper side of the first electrode EL1'.

As the light emitting element ED-1 according to an embodiment further includes the third layer ELL3 disposed on the second layer ELL2 and including a transparent conductive oxide, the upper surface of the second layer ELL2 having a high surface roughness by including a metal such as silver (Ag) may be covered, and accordingly, sheet resistance of the first electrode EL1' may be reduced.

Referring back to FIG. 3A, the hole transport region HTR is provided on the first electrode EL1. The hole transport region HTR may include at least one of a hole injection layer, a hole transport layer, a buffer layer (not shown), a light emitting auxiliary layer (not shown), or an electron blocking layer. The hole transport region HTR may have, for example, a thickness in a range of about 50 Å to about 15,000 Å.

The hole transport region HTR may be a layer formed of a single material, a layer formed of different materials, or a structure including multiple layers formed of different materials.

For example, the hole transport region HTR may have a single-layer structure formed of a hole injection layer or a hole transport layer, or a single-layer structure formed of a hole injection material or a hole transport material. In other embodiments, the hole transport region HTR may have a single-layer structure formed of different materials, or a structure in which a hole injection layer/hole transport layer, a hole injection layer/hole transport layer/buffer layer, a hole injection layer/buffer layer, a hole transport layer/buffer layer, or a hole injection layer/hole transport layer/electron blocking layer are stacked in its respective stated order from the first electrode EL1, but embodiments are not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may include a compound represented by Formula H-2:

[Formula H-2]

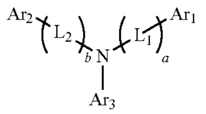

In Formula H-2, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms. In Formula H-2, a and b may each independently be an integer from 0 to 10. When a or b is 2 or greater, multiple $L_1$ groups or multiple $L_2$ groups may each independently be a substituted or unsubstituted arylene group having 6 to 30 ring-forming carbon atoms, or a substituted or unsubstituted heteroarylene group having 2 to 30 ring-forming carbon atoms.

In Formula H-2, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. In Formula H-2, $Ar_3$ may be a substituted or unsubstituted aryl group having 6 to 30 ring-forming carbon atoms, or a substituted or unsubstituted heteroaryl group having 2 to 30 ring-forming carbon atoms.

In an embodiment, a compound represented by Formula H-2 may be a monoamine compound. In another embodiment, the compound represented by Formula H-2 may be a diamine compound in which at least one of $Ar_1$ to $Ar_3$ includes an amine group as a substituent. In still other embodiments, the compound represented by Formula H-2 may be a carbazole-based compound in which at least one of $Ar_1$ or $Ar_2$ includes a substituted or unsubstituted carbazole group, or may be a fluorene-based compound in which at least one of $Ar_1$ or $Ar_2$ includes a substituted or unsubstituted fluorene group.

The compound represented by Formula H-2 may be any compound selected from Compound Group H. However, the compounds listed in Compound Group H are only examples, and the compound represented by Formula H-2 is not limited to Compound Group H:

[Compound Group H]

H-1-1

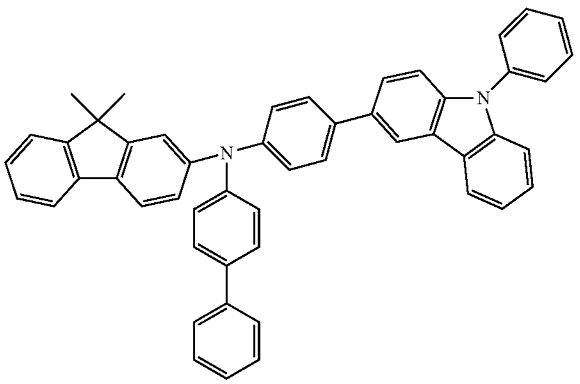

H-1-2

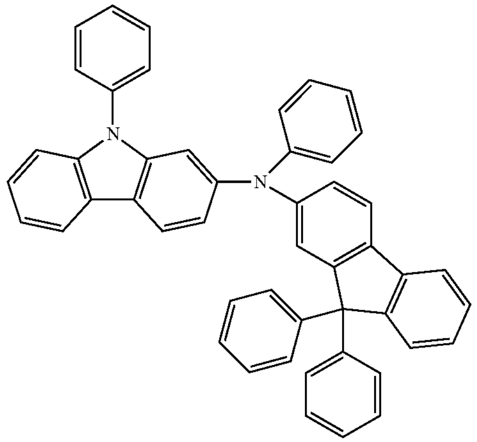

-continued
H-1-3
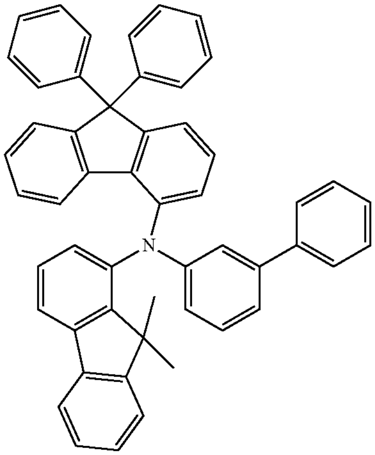
H-1-4
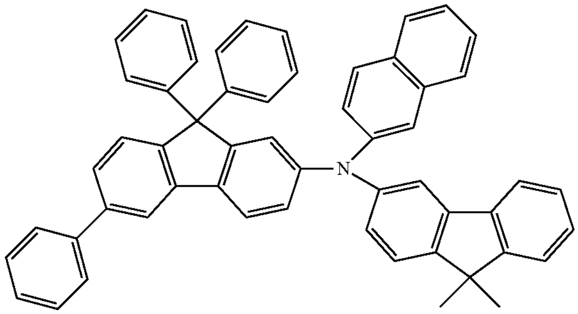
H-1-5
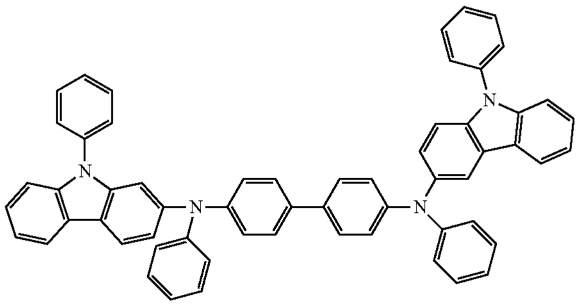
-continued
H-1-6
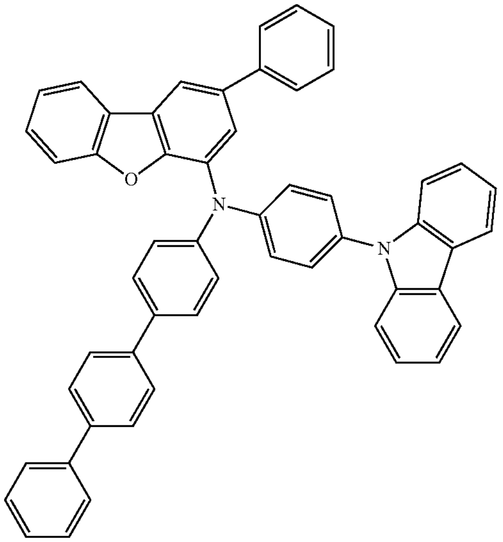
H-1-7
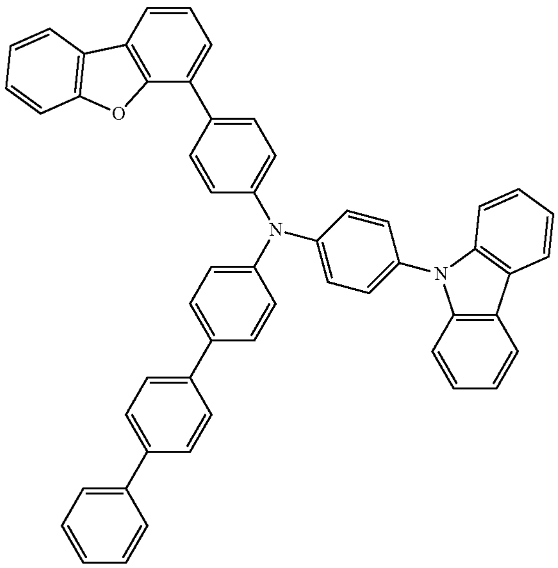
H-1-8
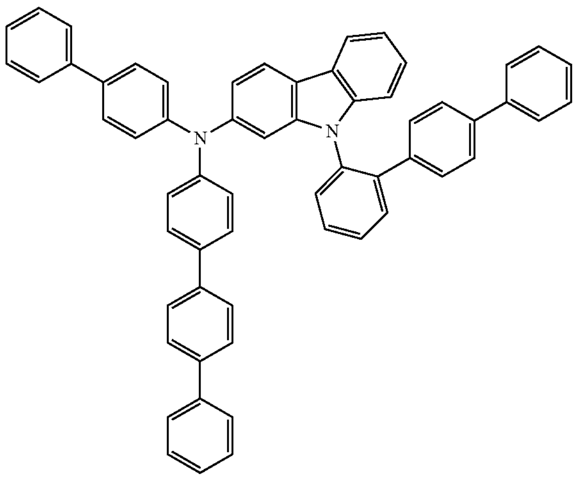

-continued
H-1-9
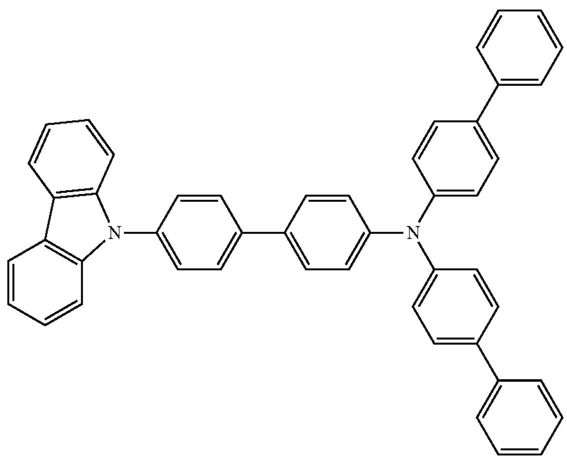
H-1-10
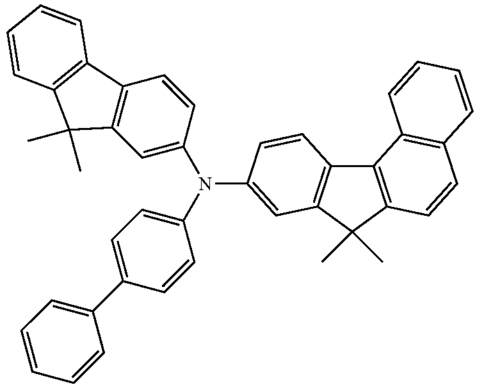
H-1-11
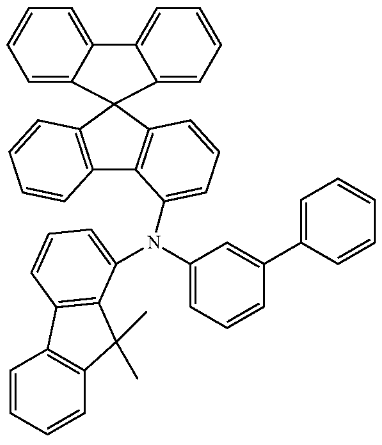
-continued
H-1-12
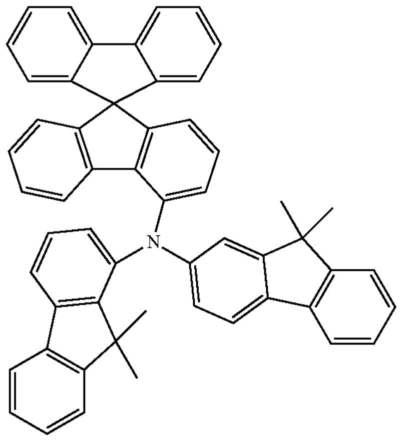
H-1-13
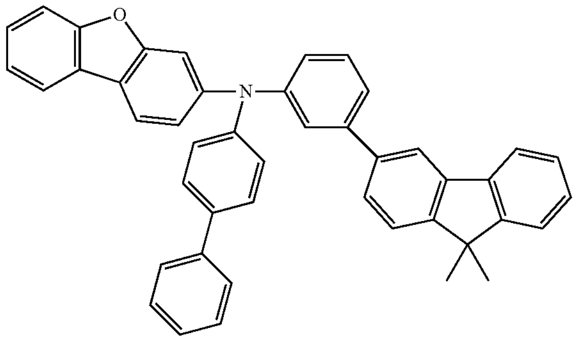
H-1-14
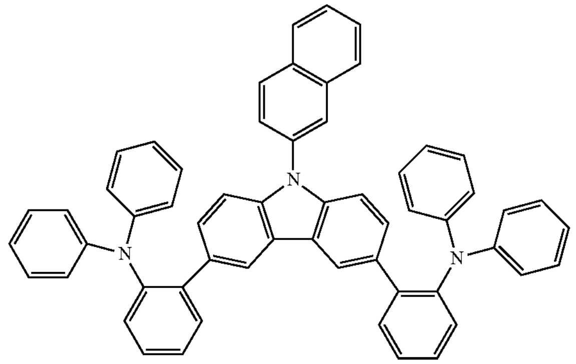

-continued

H-1-15

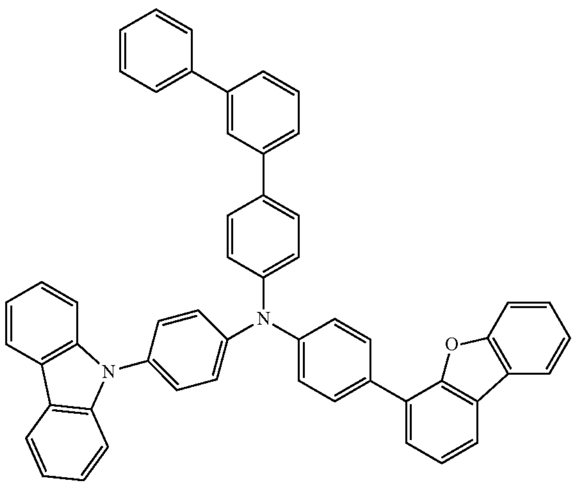

H-1-16

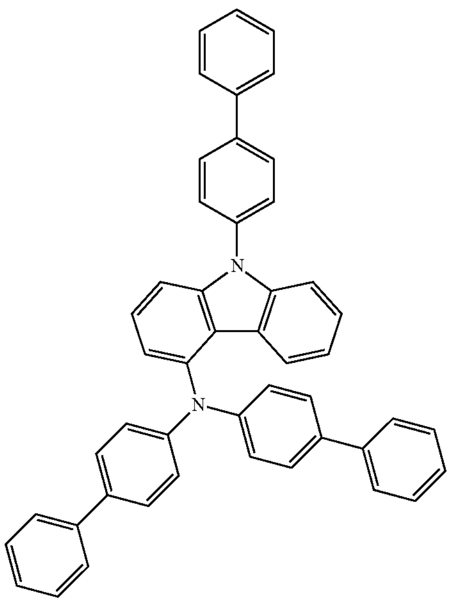

H-1-17

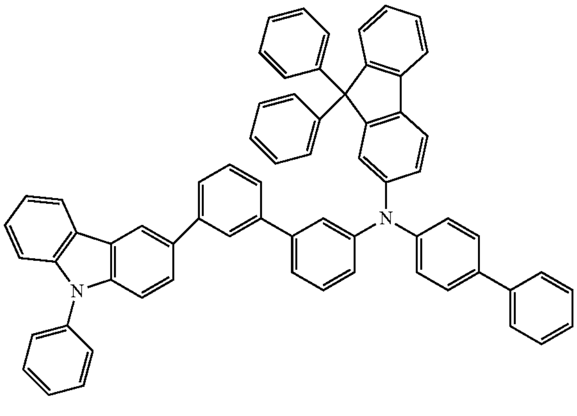

-continued

H-1-18

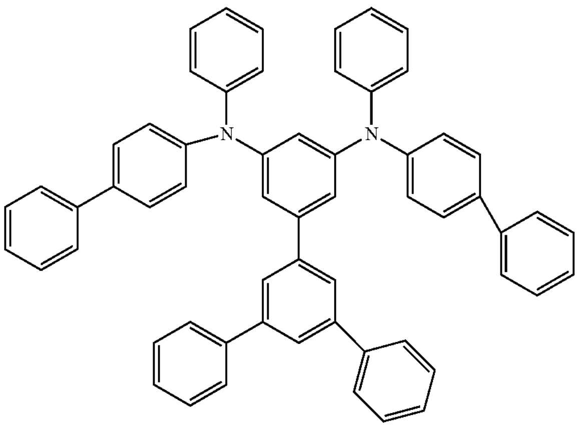

H-1-19

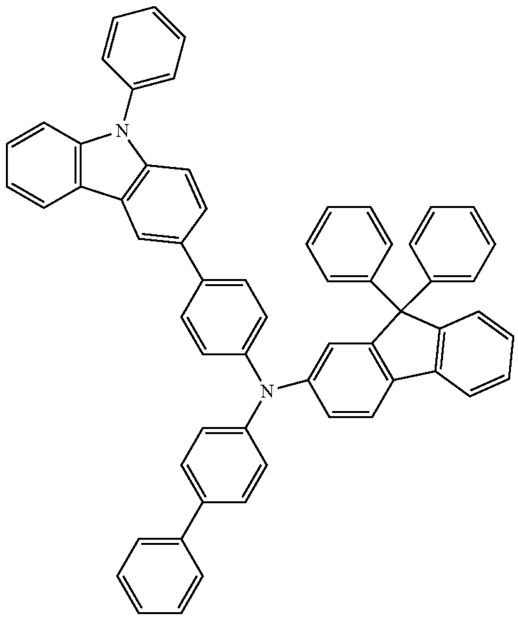

The hole transport region HTR may include a phthalocyanine compound such as copper phthalocyanine, N1,N1'-([1,1'-biphenyl]-4,4'-diyl)bis(N1-phenyl-N4,N4-di-m-tolyl-benzene-1,4-diamine) (DNTPD), 4,4',4"-[tris(3-methylphenyl)phenylamino]triphenylamine (m-MTDATA), 4,4'4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrene sulfonate) (PEDOT/PSS), polyaniline/Dodecylbenzenesulfonic acid (PANI/DBSA), polyaniline/camphor sulfonic acid (PANI/CSA), polyaniline/poly(4-styrene sulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, dipyrazino[2,3-2',3'-h]quinoxaline-2,3,6,7,10,11-hexacarbonitrile (HAT-CN), etc.

The hole transport region HTR may include carbazole-based derivatives such as N-phenyl carbazole and polyvinyl carbazole, fluorene-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N'-di(1-naphtalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis(N-carbazolyl)benzene (mCP), etc.

The hole transport region HTR may include 9-(4-tert-Butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the compounds of the hole transport region described above in at least one of a hole injection layer, a hole transport layer, or an electron blocking layer.

The hole transport region HTR may have a thickness in a range of about 100 Å to about 10,000 Å. For example, the hole transport region HTR may have a thickness in a range of about 100 Å to about 5,000 Å. When the hole transport region HTR includes a hole injection layer, the hole injection layer may have a thickness, for example, in a range of about 30 Å to about 1,000 Å. When the hole transport region HTR includes a hole transport layer, the hole transport layer may have a thickness in a range of about 30 Å to about 1,000 Å. When the hole transport region HTR includes an electron blocking layer, the electron blocking layer may have a thickness, for example, in a range of about 10 Å to about 1,000 Å. When the thicknesses of the hole transport region HTR, the hole injection layer, the hole transport layer, and the electron blocking layer satisfy the above-described ranges, satisfactory hole transport properties may be obtained without a substantial increase in driving voltage.

The hole transport region HTR may further include, in addition to the above-described materials, a charge generation material to increase conductivity. The charge generation material may be uniformly or non-uniformly dispersed in the hole transport region HTR. The charge generation material may be, for example, a p-dopant. The p-dopant may include at least one of halogenated metal compounds, quinone derivatives, metal oxides, or cyano group-containing compounds, but is not limited thereto. For example, the p-dopant may include halogenated metal compounds such as CuI and RbI, quinone derivatives such as tetracyanoquinodimethane (TCNQ) and 2,3,5,6-tetrafluoro-7,7,8,8-tetracyanoquinodimethane (F4-TCNQ), metal oxides such as tungsten oxides and molybdenum oxides, cyano group-containing compounds such as dipyrazino[2,3-f: 2',3'-h] quinoxaline-2,3,6,7,10,11-hexacarbonitrile (HATCN) and 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), etc., but is not limited thereto.

As described above, the hole transport region HTR may further include at least one of a buffer layer or an electron blocking layer, in addition to the hole injection layer and the hole transport layer. The buffer layer may compensate for a resonance distance according to a wavelength of light emitted from an emission layer EML, and may thus increase luminous efficiency. Materials which may be included in the hole transport region HTR may be used as materials included in the buffer layer. The electron blocking layer may prevent electrons from being injected from an electron transport region ETR to the hole transport region HTR.

The emission layer EML is provided on the hole transport region HTR. The emission layer EML may have, for example, a thickness in a range of about 100 Å to about 1,000 Å. For example, the emission layer EML may have a thickness in a range of about 100 Å to about 300 Å. The emission layer EML may be a layer formed of a single material, a layer formed of different materials, or a structure including multiple layers formed of different materials.

In the light emitting element ED according to an embodiment, the emission layer EML may include an anthracene derivative, a pyrene derivative, a fluoranthene derivative, a chrysene derivative, a dihydrobenzanthracene derivative, or a triphenylene derivative. For example, the emission layer EML may include an anthracene derivative or a pyrene derivative.

In the light emitting element ED according to embodiments shown in FIGS. 3A and 3B, the emission layer EML may include a host and a dopant. The emission layer EML may include a compound represented by Formula E-1. The compound represented by Formula E-1 may be used as a fluorescent host material:

[Formula E-1]

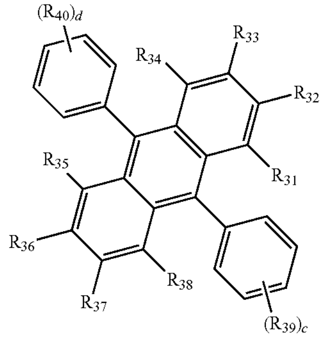

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 1 to 10 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring. For example, in Formula E-1, $R_{31}$ to $R_{40}$ may be bonded to an adjacent group to form a saturated hydrocarbon ring, an unsaturated hydrocarbon ring, a saturated heterocycle, or an unsaturated heterocycle.

In Formula E-1, c and d may each independently be an integer from 0 to 5.

The compound represented by Formula E-1 may be any compound selected from Compounds E1 to E19:

E1

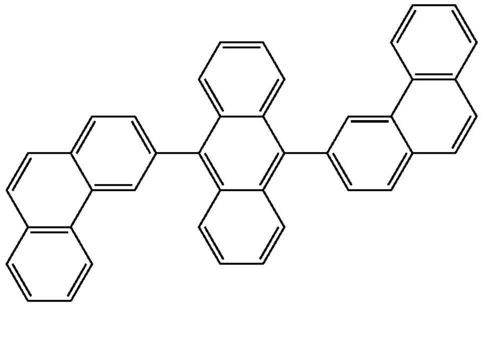

-continued
E2
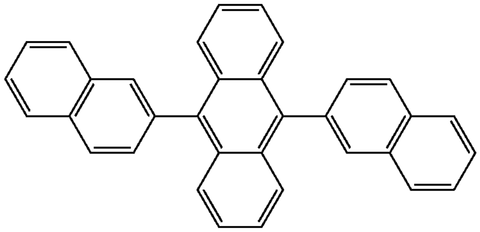
E3
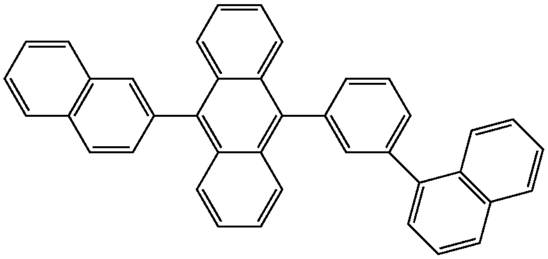
E4
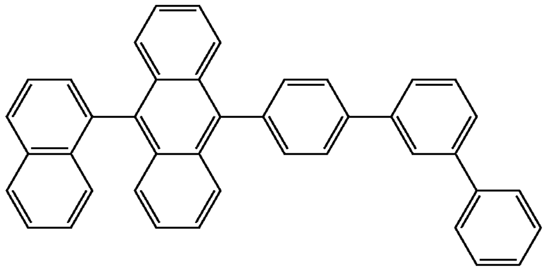
E5
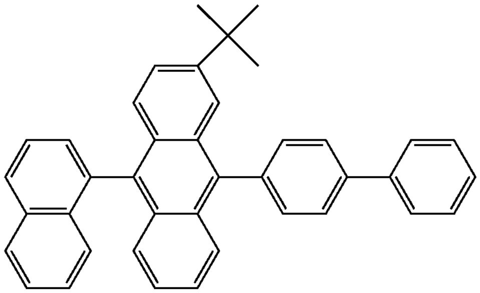
E6
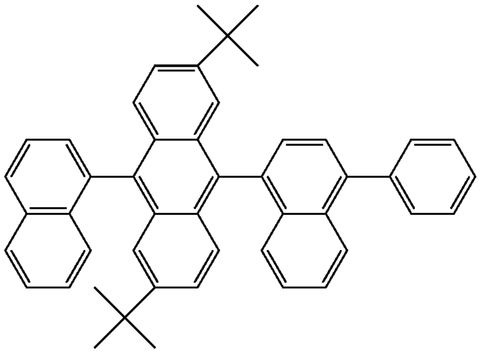
-continued
E7
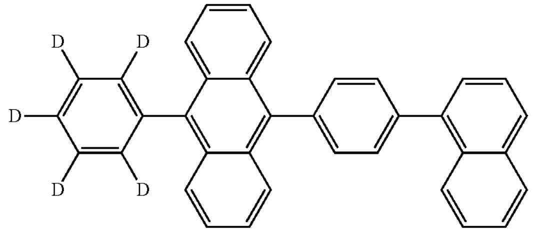
E8
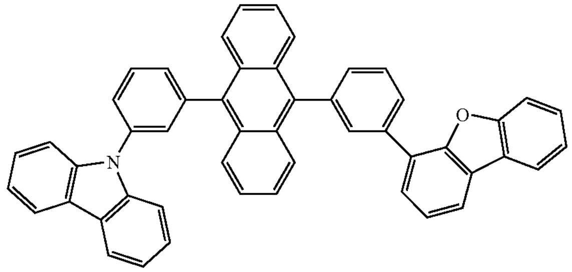
E9
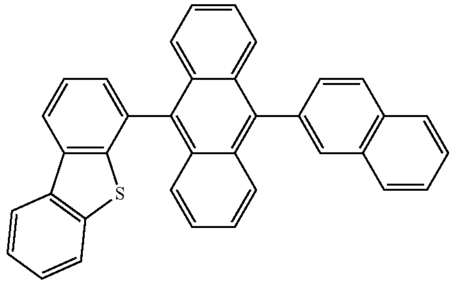
E10
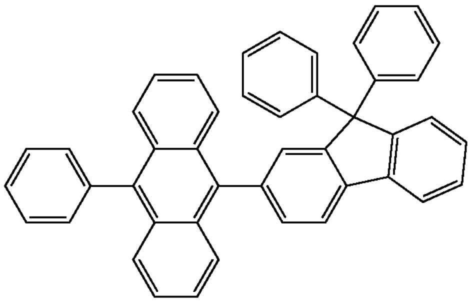
E11
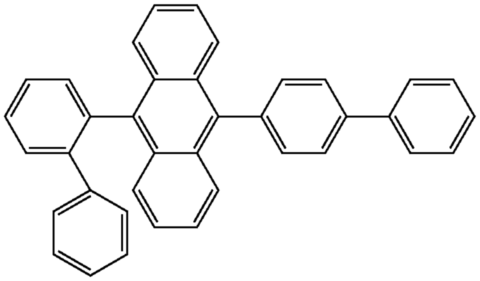

-continued

E12

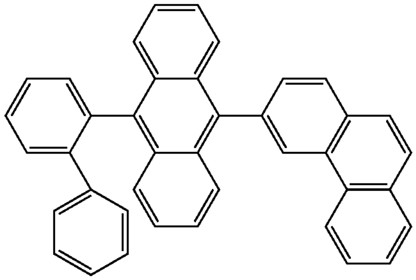

E13

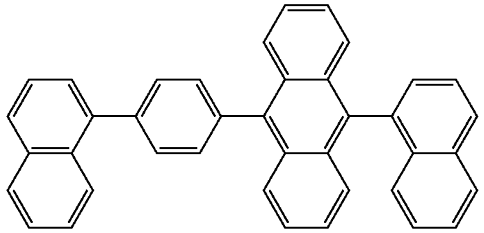

E14

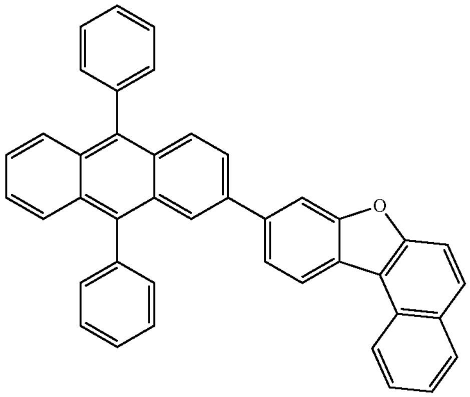

E15

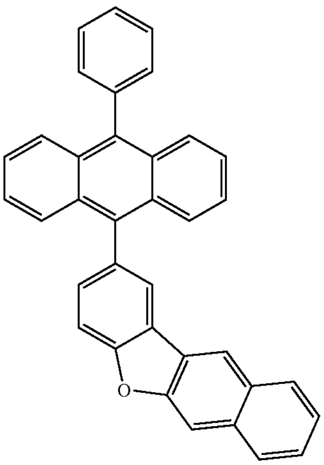

-continued

E16

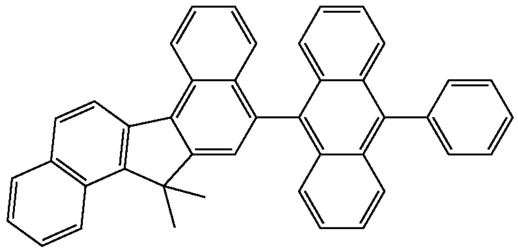

E17

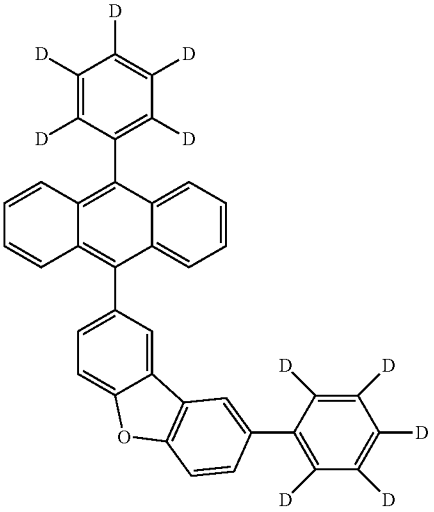

E18

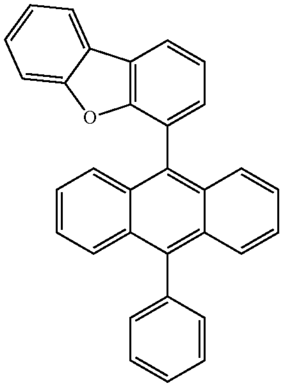

E19

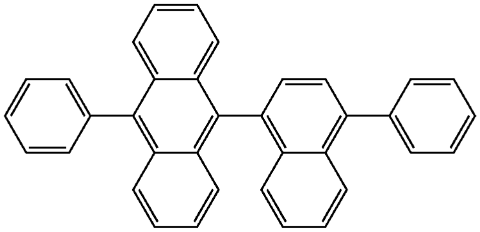

In an embodiment, the emission layer EML may include a first compound represented by Formula E-1, and at least one of a second compound represented by Formula HT-1, a third compound represented by Formula ET-1, or a fourth compound represented by Formula M-b.

In an embodiment, the second compound represented by Formula HT-1 may be used as a hole transporting host material of the emission layer EML:

[Formula HT-1]

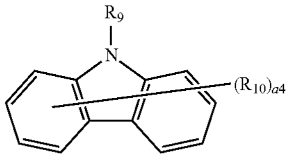

In Formula HT-1, a4 may be an integer from 0 to 8. When a4 is 2 or greater, multiple $R_{10}$ groups may all be the same or at least one thereof may be different from the others. In Formula HT-1, $R_9$ and $R_{10}$ may each independently be a hydrogen atom, a deuterium atom, a substituted or unsubstituted aryl group having 6 to 60 ring-forming carbon atoms, or a substituted or unsubstituted heteroaryl group having 2 to 60 ring-forming carbon atoms. For example, $R_9$ may be a substituted phenyl group, an unsubstituted dibenzofuran group, or a substituted fluorenyl group. For example, $R_{10}$ may be a substituted or unsubstituted carbazole group.

The second compound represented by Formula HT-1 may be any compound selected from Compound Group 2. In Compound Group 2, "D" represents a deuterium atom, "$D_4$" represents substitution with 4 deuterium atoms, and "Ph" represents a phenyl group:

[Compound Group 2]

HT1

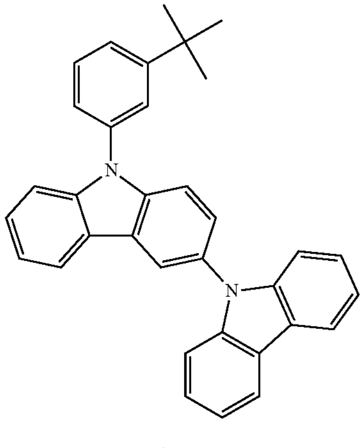

HT2

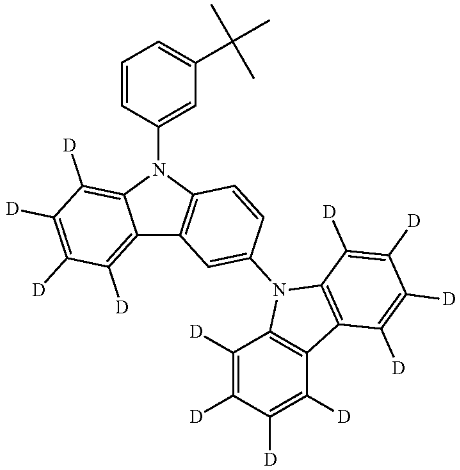

-continued

HT3

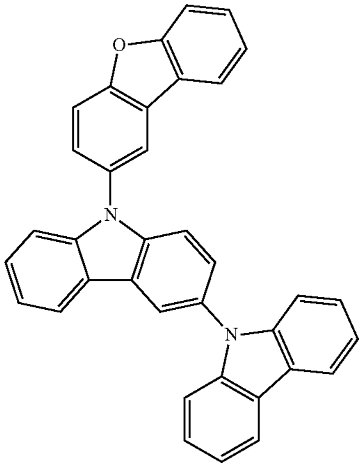

HT4

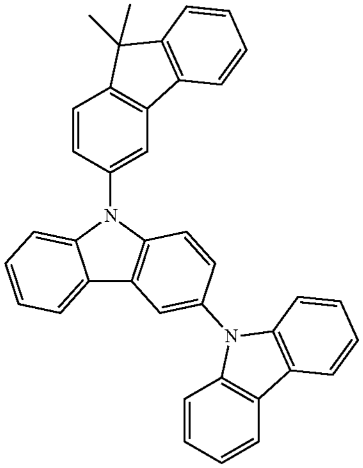

HT5

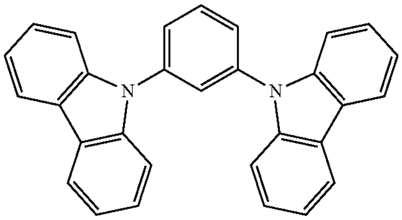

HT6

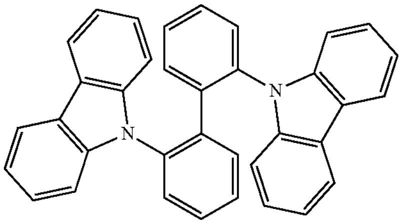

-continued
HT7
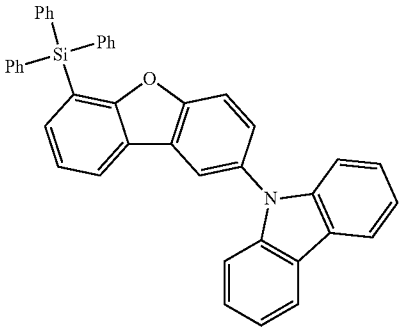
HT8
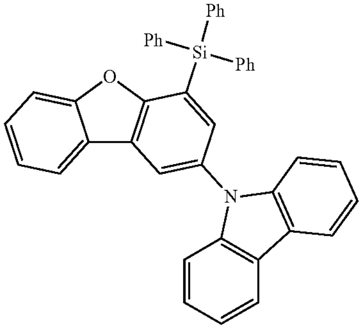
HT9
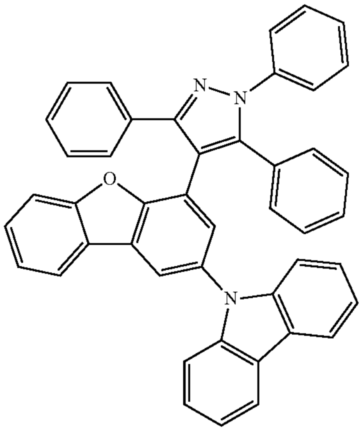
HT10
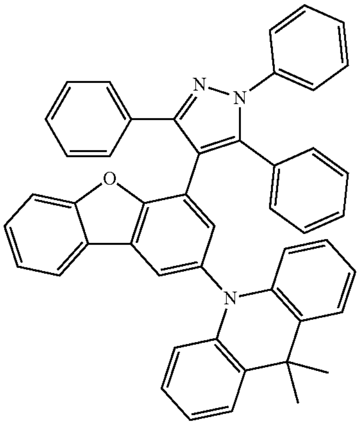
-continued
HT11
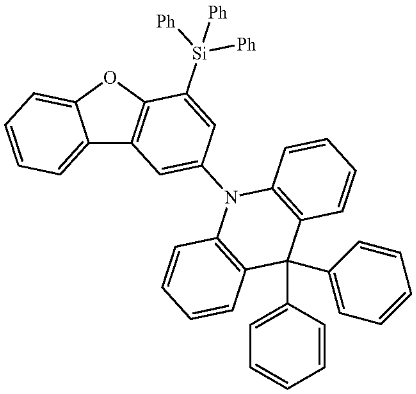
HT12
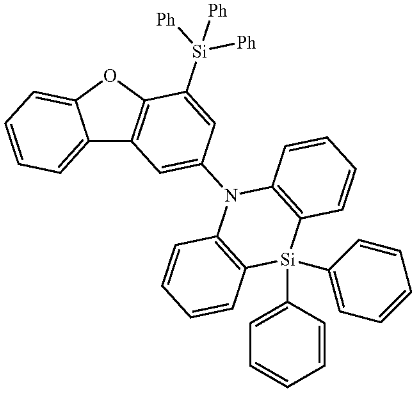
HT13
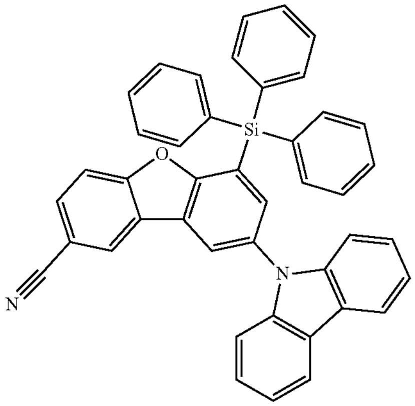
HT14
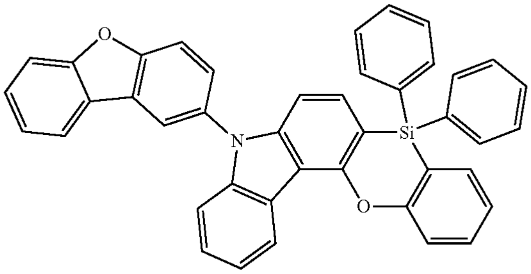

-continued
HT15
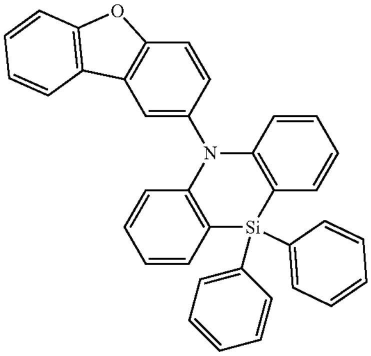
HT16
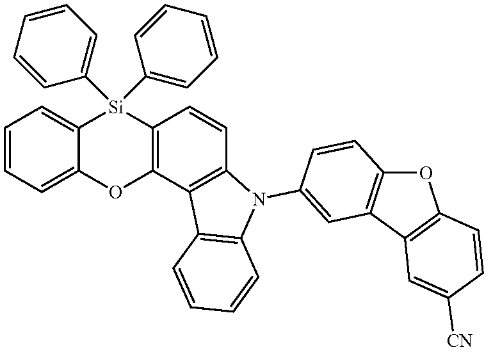
HT17
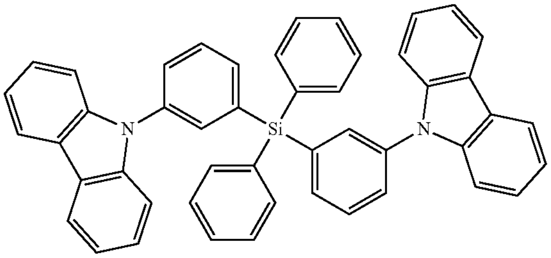
HT18
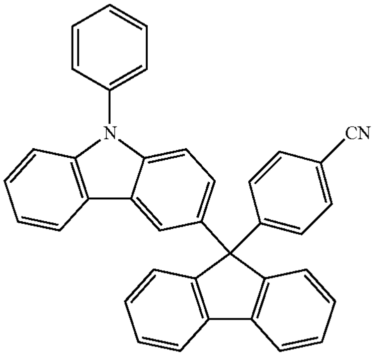
-continued
HT19
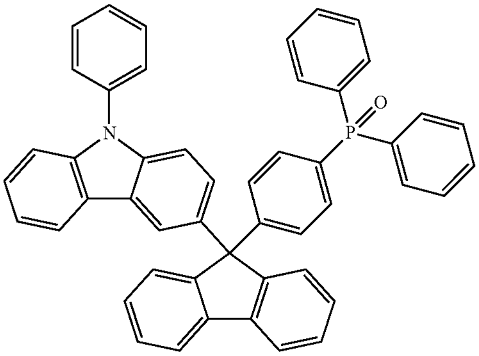
HT20
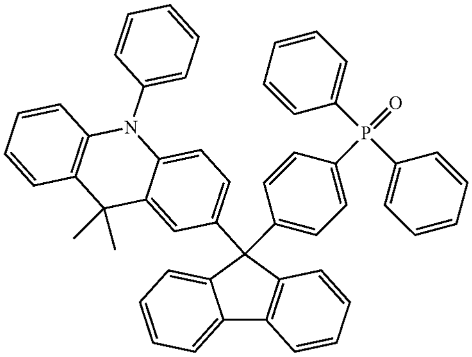
HT21
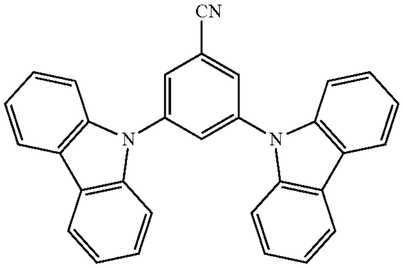
HT22
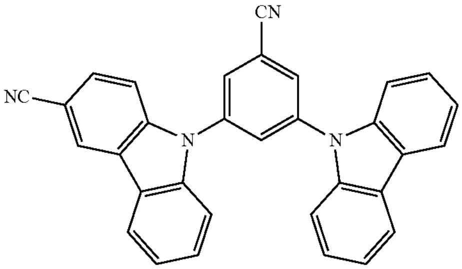
HT23
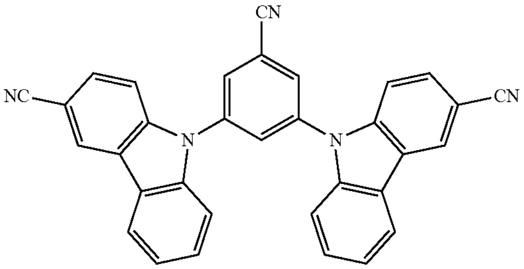

-continued
HT24
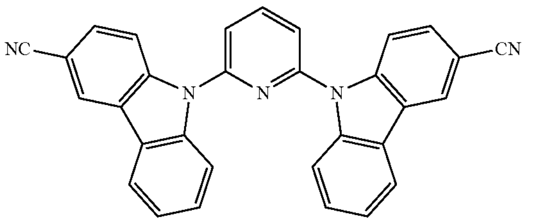
HT25
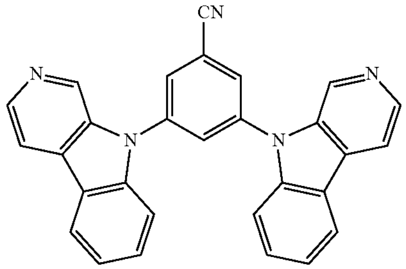
HT26
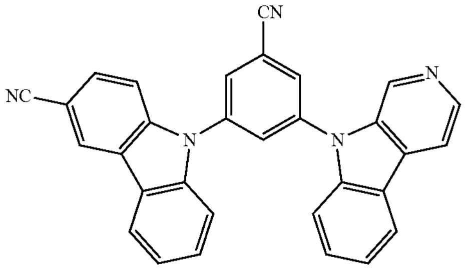
HT27
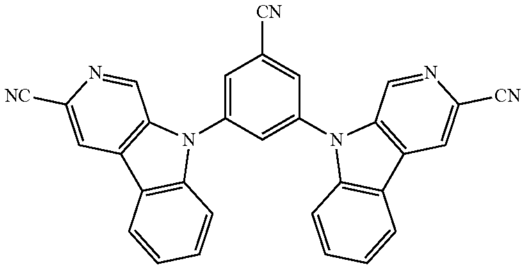
HT28
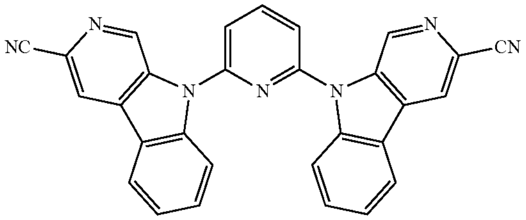
HT29
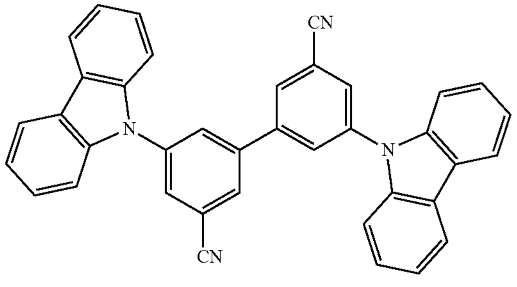
-continued
HT30
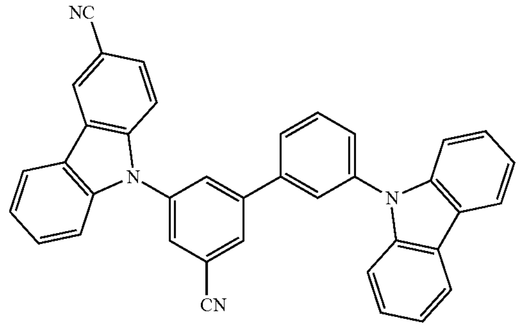
HT31
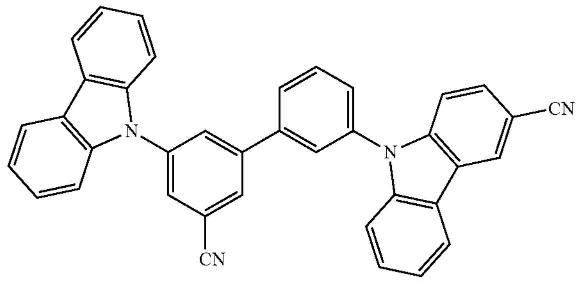
HT32
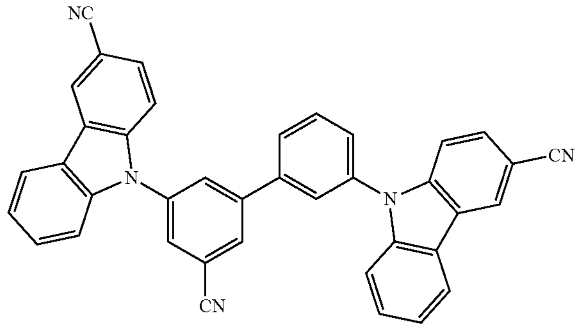
HT33
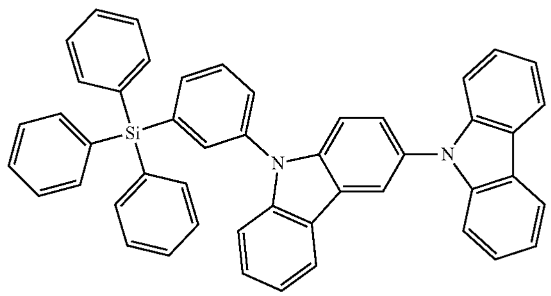

-continued
HT34
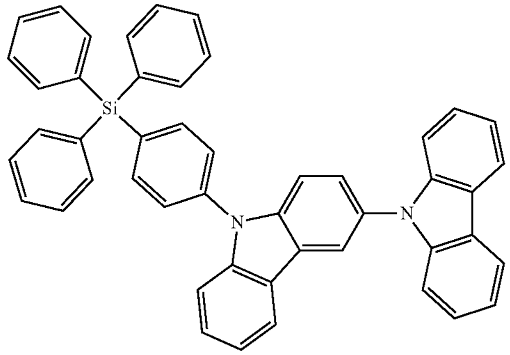
HT35
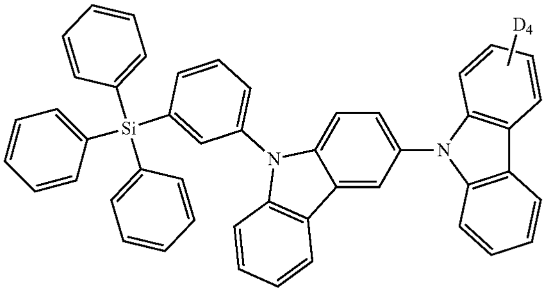
HT36
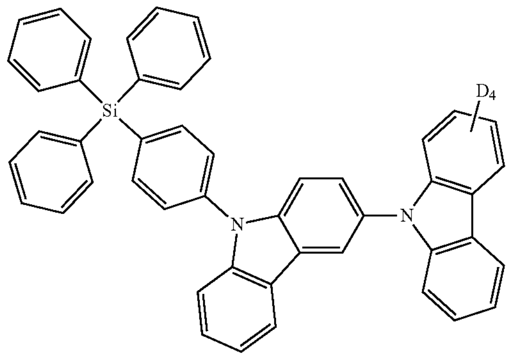
HT37
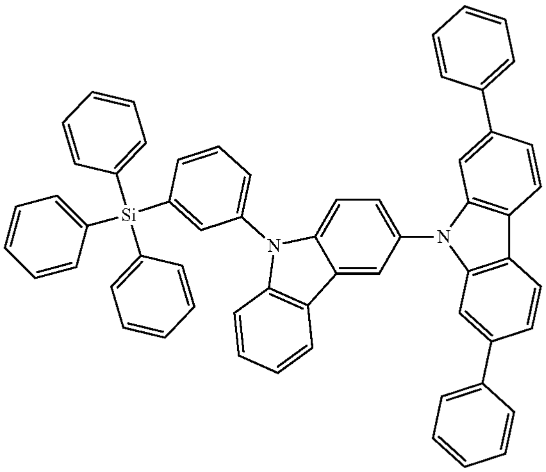
-continued
HT38
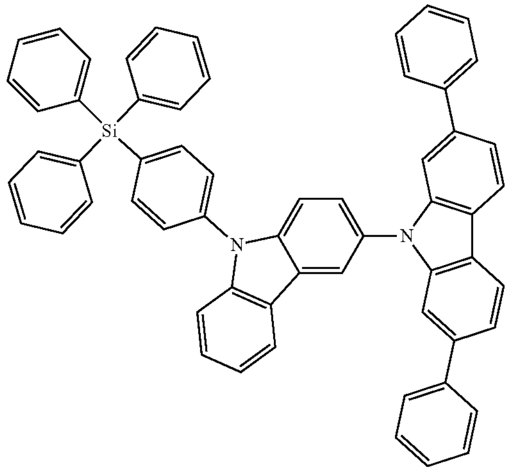
HT39
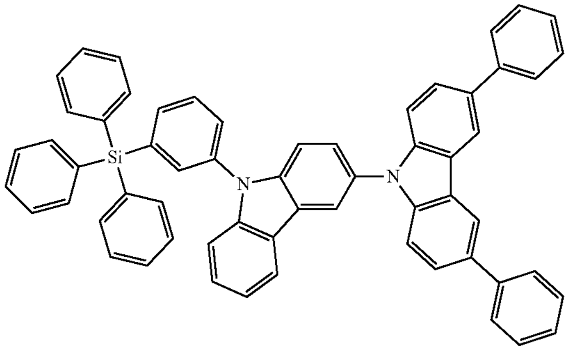
HT40
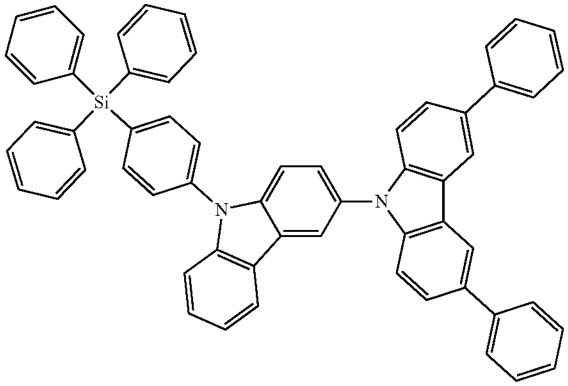
HT41
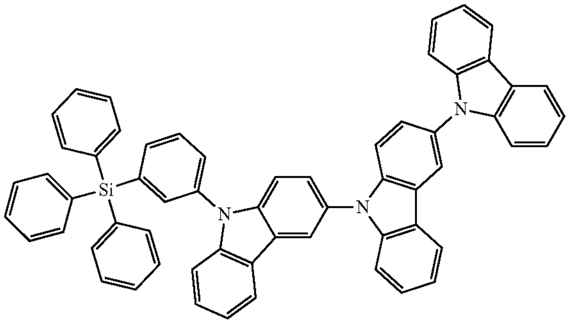

-continued
HT42
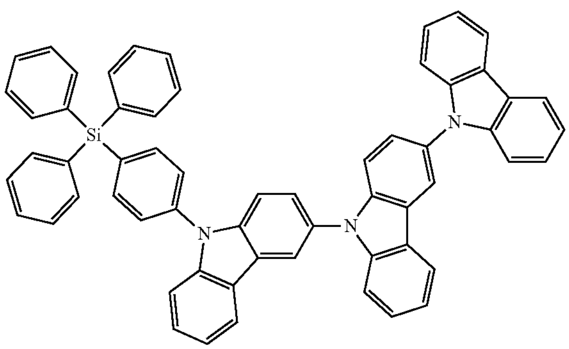
HT43
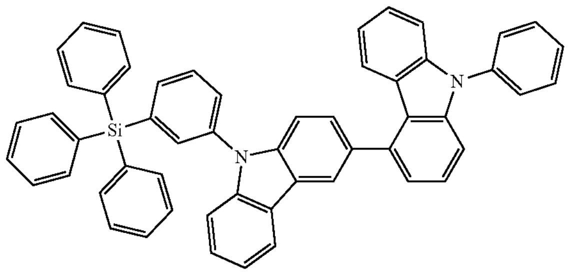
HT44
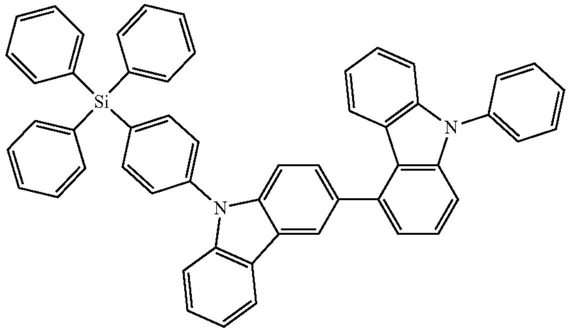
HT45
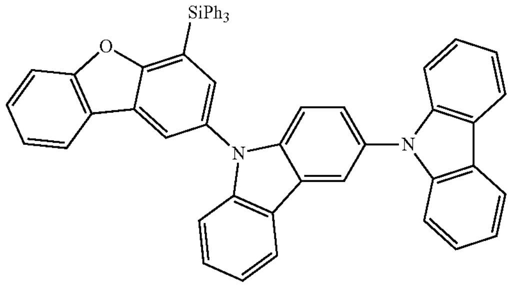
HT46
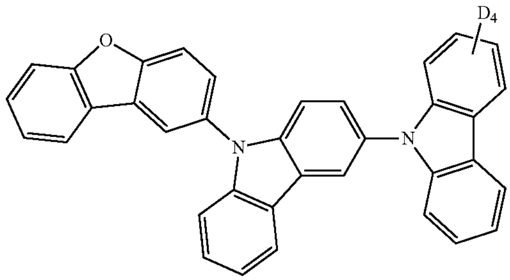
-continued
HT47
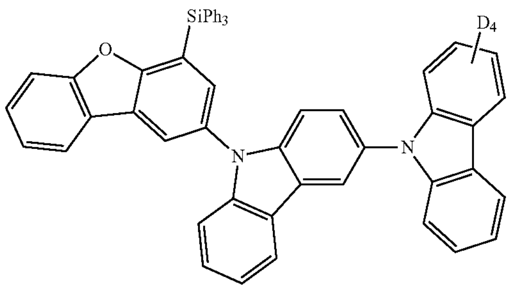
HT48
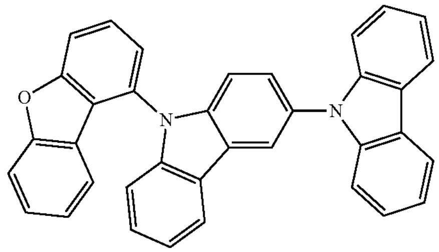
HT49
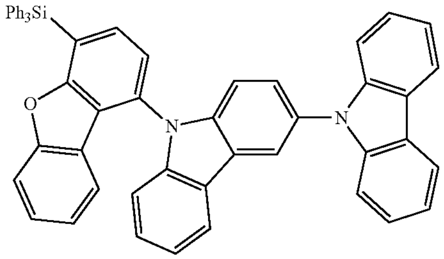
HT50
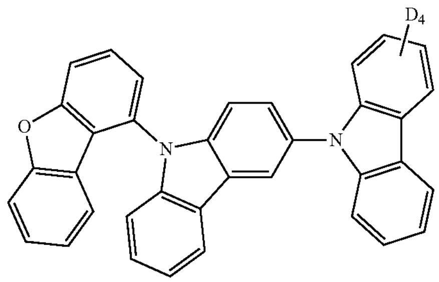
HT51
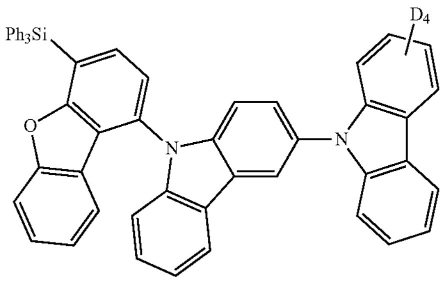

-continued

HT52

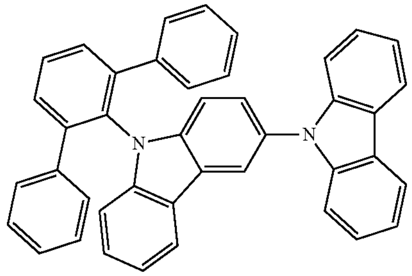

HT53

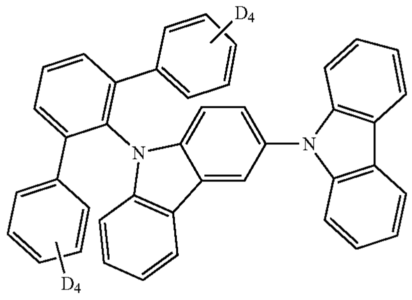

HT54

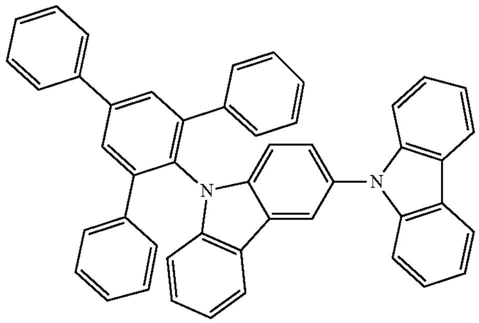

HT55

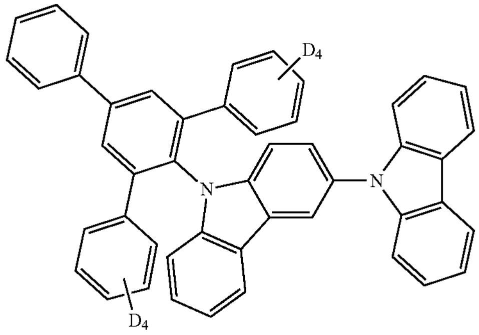

In an embodiment, the emission layer EML may include a third compound represented by Formula ET-1. For example, the third compound may be used as an electron transporting host material of the emission layer EML.

[Formula ET-1]

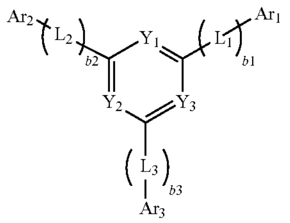

In Formula ET-1, at least one of $Y_1$ to $Y_3$ may each be N, and the remainder of $Y_1$ to $Y_3$ may each independently be $C(R_a)$. In Formula ET-1, $R_a$ may be a hydrogen atom, a deuterium atom, a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms.

In Formula ET-1, b1 to b3 may each independently be an integer from 0 to 10. In Formula ET-1, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms.

In Formula ET-1, $Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. For example, $Ar_1$ to $Ar_3$ may each independently be a substituted or unsubstituted phenyl group or a substituted or unsubstituted carbazole group.

The third compound represented by Formula ET-1 may be any compound selected from Compound Group 3. The light emitting element ED according to an embodiment may include any compound selected from Compound Group 3. In Compound Group 3, "D" represents a deuterium atom, "$D_4$" represents substitution with 4 deuterium atoms, and "Ph" represents a phenyl group:

[Compound Group 3]

ETH1

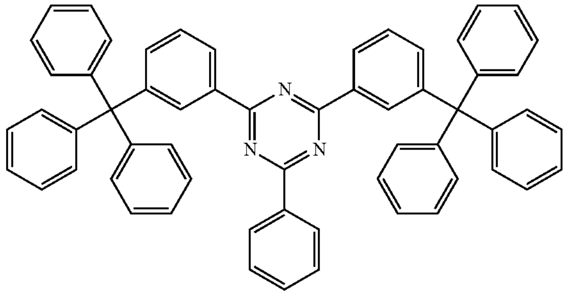

-continued
ETH2
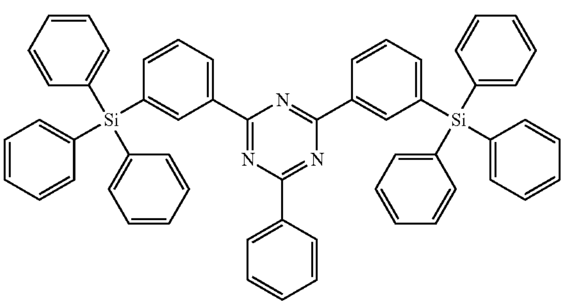
ETH3
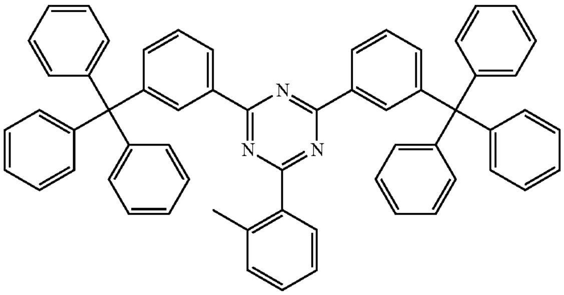
ETH4
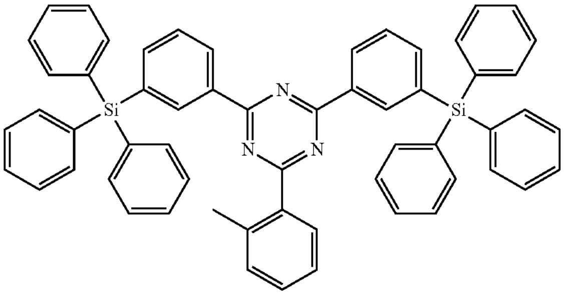
ETH5
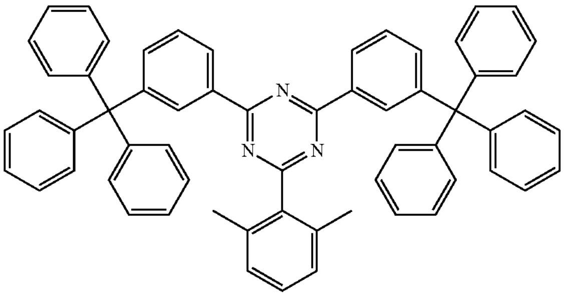
ETH6
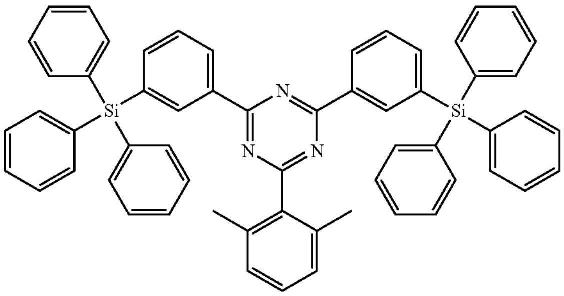
-continued
ETH7
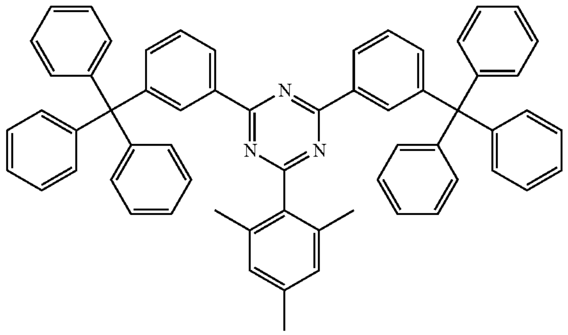
ETH8
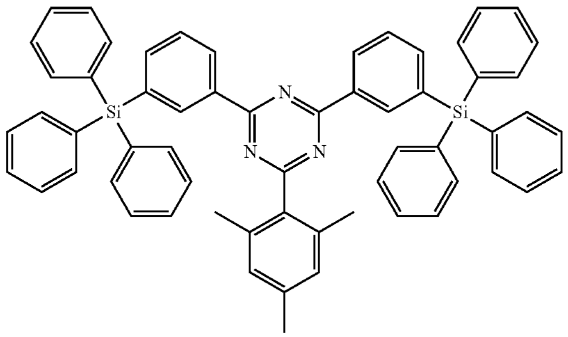
ETH9
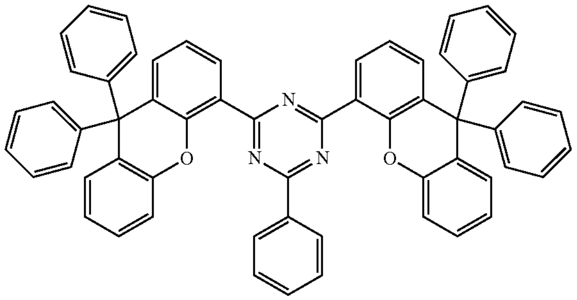
ETH10
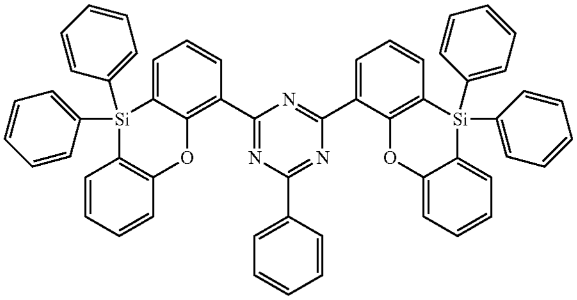

ETH11
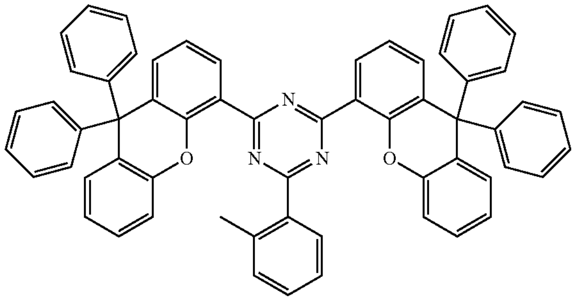
ETH12
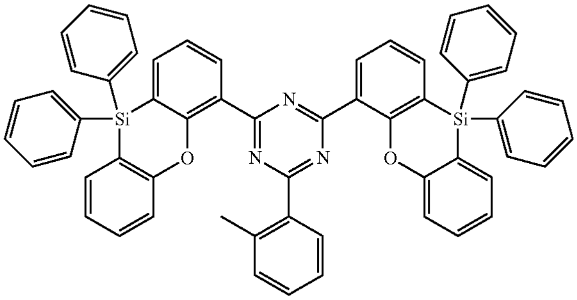
ETH13
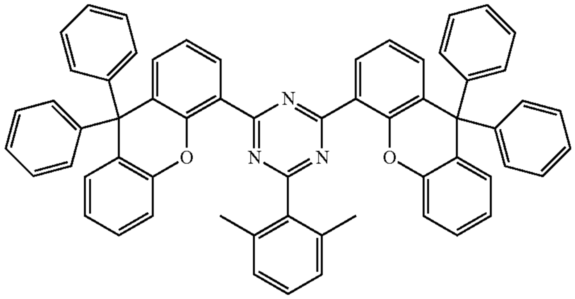
ETH14
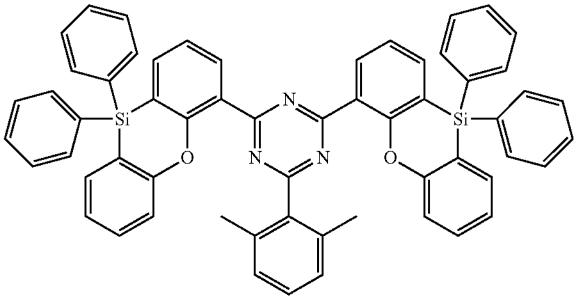
ETH15
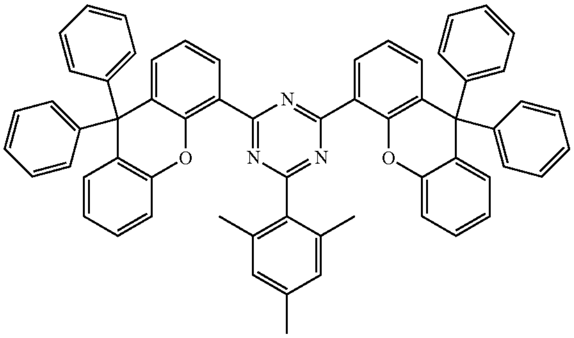
ETH16
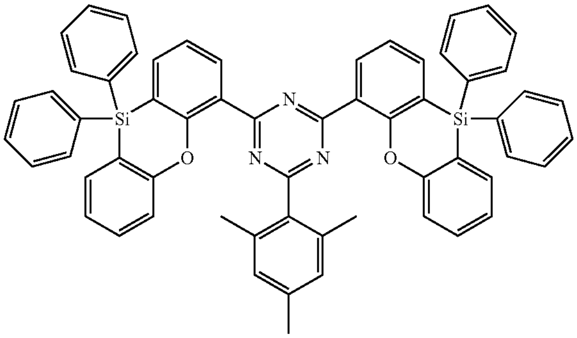
ETH17
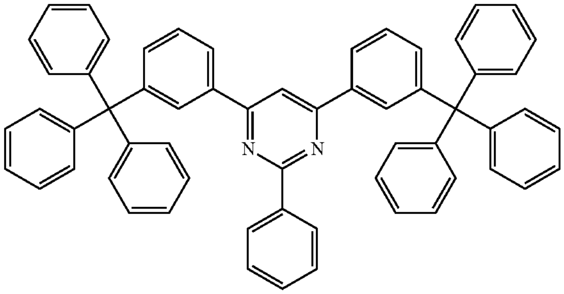
ETH18
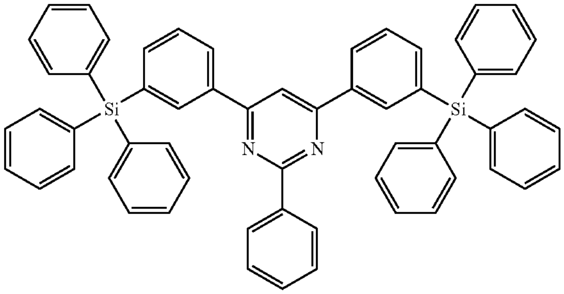

-continued
ETH19
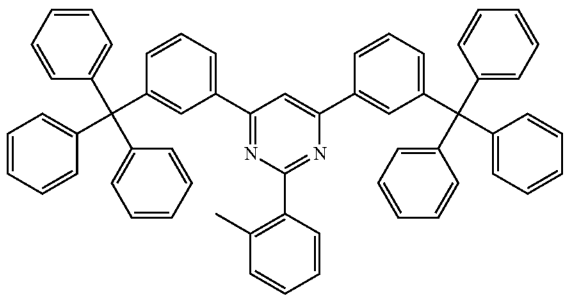
ETH20
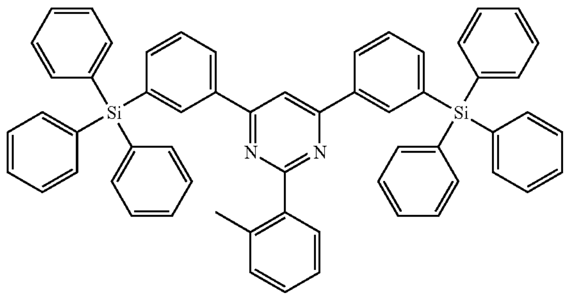
ETH21
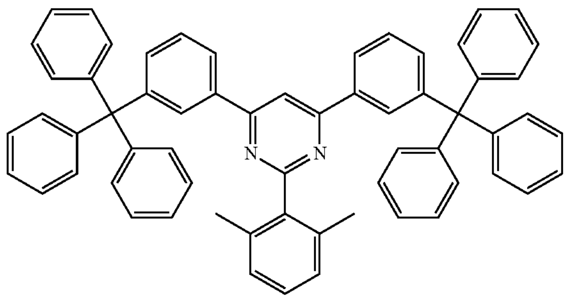
ETH22
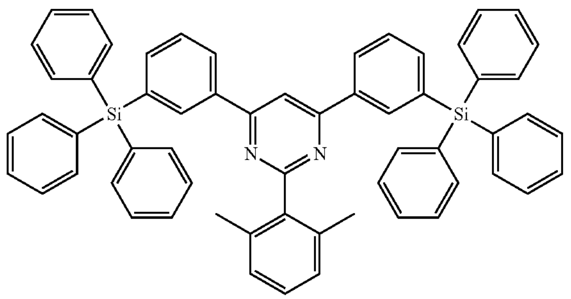
ETH23
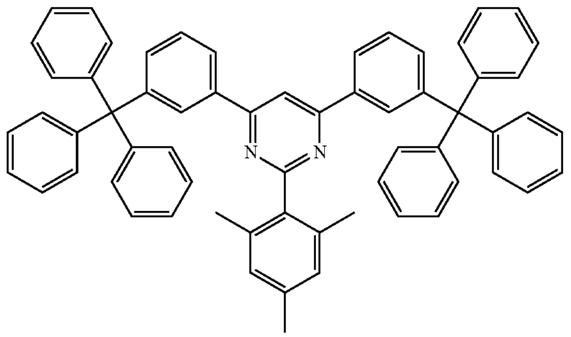
-continued
ETH24
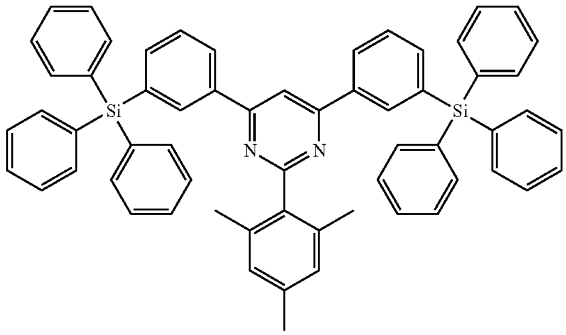
ETH25
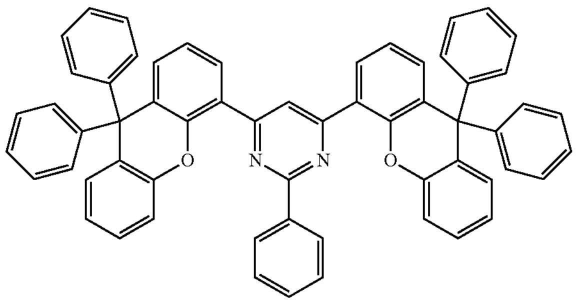
ETH26
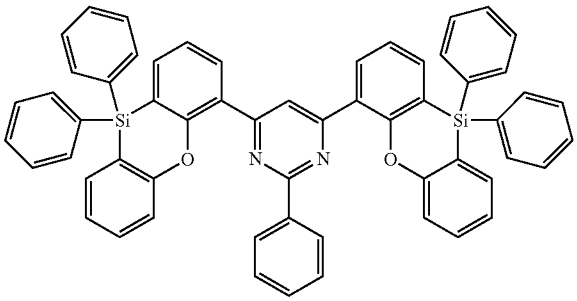
ETH27
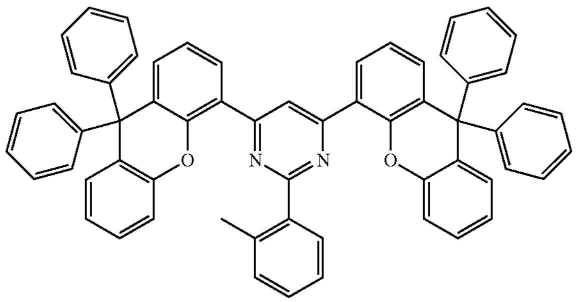

-continued
ETH28
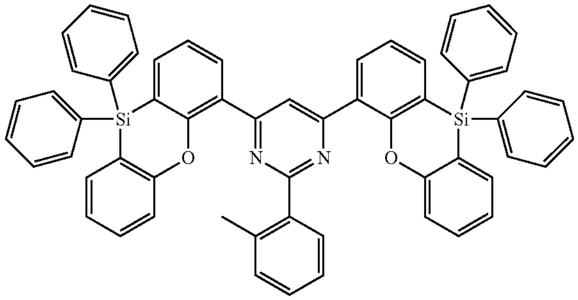
ETH29
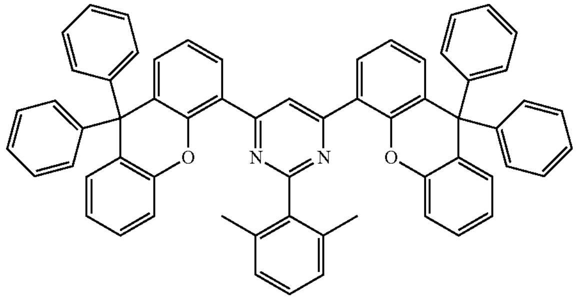
ETH30
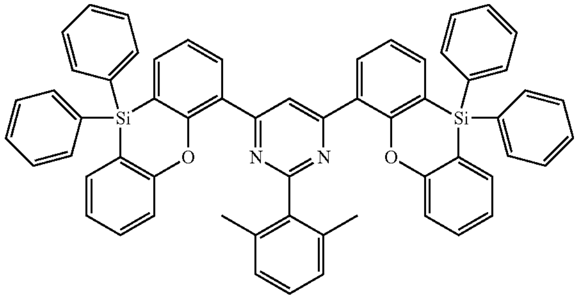
ETH31
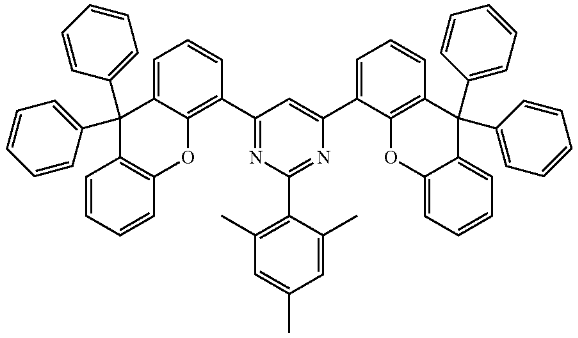
-continued
ETH32
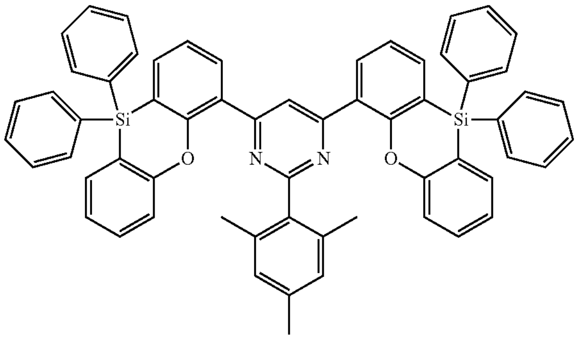
ETH33
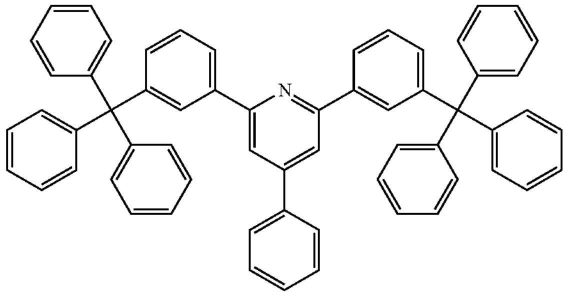
ETH34
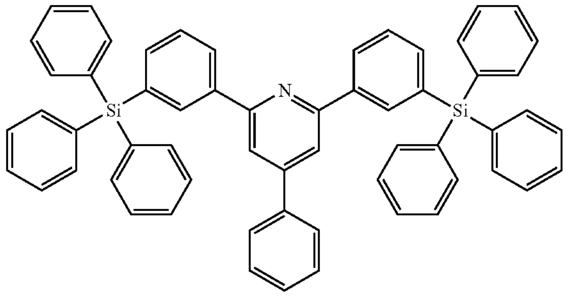
ETH35
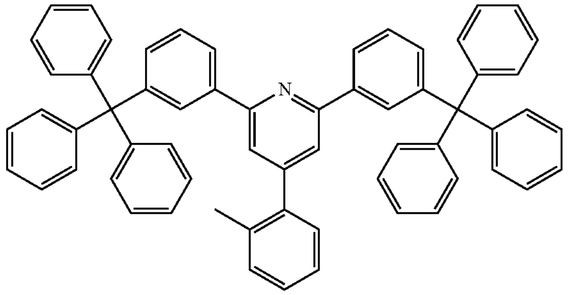
ETH36
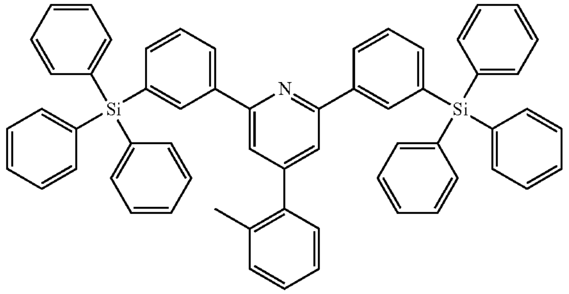

-continued
ETH37
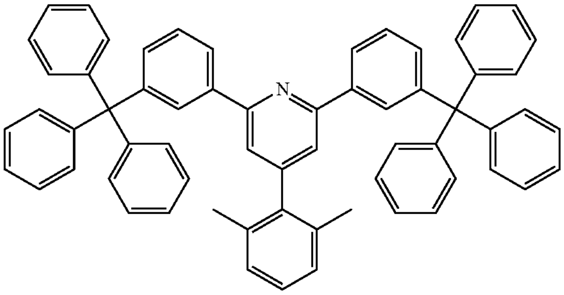
ETH38
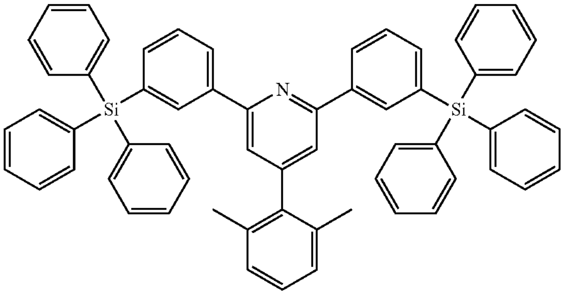
ETH39
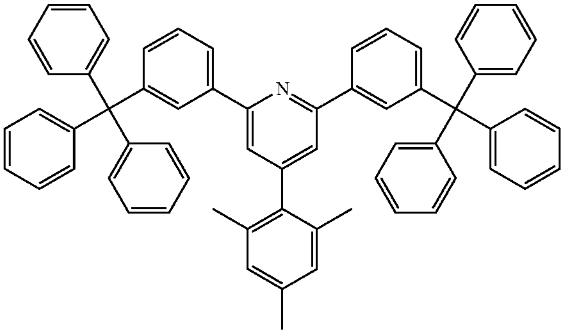
ETH40
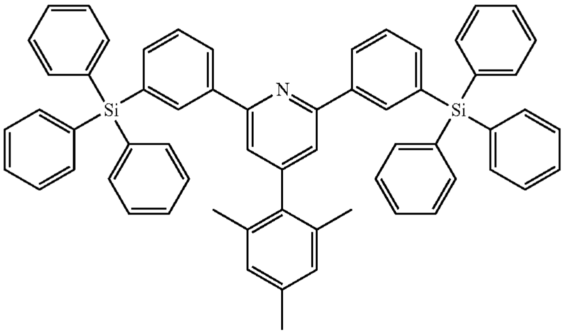
-continued
ETH41
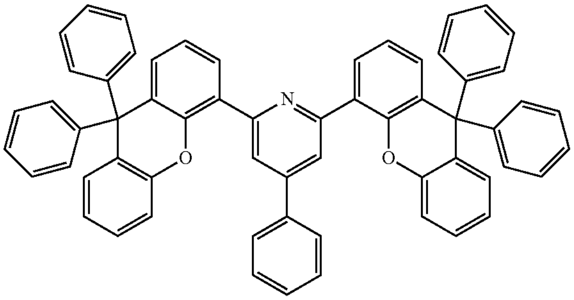
ETH42
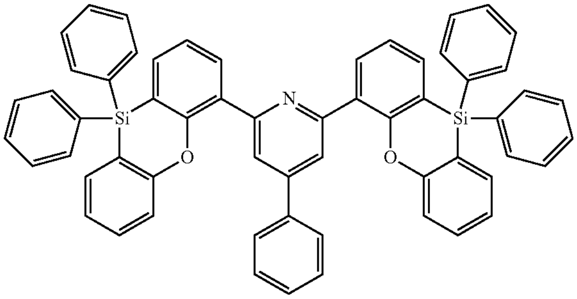
ETH43
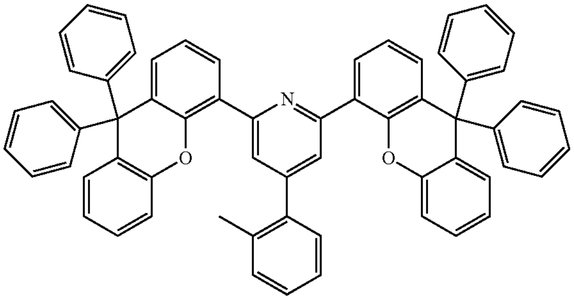
ETH44
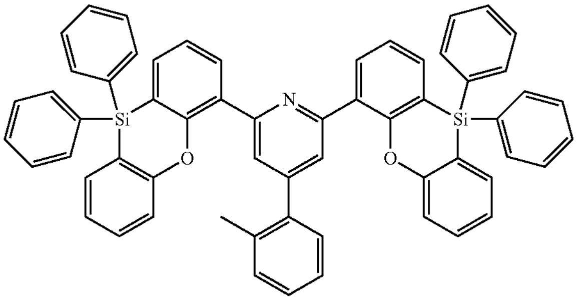
ETH45
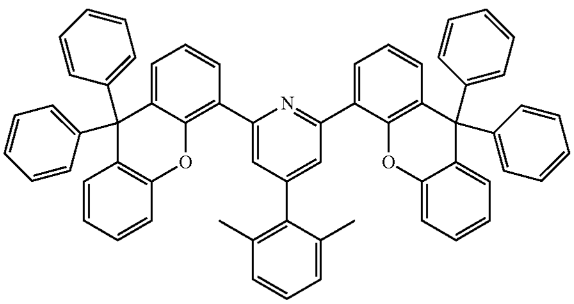

-continued
ETH46
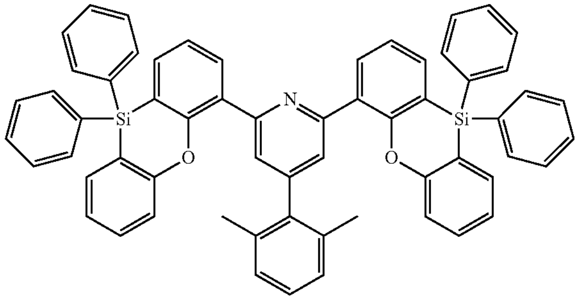
ETH47
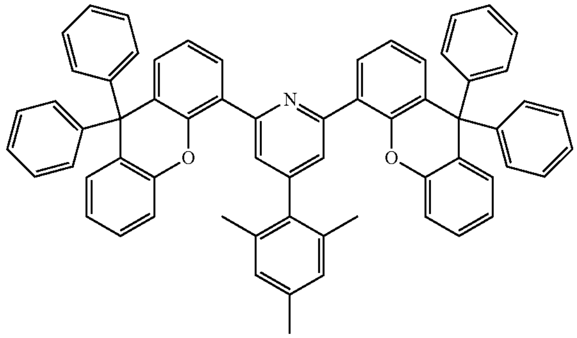
ETH48
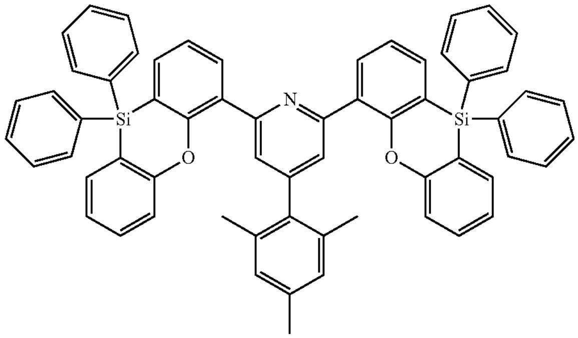
ETH49
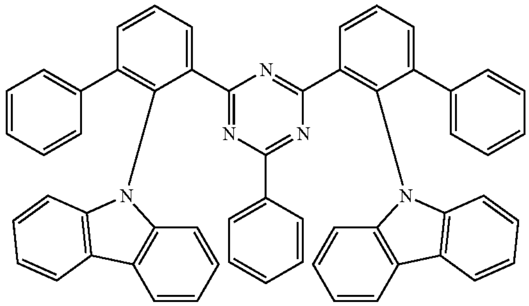
-continued
ETH50
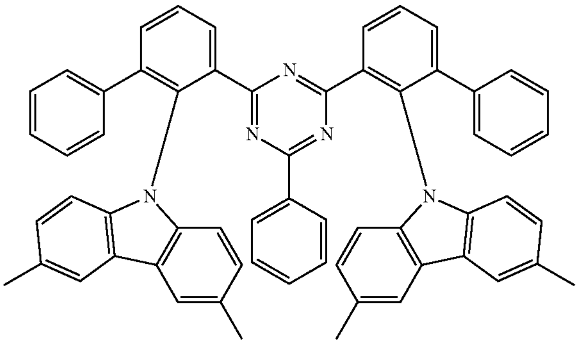
ETH51
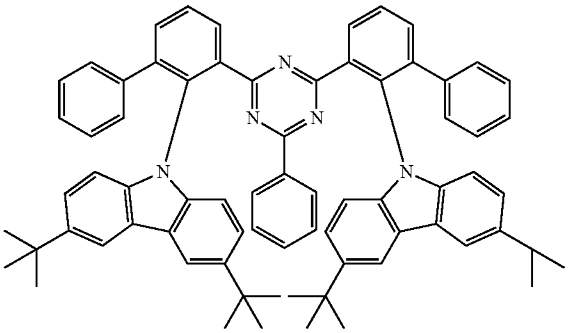
ETH52
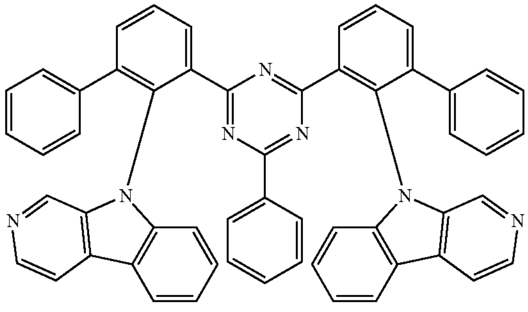
ETH53
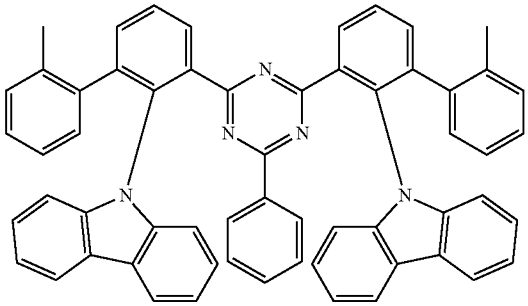

-continued
ETH54
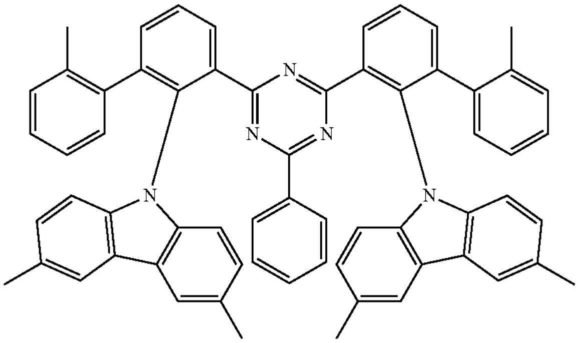
ETH55
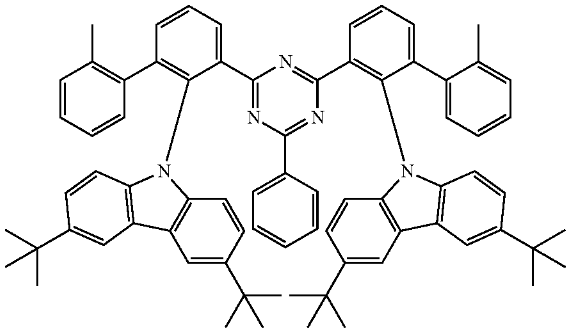
ETH56
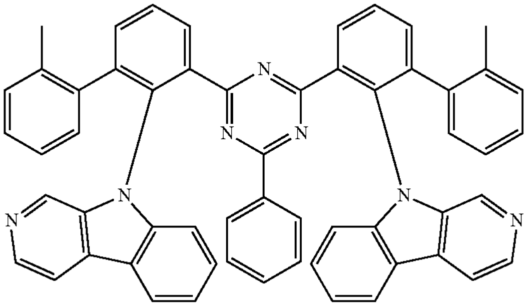
ETH57
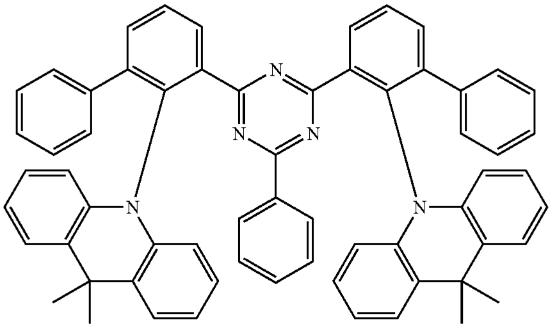
-continued
ETH58
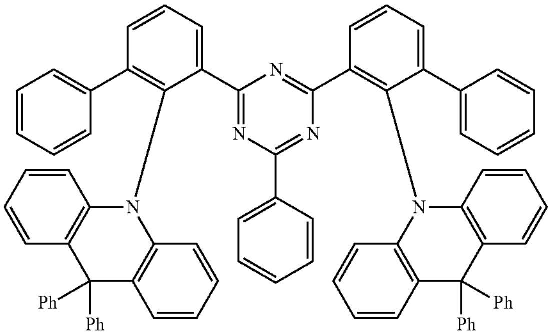
ETH59
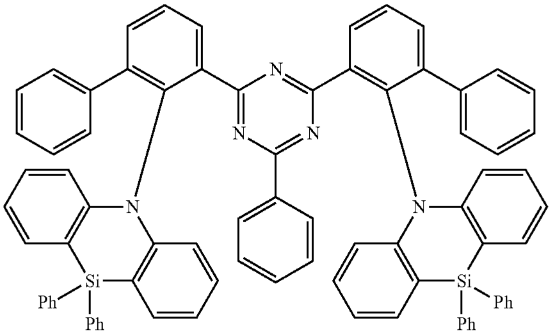
ETH60
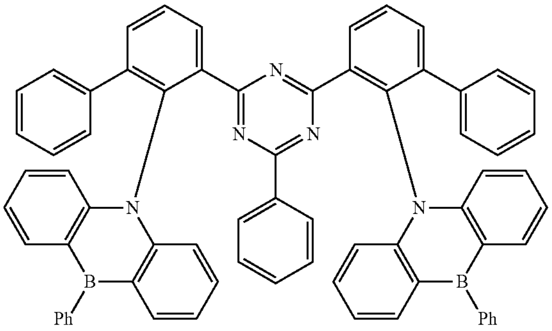
ETH61
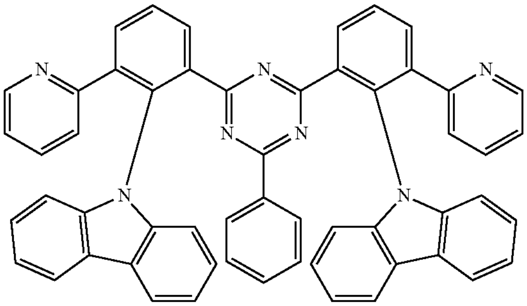

-continued
ETH62
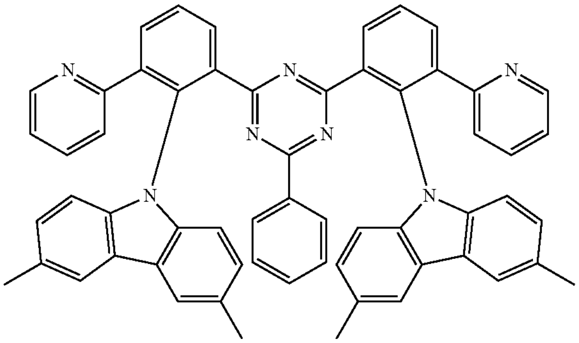
ETH63
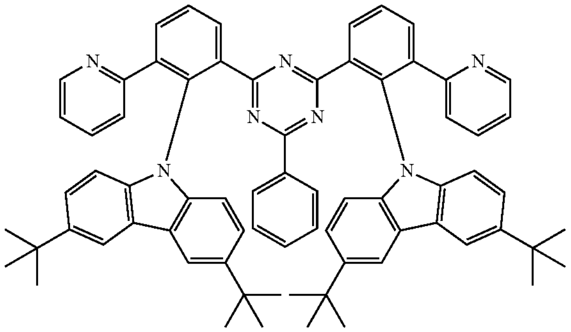
ETH64
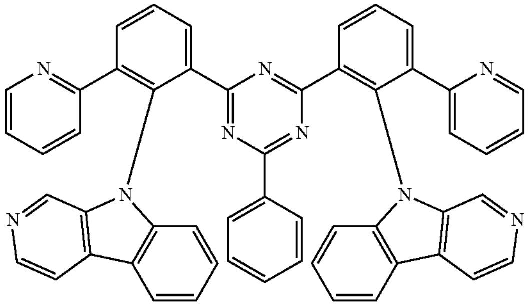
ETH65
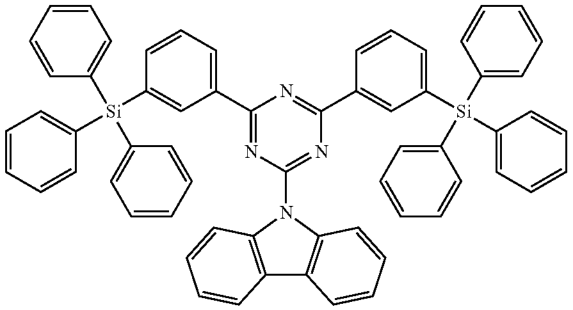
-continued
ETH66
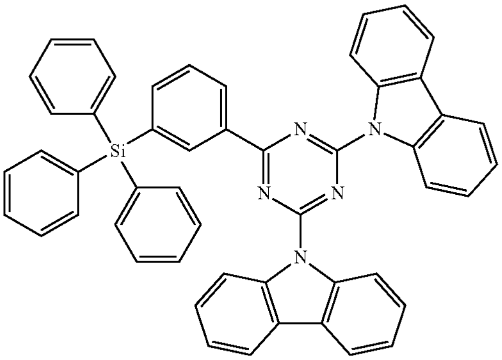
ETH67
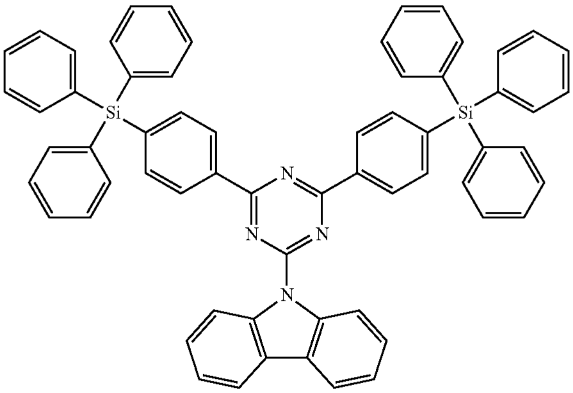
ETH68
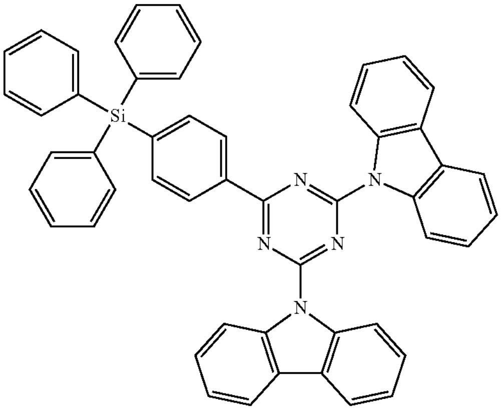
ETH69
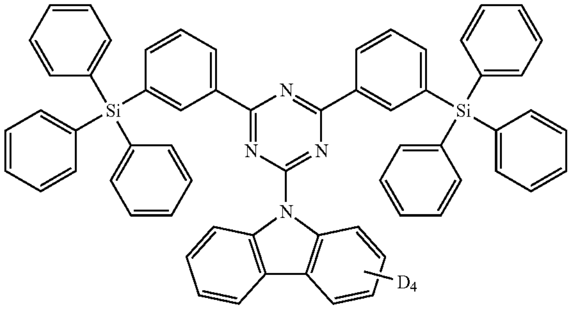

-continued
ETH70
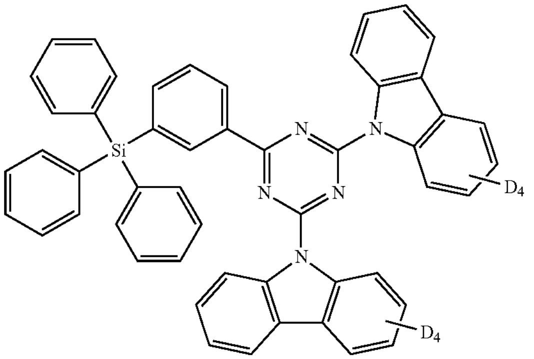
ETH71
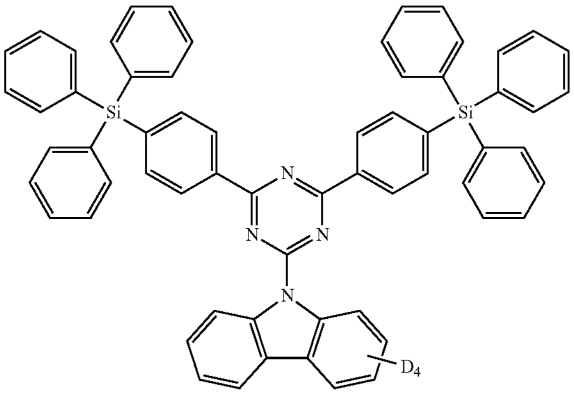
ETH72
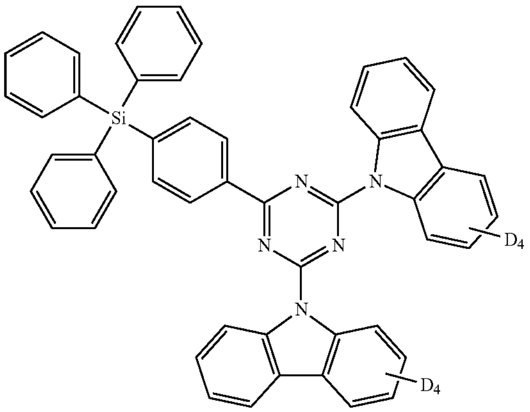
ETH73
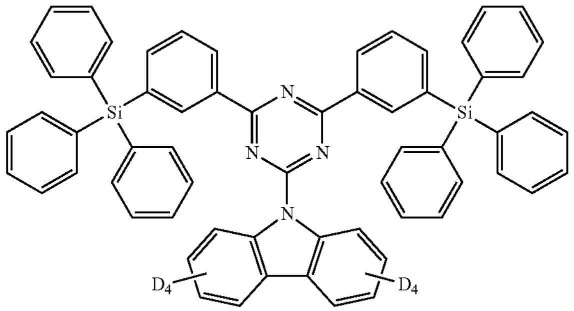
-continued
ETH74
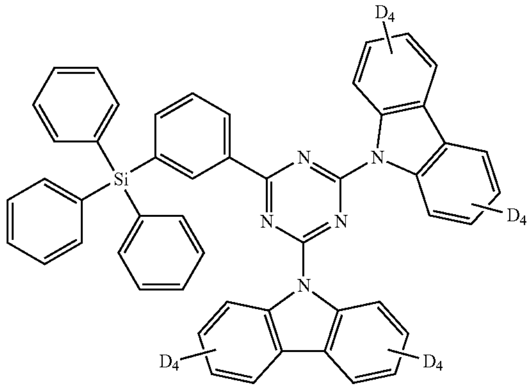
ETH75
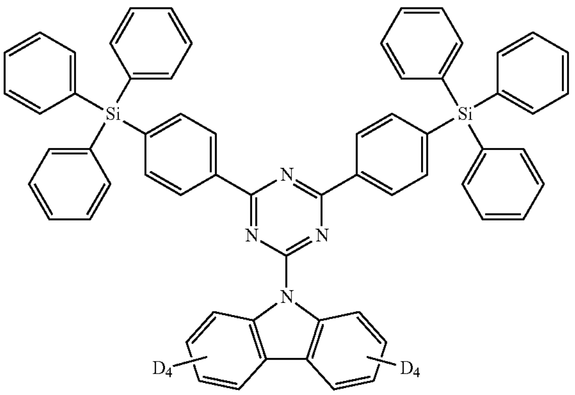
ETH76
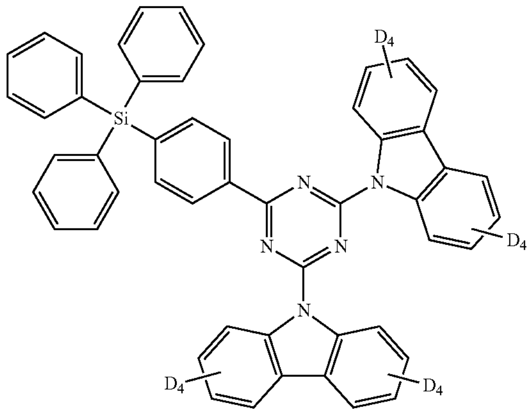

-continued
ETH77
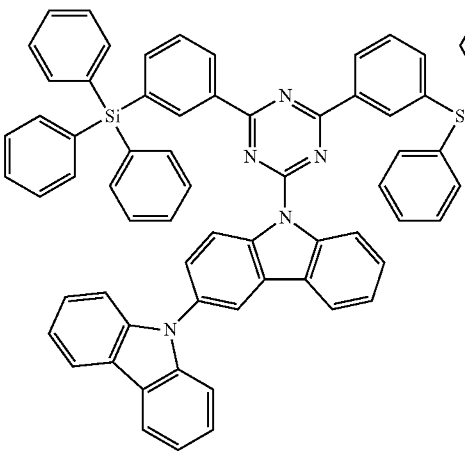
ETH78
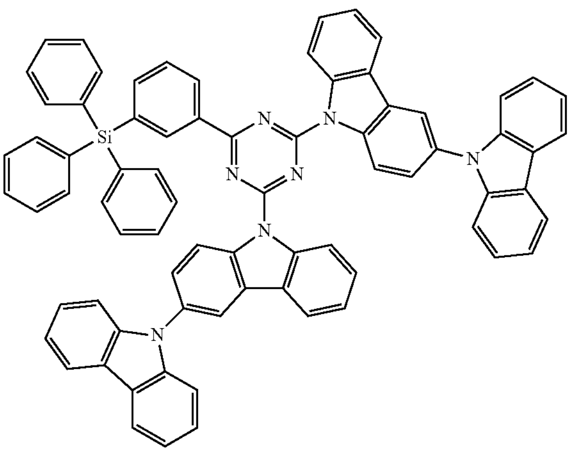
ETH79
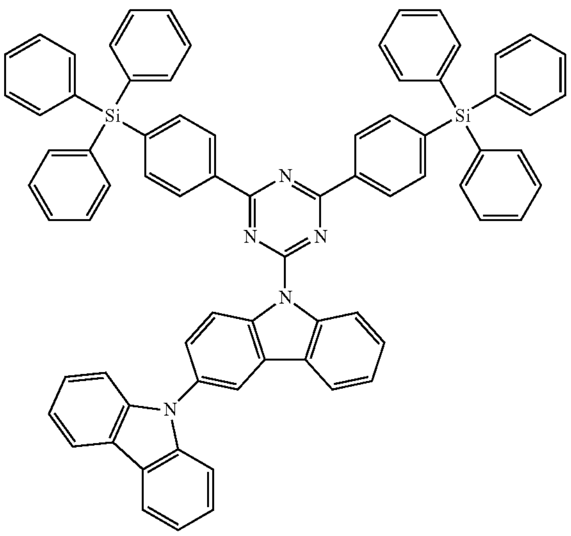
-continued
ETH80
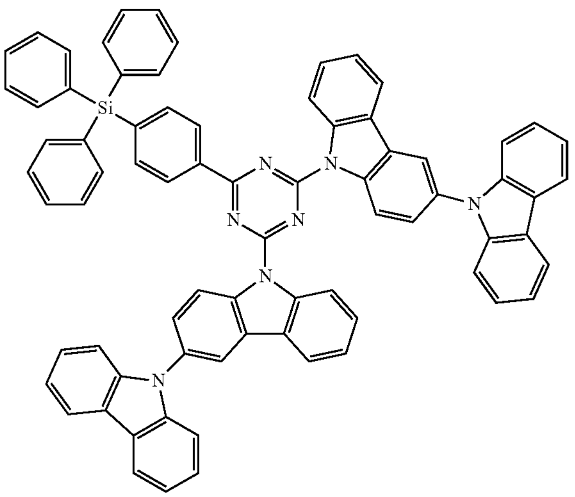
ETH81
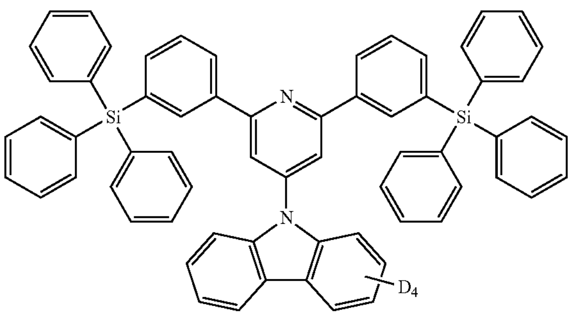
ETH82
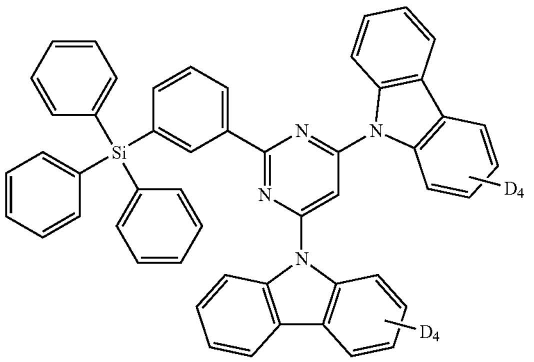
ETH83
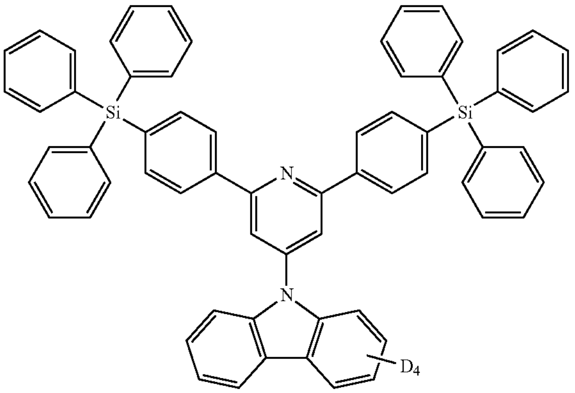

-continued

ETH84

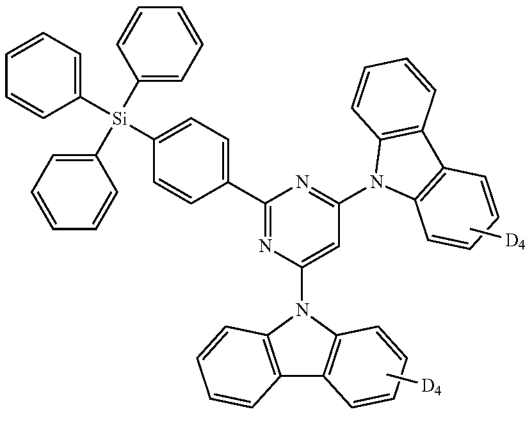

ETH85

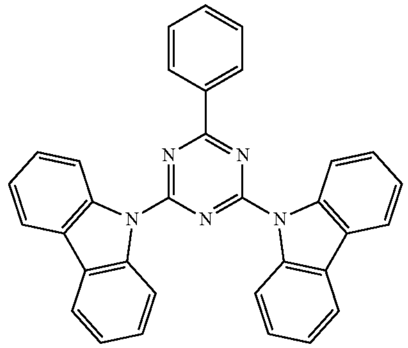

ETH86

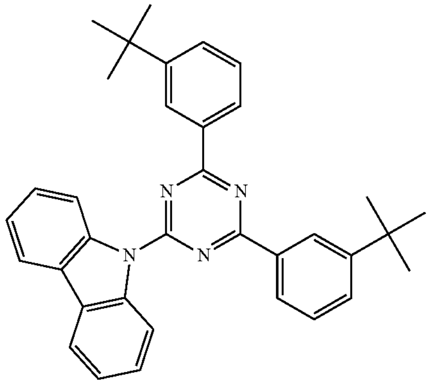

In an embodiment, the emission layer EML may include a compound represented by Formula E-2a or Formula E-2b. The compound represented by Formula E-2a or Formula E-2b may be used as a phosphorescent host material.

[Formula E-2a]

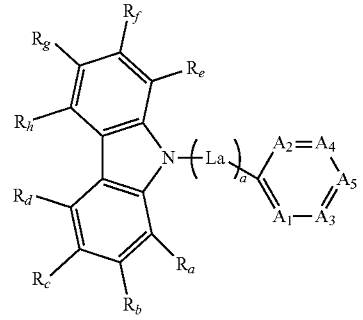

In Formula E-2a, a may be an integer from 0 to 10, and $L_a$ may be a direct linkage, a substituted or unsubstituted arylene group having 6 to 30 ring-forming carbon atoms, or a substituted or unsubstituted heteroarylene group having 2 to 30 ring-forming carbon atoms. When a is 2 or greater, multiple $L_a$ groups may each independently be a substituted or unsubstituted arylene group having 6 to 30 ring-forming carbon atoms, or a substituted or unsubstituted heteroarylene group having 2 to 30 ring-forming carbon atoms.

In Formula E-2a, $A_1$ to $A_5$ may each independently be N or $C(R_i)$. In Formula E-2a, $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring. For example, $R_a$ to $R_i$ may be bonded to an adjacent group to form a hydrocarbon ring or a heterocycle containing N, O, S, etc. as a ring-forming atom.

In Formula E-2a, two or three of $A_1$ to $A_5$ may each be N, and the remainder of $A_1$ to $A_5$ may each independently be $C(R_i)$.

[Formula E-2b]

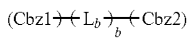

In Formula E-2b, Cbz1 and Cbz2 may each independently be an unsubstituted carbazole group or a carbazole group substituted with an aryl group having 6 to 30 ring-forming carbon atoms. In Formula E-2b, $L_b$ may be a direct linkage, a substituted or unsubstituted arylene group having 6 to 30 ring-forming carbon atoms, or a substituted or unsubstituted heteroarylene group having 2 to 30 ring-forming carbon atoms. In Formula E-2b, b may be an integer from 0 to 10, and when b is 2 or greater, multiple $L_b$ groups may each independently be a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be any compound selected from Compound Group E-2. However, the compounds listed in Compound Group E-2 are only examples, and the compound represented by Formula E-2a or Formula E-2b is not limited to Compound Group E-2:

[Compound Group E-2]
E-2-1
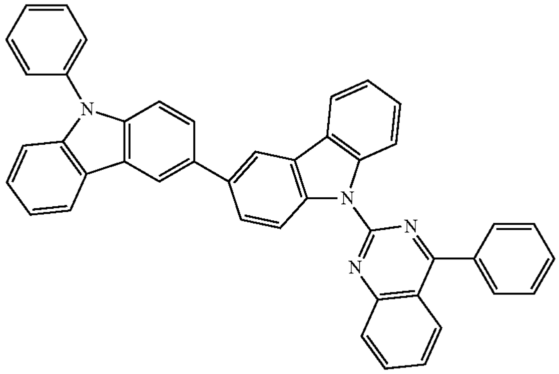
E-2-2
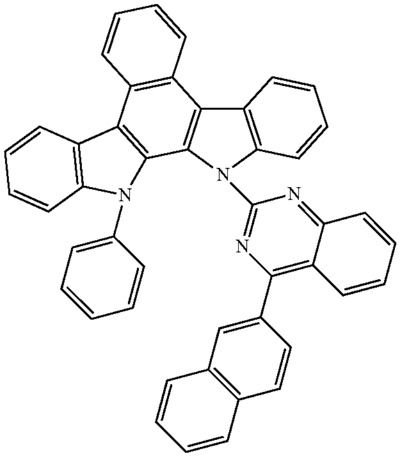
E-2-3
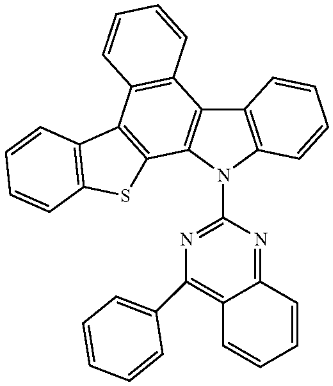
-continued
E-2-4
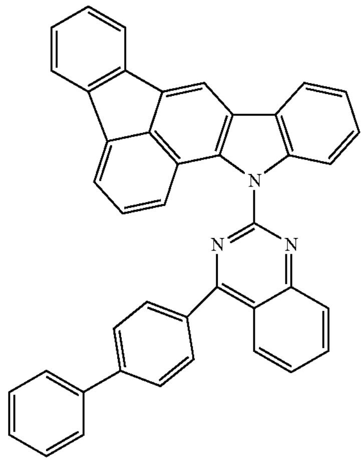
E-2-5
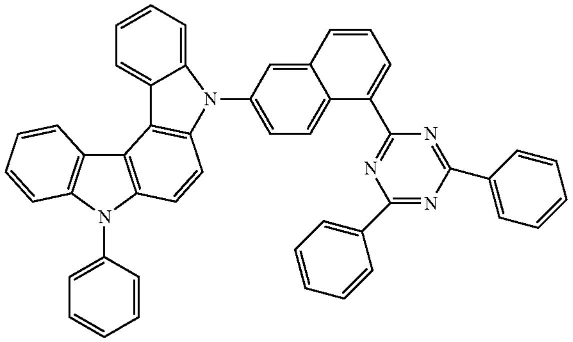
E-2-6
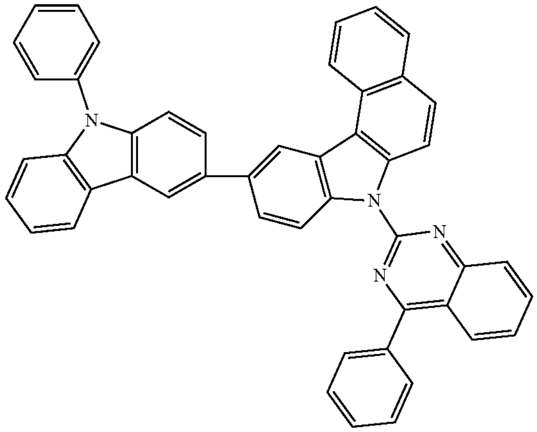

-continued
E-2-7
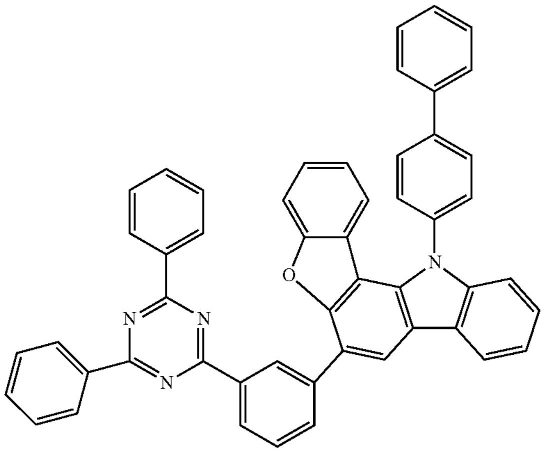
E-2-8
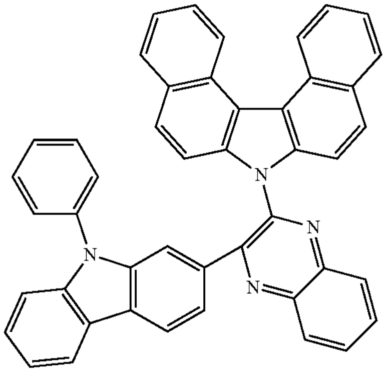
E-2-9
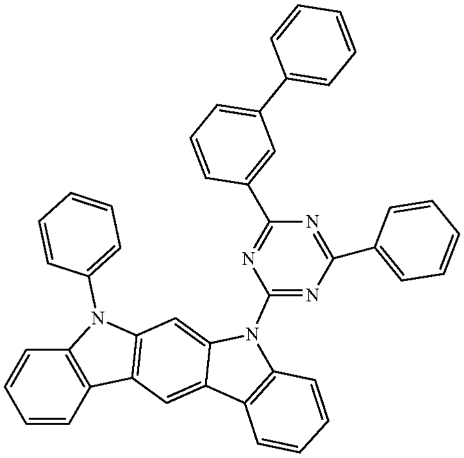
-continued
E-2-10
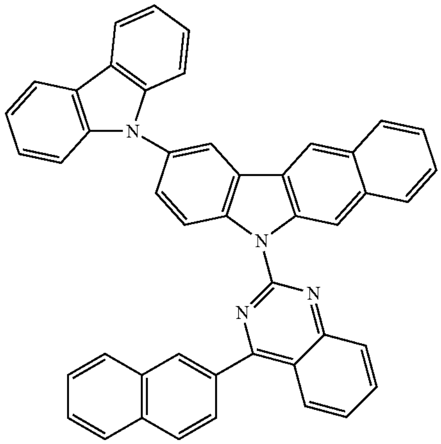
E-2-11
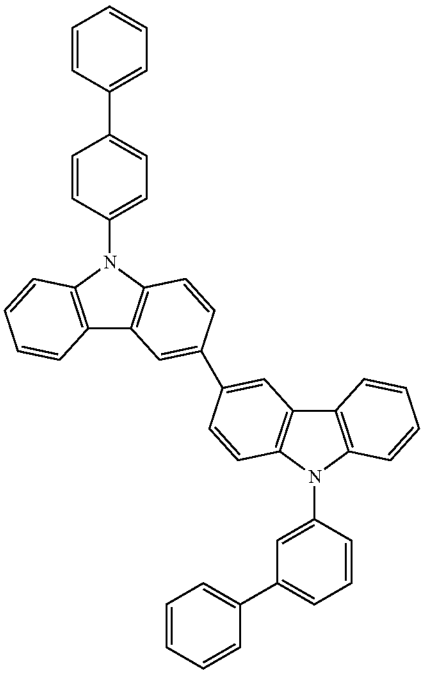
E-2-12
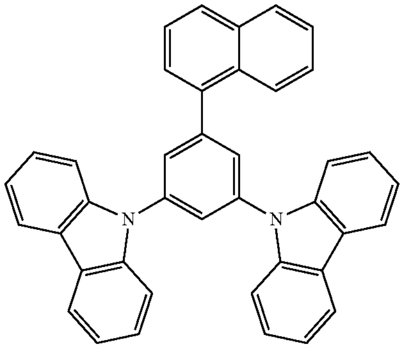

-continued
E-2-13
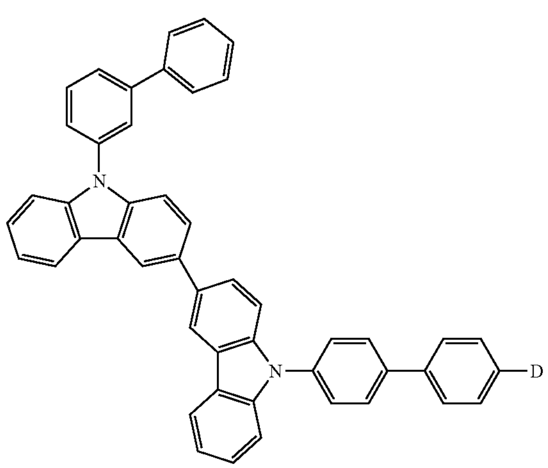
E-2-14
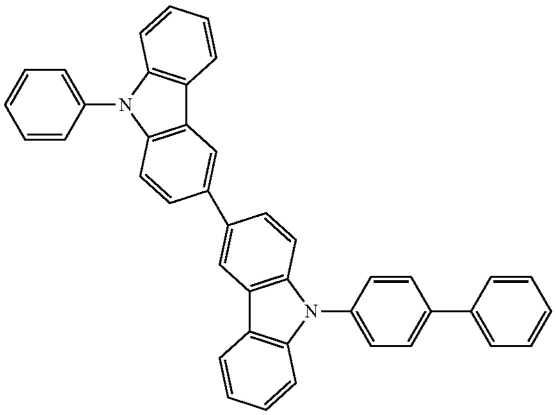
E-2-15
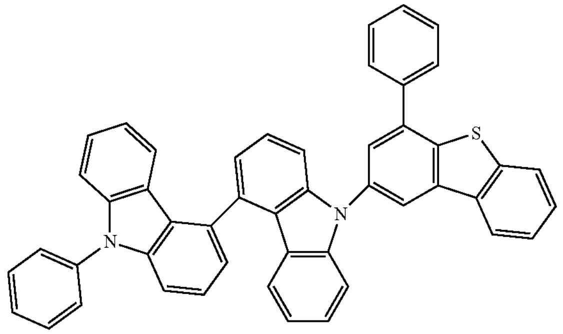
-continued
E-2-16
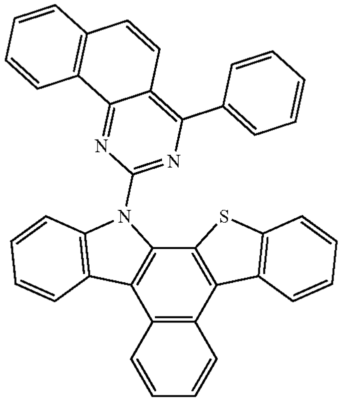
E-2-17
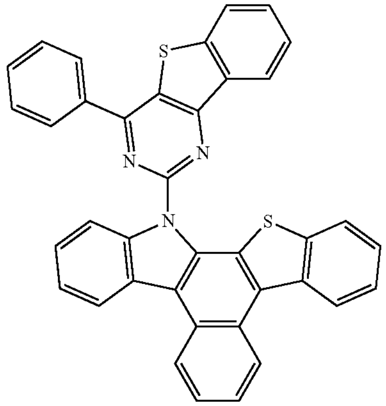
E-2-18
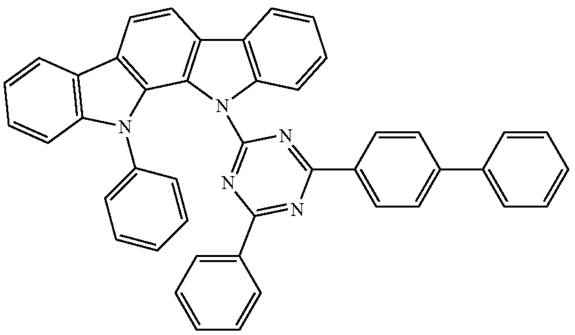
E-2-19
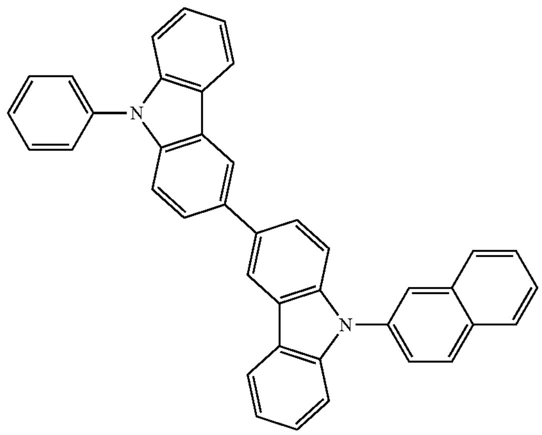

-continued

E-2-20

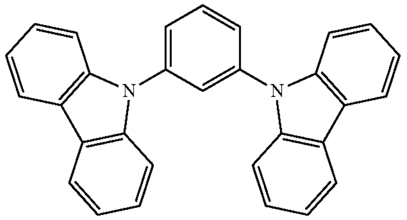

E-2-21

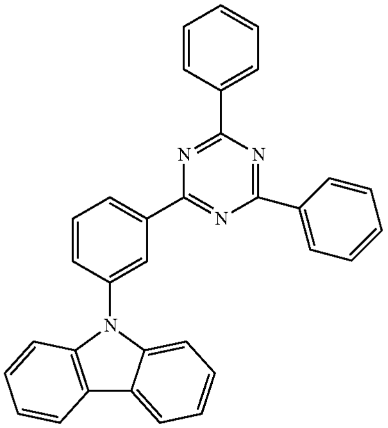

E-2-22

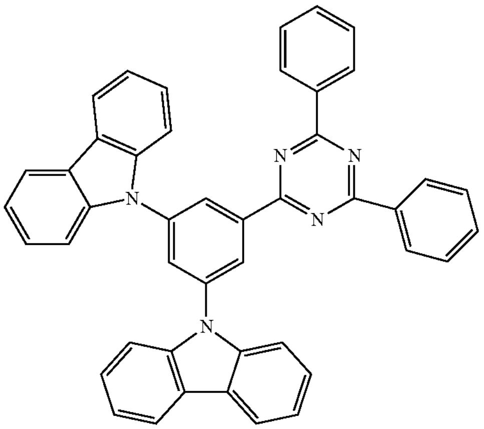

E-2-23

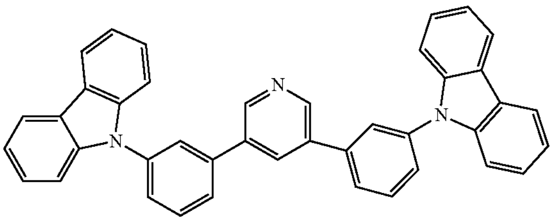

-continued

E-2-24

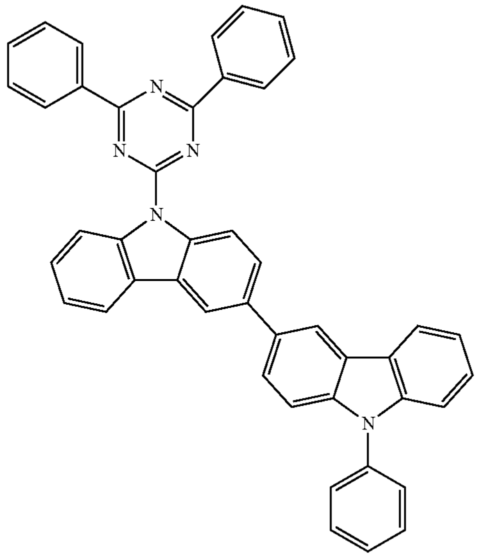

The emission layer EML may further include a material of the related art as a host material. For example, the emission layer EML may include, as a host material, at least one of bis(4-(9H-carbazol-9-yl)phenyl)diphenylsilane (BCPDS), (4-(1-(4-(diphenylamino)phenyl)cyclohexyl)phenyl)diphenyl-phosphine oxide (POPCPA), bis[2-(diphenylphosphino)phenyl]ether oxide (DPEPO), 4,4'-bis(N-carbazolyl)-1,1'-biphenyl (CBP), 1,3-bis(carbazolyl-9-yl)benzene (mCP), 2,8-bis(diphenylphosphoryl)dibenzofuran (PPF), 4,4',4"-tris(carbazol-9-yl)-triphenylamine (TCTA), or 1,3,5-tris(1-phenyl-1H-benzo[d]imidazol-2-yl)benzene (TPBi). However, embodiments are not limited thereto. For example, tris(8-hydroxyquinolino)aluminum ($Alq_3$), 9,10-di(naphthalene-2-yl)anthracene (ADN), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), etc. may be used as a host material.

The emission layer EML may include a compound represented by Formula M-a or Formula M-b. The compound represented by Formula M-a or Formula M-b may be used as a phosphorescent dopant material:

[Formula M-a]

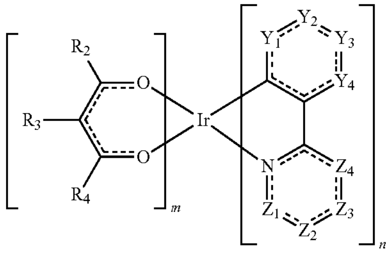

In Formula M-a, $Y_1$ to $Y_4$ and $Z_1$ to $Z_4$ may each independently be $C(R_1)$ or N; and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring. In Formula M-a, m may be 0 or 1, and n may be 2 or 3. In Formula M-a, when m is 0, n may be 3, and when m is 1, n may be 2.

The compound represented by Formula M-a may be used as a phosphorescent dopant.

The compound represented by Formula M-a may be any compound selected from Compounds M-a1 to M-a25. However, Compounds M-a1 to M-a25 are only examples, and the compound represented by Formula M-a is not limited to Compounds M-a1 to M-a25:

M-a1

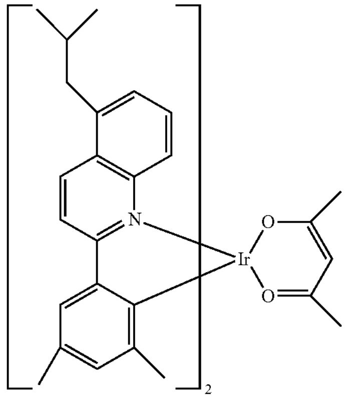

M-a2

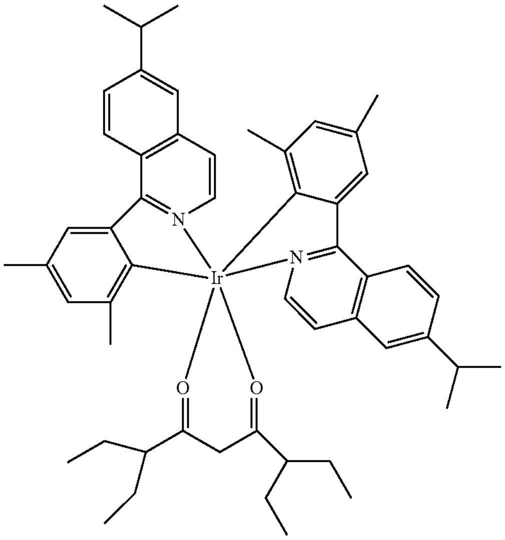

-continued

M-a3

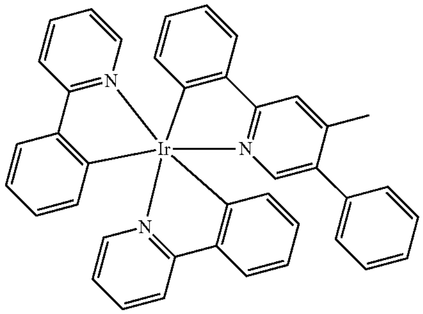

M-a4

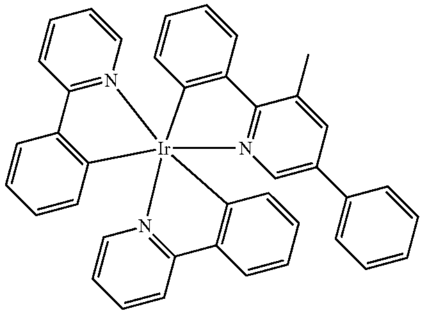

M-a5

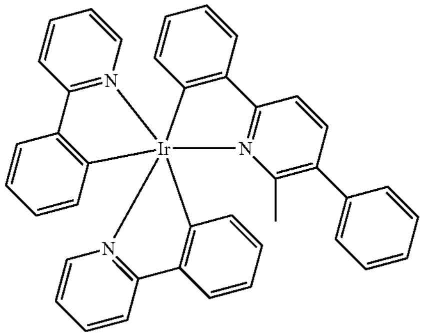

M-a6

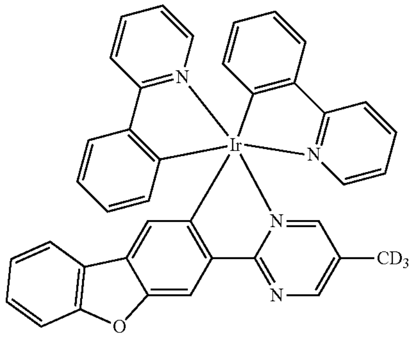

-continued
M-a7
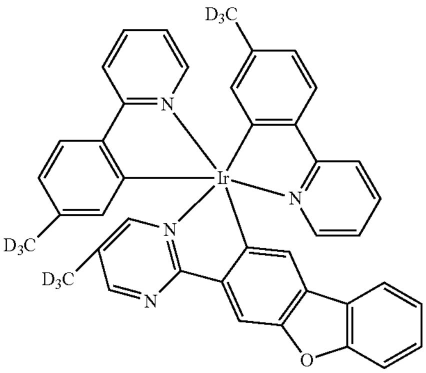
M-a8
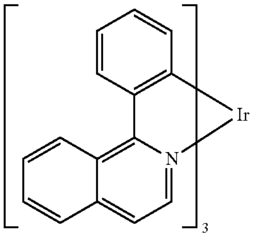
M-a9
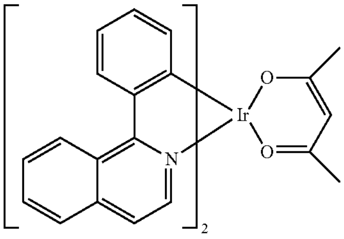
M-a10
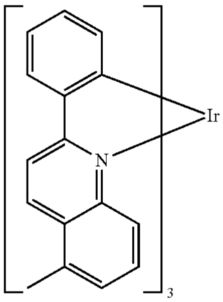
M-a11
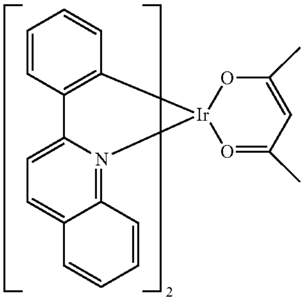
-continued
M-a12
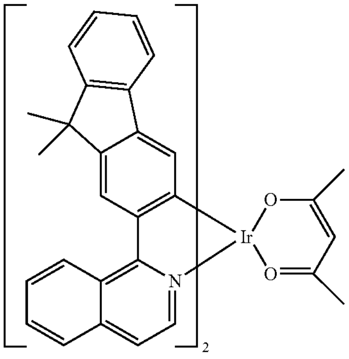
M-a13
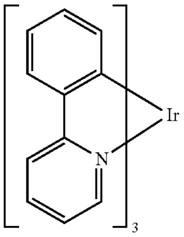
M-a14
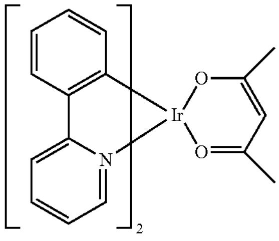
M-a15
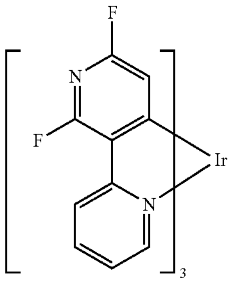
M-a16
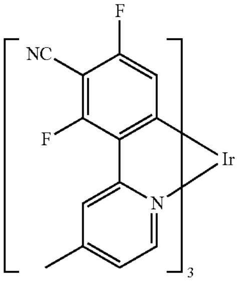

-continued
M-a17
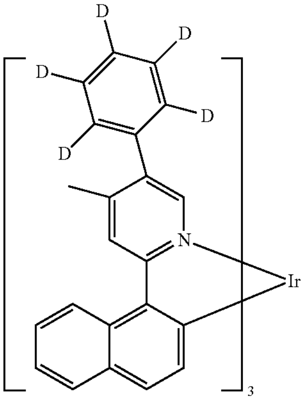
M-a18
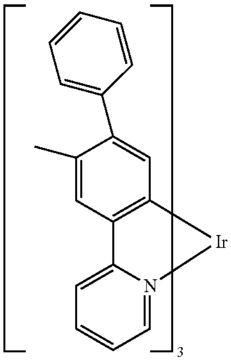
M-a19
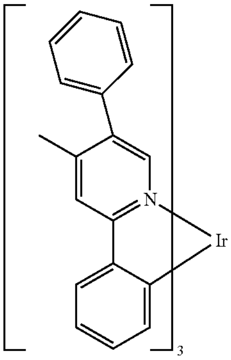
M-a20
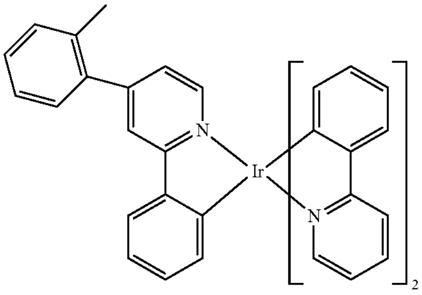
-continued
M-a21
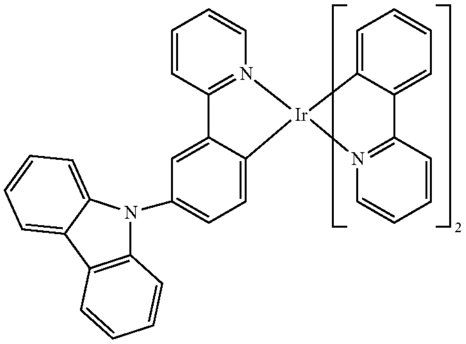
M-a22
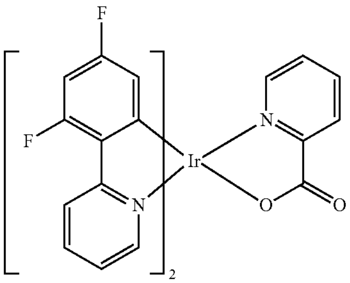
M-a23
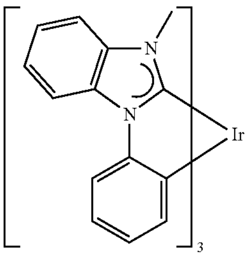
M-a24
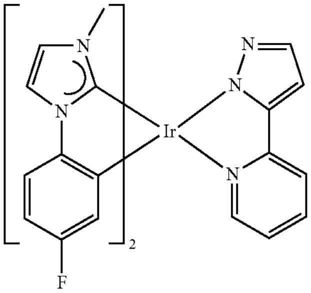
M-a25
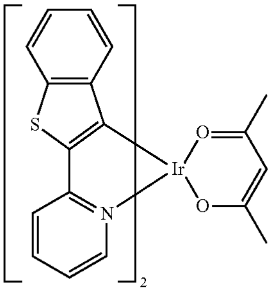

-continued

[Formula M-b]

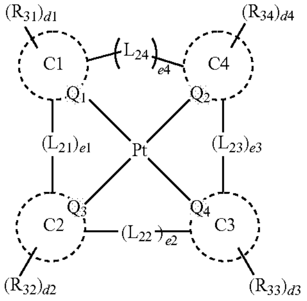

In Formula M-b, $Q_1$ to $Q_4$ may each independently be C or N; and C1 to C4 may each independently be a substituted or unsubstituted hydrocarbon ring having 5 to 30 ring-forming carbon atoms, or a substituted or unsubstituted heterocycle having 2 to 30 ring-forming carbon atoms. In Formula M-b, $L_{21}$ to $L_{24}$ may each independently be a direct linkage,

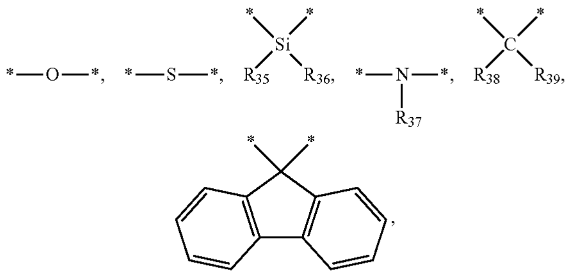

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms; and e1 to e4 may each independently be 0 or 1. In Formula M-b, $R_{31}$ to $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring; and d1 to d4 may each independently be an integer from 0 to 4.

The compound represented by Formula M-b may be used as a blue phosphorescent dopant or a green phosphorescent dopant.

The compound represented by Formula M-b may be any compound selected from Compounds M-b-1 to M-b-11. However, Compounds M-b-1 to M-b-11 are only examples, and the compound represented by Formula M-b is not limited to Compounds M-b-1 to M-b-11:

M-b-1

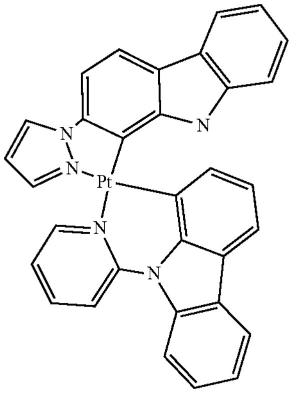

M-b-2

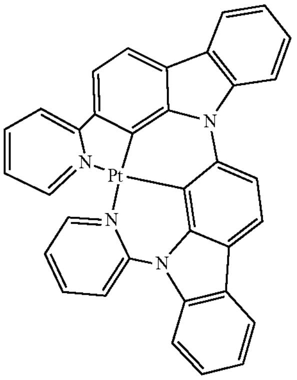

M-b-3

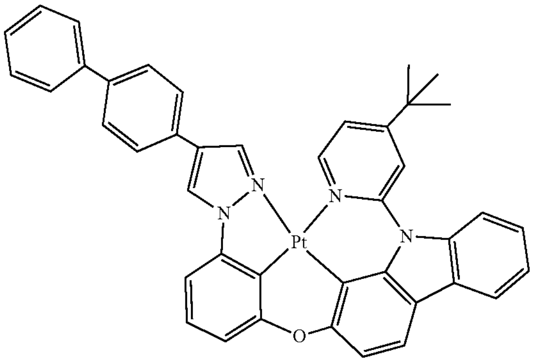

M-b-4

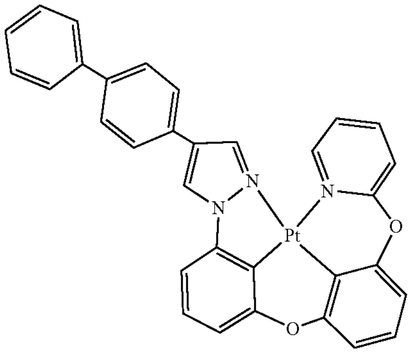

-continued

M-b-5

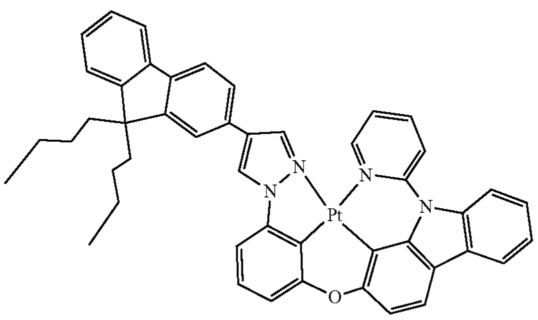

M-b-6

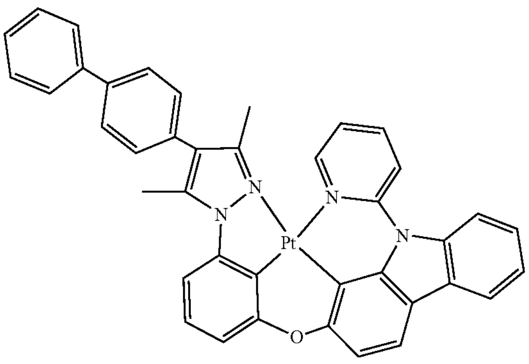

M-b-7

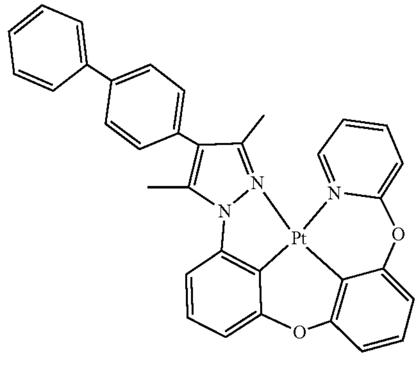

M-b-8

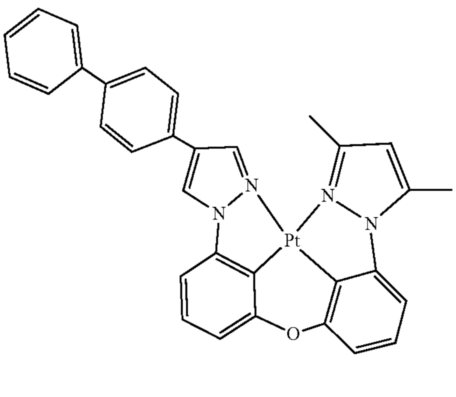

-continued

M-b-9

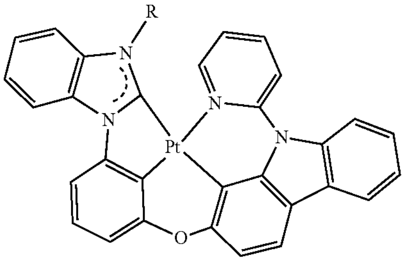

M-b-10

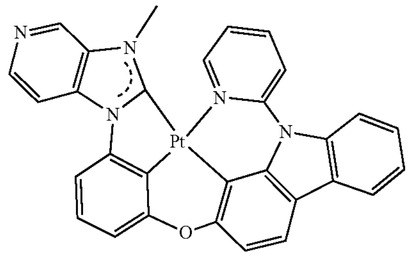

M-b-11

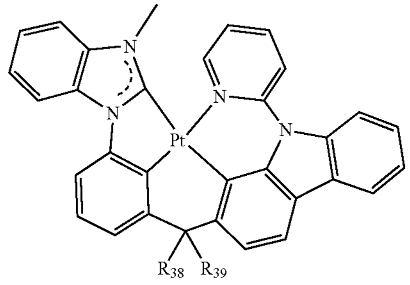

In Compounds M-b-1 to M-b-11, R, $R_{38}$, and $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may include a compound represented by any one of Formula F-a to Formula F-c. The compounds represented by Formula F-a to Formula F-c may be used as a fluorescent dopant material:

[Formula F-a]

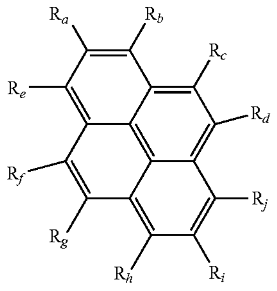

In Formula F-a, two of $R_a$ to $R_j$ may each independently be substituted with a group represented by $*\text{—}NAr_1Ar_2$. The remainder of $R_a$ to $R_j$ which are not substituted with the group represented by $*\text{—}NAr_1Ar_2$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In the group represented by *—$NAr_1Ar_2$, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, at least one of $Ar_1$ or $Ar_2$ may be a heteroaryl group containing O or S as a ring-forming atom.

[Formula F-b]

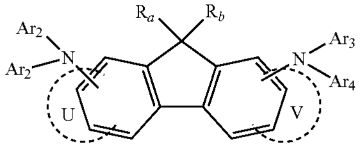

In Formula F-b, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring.

In Formula F-b, $Ar_1$ to $Ar_4$ may each independently be a substituted or unsubstituted aryl group having 6 to 30 ring-forming carbon atoms, or a substituted or unsubstituted heteroaryl group having 2 to 30 ring-forming carbon atoms.

In Formula F-b, U and V may each independently be a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may each independently be 0 or 1. For example, in Formula F-b, when the number of U or V is 1, a fused ring may be present at a portion indicated by U or V, and when the number of U or V is 0, a fused ring may not be present at the portion indicated by U or V. When the number of U is 0 and the number of V is 1, or when the number of U is 1 and the number of V is 0, a fused ring having a fluorene core of Formula F-b may be a cyclic compound having four rings. When U and V are each 0, a fused ring having a fluorene core of Formula F-b may be a cyclic compound having three rings. When U and V are each 1, a fused ring having a fluorene core of Formula F-b may be a cyclic compound having five rings.

[Formula F-c]

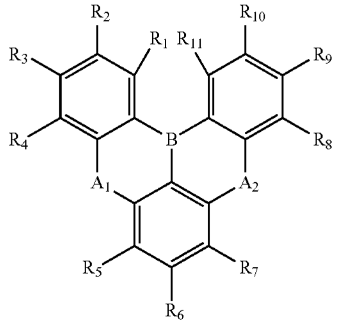

In Formula F-c, $A_1$ and $A_2$ may each independently be O, S, Se, or $N(R_m)$; and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula F-c, $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring.

In Formula F-c, $A_1$ and $A_2$ may each independently be bonded to substituents of neighboring rings to form a fused ring. For example, when $A_1$ and $A_2$ are each independently $N(R_m)$, $A_1$ may be bonded to $R_4$ or $R_5$ to form a ring. For example, $A_2$ may be bonded to $R_7$ or $R_8$ to form a ring.

The emission layer EML may include, as a dopant material of the related art, styryl derivatives (e.g., 1,4-bis[2-(3-N-ethylcarbazoryl)vinyl]benzene (BCzVB), 4-(di-p-tolylamino)-4"-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi)), perylene and derivatives thereof (e.g., 2,5,8,11-tetra-t-butylperylene (TBP)), pyrene and derivatives thereof (e.g., 1,1-dipyrene, 1,4-dipyrenylbenzene, 1,4-bis(N,N-diphenylamino)pyrene), etc.

The emission layer EML may include a phosphorescent dopant material of the related art. For example, a phosphorescent dopant may be a metal complex including iridium (Ir), platinum (Pt), osmium (Os), gold (Au), titanium (Ti), zirconium (Zr), hafnium (Hf), europium (Eu), terbium (Tb), or thulium (Tm). For example, iridium(III) bis(4,6-difluorophenylpyridinato-N,C2')picolinate (FIrpic), bis(2,4-difluorophenylpyridinato)-tetrakis(1-pyrazolyl)borate iridium (III) (Fir6), platinum octaethyl porphyrin (PtOEP), etc. may be used as a phosphorescent dopant. However, embodiments are not limited thereto.

The emission layer EML may include a quantum dot. The quantum dot may be a Group II-VI compound, a Group III-VI compound, a Group I-III-VI compound, a Group III-V compound, a Group III-II-V compound, a Group IV-VI compound, a Group IV element, a Group IV compound, or any combination thereof.

The Group II-VI compound may include: a binary compound selected from the group consisting of CdSe, CdTe, CdS, ZnS, ZnSe, ZnTe, ZnO, HgS, HgSe, HgTe, MgSe, MgS, and any mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any mixture thereof; a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and any mixture thereof; or any combination thereof.

The Group III-VI compound may include: a binary compound such as $In_2S_3$ and $In_2Se_3$; a ternary compound such as $InGaS_3$ and $InGaSe_3$; or any combination thereof.

The Group I-III-VI compound may include: a ternary compound selected from the group consisting of AgInS, $AgInS_2$, CuInS, $CuInS_2$, $AgGaS_2$, $CuGaS_2CuGaO_2$, $AgGaO_2$, $AgAlO_2$, and any mixture thereof; a quaternary compound such as $AgInGaS_2$ and $CuInGaS_2$; or any combination thereof.

The Group III-V compound may include: a binary compound selected from the group consisting of GaN, GaP, GaAs, GaSb, AlN, AlP, AlAs, AlSb, InN, InP, InAs, InSb, and any mixture thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and any mixture thereof; a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any mixture thereof; or any combination thereof. In an embodiment, the Group III-V compound may further include a Group II metal. For example, InZnP, etc. may be selected as a Group III-II-V compound.

The Group IV-VI compound may include: a binary compound selected from the group consisting of SnS, SnSe, SnTe, PbS, PbSe, PbTe, and any mixture thereof; a ternary compound selected from the group consisting of SnSeS, SnSeTe, SnSTe, PbSeS, PbSeTe, PbSTe, SnPbS, SnPbSe, SnPbTe, and any mixture thereof; a quaternary compound selected from the group consisting of SnPbSSe, SnPbSeTe, SnPbSTe, and any mixture thereof; or any combination thereof. The Group IV element may be Si, Ge, or any mixture thereof. The Group IV compound may include a binary compound selected from the group consisting of SiC, SiGe, and any mixture thereof.

A binary compound, a ternary compound, or a quaternary compound may be present in a particle at a uniform concentration distribution, or may be present in a particle at a partially different concentration distribution. In an embodiment, a quantum dot may have a core/shell structure in which one quantum dot surrounds another quantum dot. A quantum dot having a core/shell structure may have a concentration gradient in which the concentration of a material that is present in the shell decreases towards the core.

In embodiments, a quantum dot may have the core/shell structure including a core having nanocrystals, and a shell surrounding the core, which are described above. The shell of the quantum dot may serve as a protection layer to prevent the chemical deformation of the core so as to keep semiconductor properties, and/or may serve as a charging layer to impart electrophoresis properties to the quantum dot. The shell may be a single layer or multiple layers. Examples of the shell of the quantum dot may include a metal oxide, a non-metal oxide, a semiconductor compound, or any combination thereof.

For example, the metal oxide or the non-metal oxide may include: a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO; a ternary compound such as $MgAl_2O_4$, $CoFe_2O_4$, $NiFe_2O_4$, and $CoMn_2O_4$, or any combination thereof. However, embodiments are not limited thereto.

Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments are not limited thereto.

The quantum dot may have a full width at half maximum (FWHM) of an emission wavelength spectrum equal to or less than about 45 nm. For example, the quantum dot may have a FWHM of an emission wavelength spectrum equal to or less than about 40 nm. For example, the quantum dot may have a FWHM of an emission wavelength spectrum equal to or less than about 30 nm. Within these ranges, color purity or color reproducibility may be improved. Light emitted through a quantum dot may be emitted in all directions, so that a wide viewing angle may be improved.

The form of a quantum dot may be any form that is used in the related art. For example, a quantum dot may have a spherical shape, a pyramidal shape, a multi-arm shape, or a cubic shape, or the quantum dot may be in the form of nanoparticles, nanotubes, nanowires, nanofibers, nanoplatelets, etc.

The quantum dot may control the color of emitted light according to a particle size thereof. Accordingly, the quantum dot may emit various colors of light such as blue, red, green, etc.

In the light emitting element ED according to embodiments shown in FIGS. 3A and 3B, an electron transport region ETR is provided on the emission layer EML. The electron transport region ETR may include at least one of a hole blocking layer, an electron transport layer, or an electron injection layer, but embodiments are not limited thereto.

The electron transport region may be a layer formed of a single material, a layer formed of different materials, or a structure including multiple layers formed of different materials.

For example, the electron transport region ETR may have a single layer structure of an electron injection layer or an electron transport layer, or may have a single layer structure formed of an electron injection material and an electron transport material. In other embodiments, the electron transport region ETR may have a single layer structure formed of different materials, or may have a structure in which an electron transport layer/electron injection layer, or a hole blocking layer/electron transport layer/electron injection layer are stacked in its respective stated order from an emission layer EML, but embodiments are not limited thereto. The electron transport region ETR may have a thickness, for example, in a range of about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include a compound represented by Formula ET-2:

[Formula ET-2]

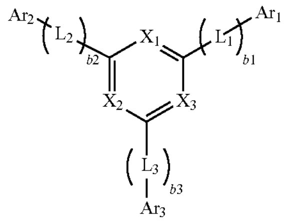

In Formula ET-2, at least one of $X_1$ to $X_3$ may each be N and the remainder of $X_1$ to $X_3$ may each independently be $C(R_a)$. In Formula ET-2, $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula ET-2, $Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-2, a to c may each independently be an integer from 0 to 10. In Formula ET-2, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms. When a to c are each 2 or greater, multiple groups of each of $L_1$ to $L_3$ may each independently be a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, embodiments are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate ($Bebq_2$), 9,10-di(naphthalene-2-yl)anthracene (ADN), 1,3-bis[3,5-di(pyridin-3-yl)phenyl]benzene (BmPyPhB), or any mixture thereof.

In an embodiment, the electron transport region ETR may include at least one compound selected from Compounds ET1 to ET36:

ET1

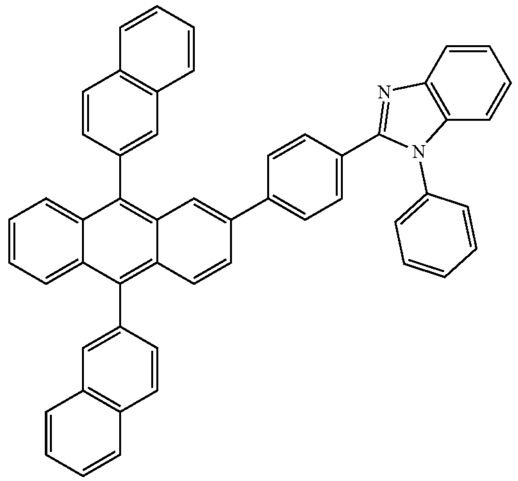

ET2

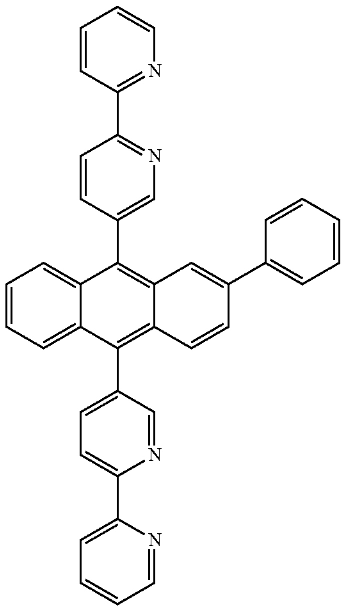

ET3

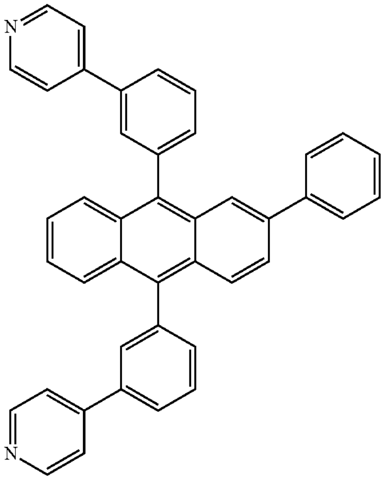

-continued
ET4
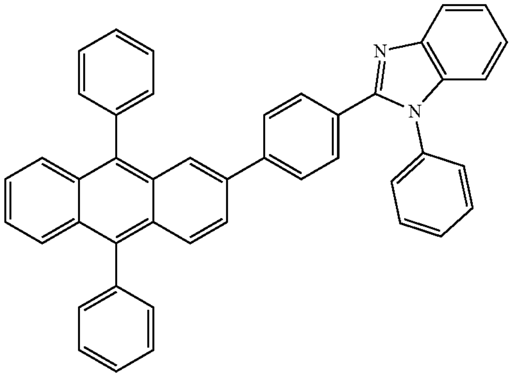
ET5
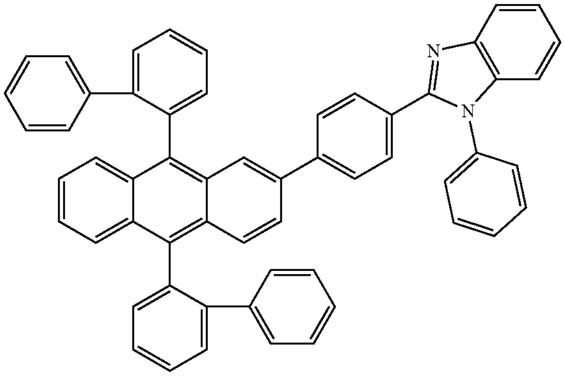
ET6
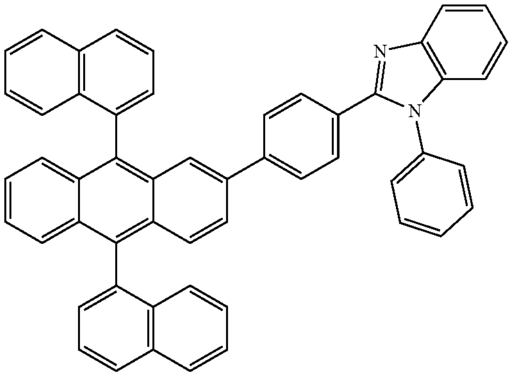
-continued
ET7
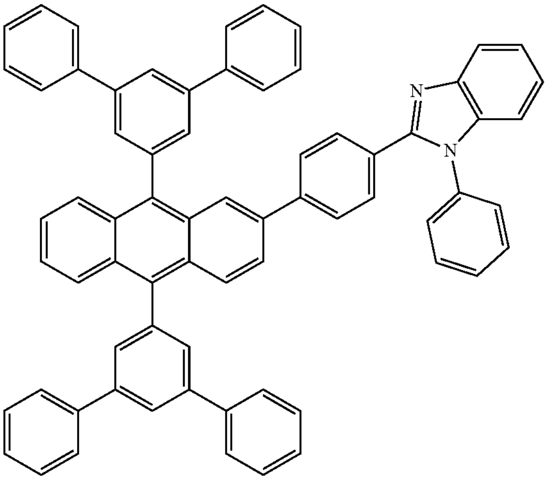
ET8
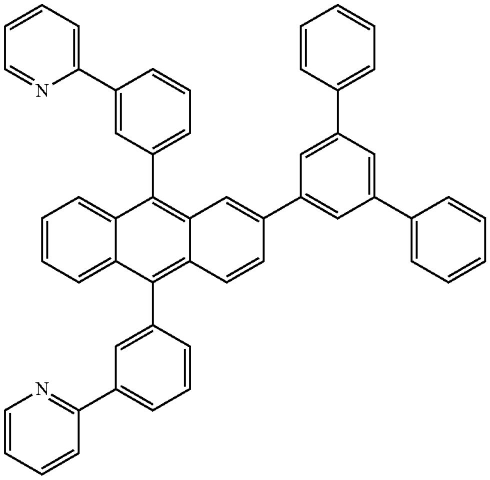
ET9
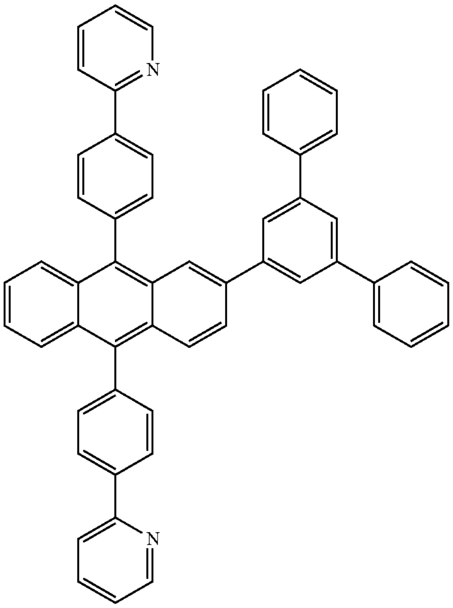

-continued
ET10
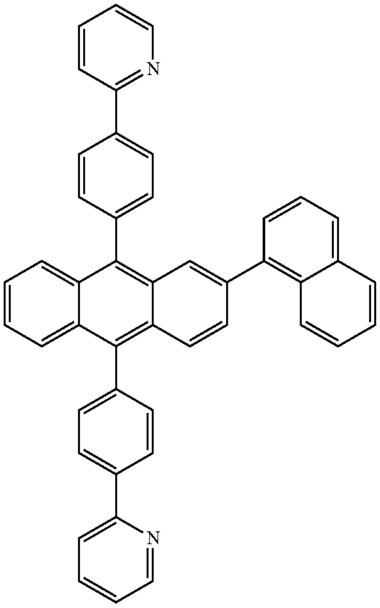
ET11
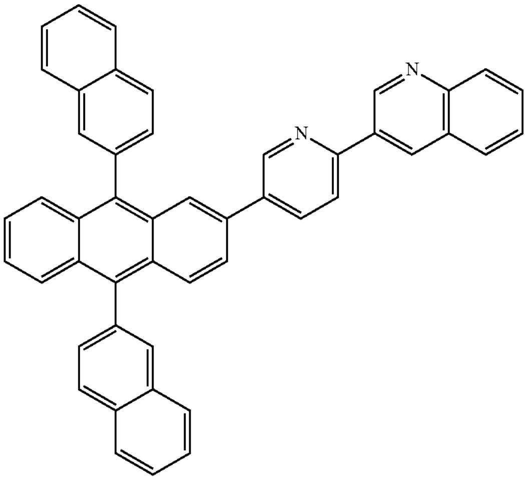
ET12
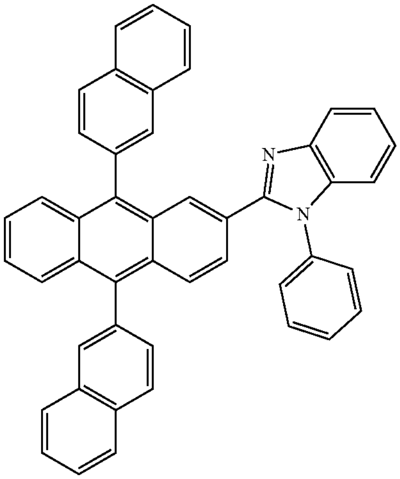
-continued
ET13
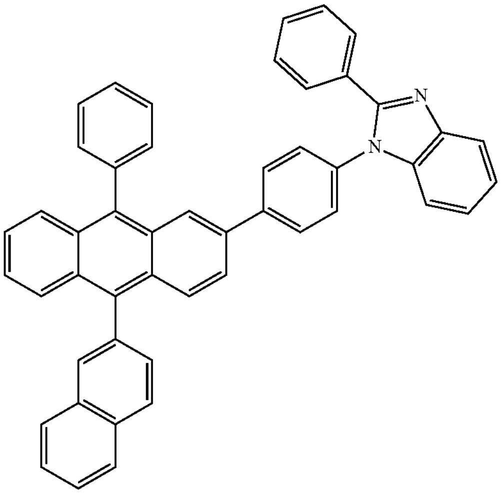
ET14
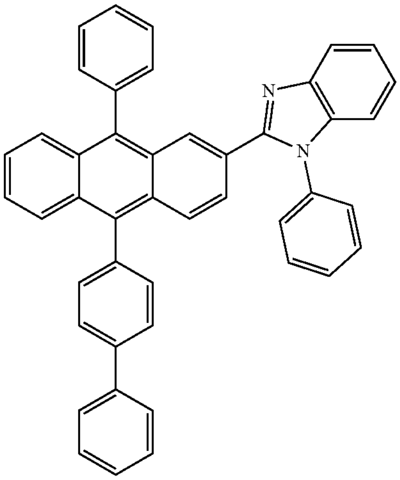
ET15
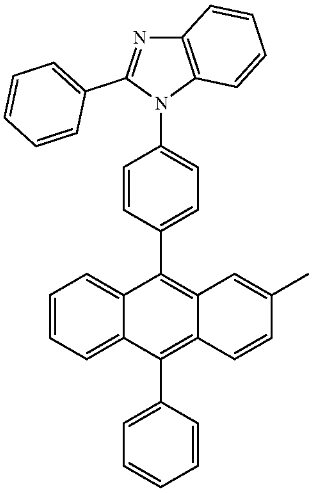

ET16
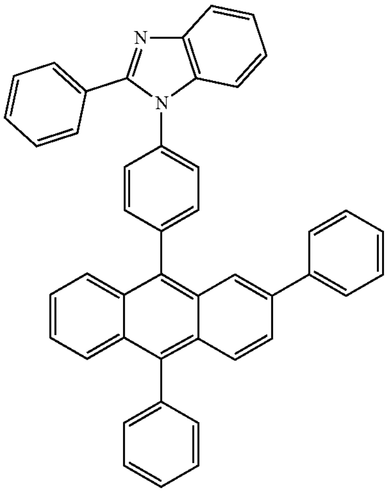
ET17
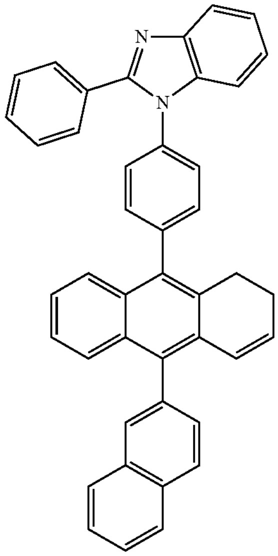
ET18
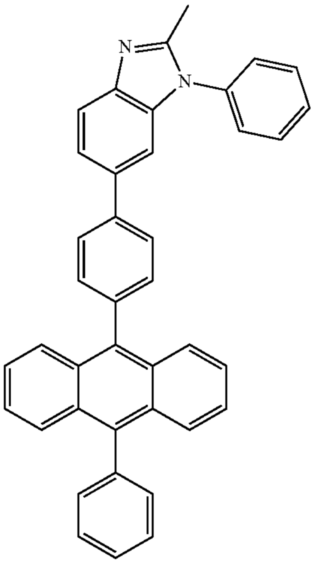
ET19
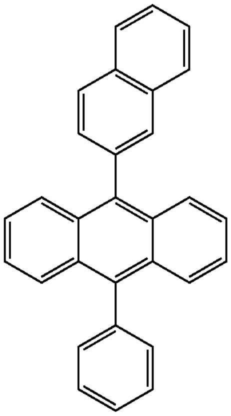
ET20
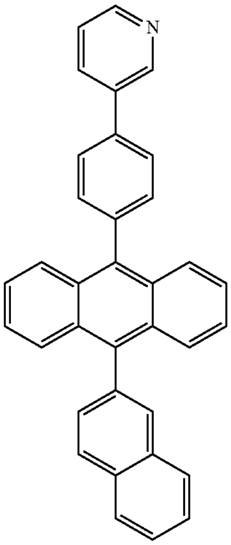
ET21
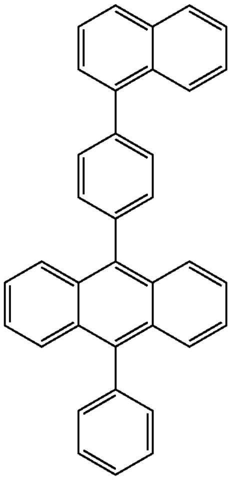

-continued
ET22
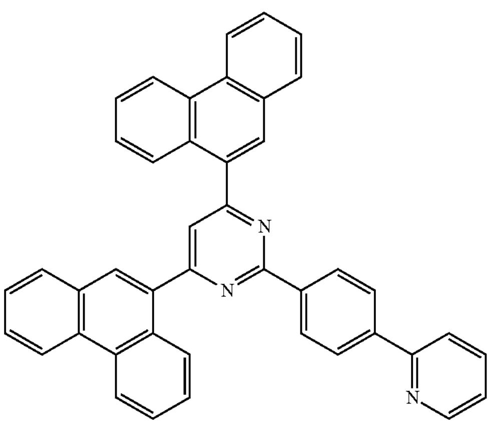
ET23
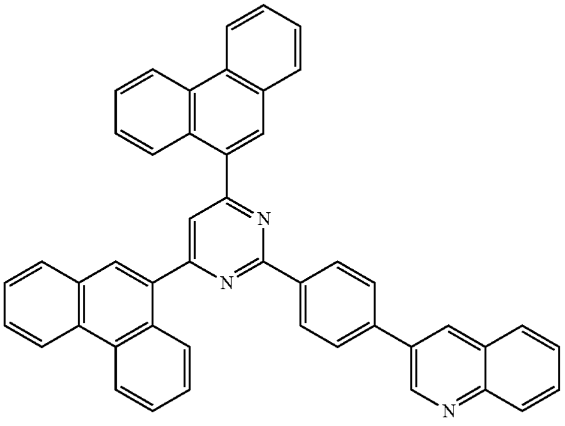
ET24
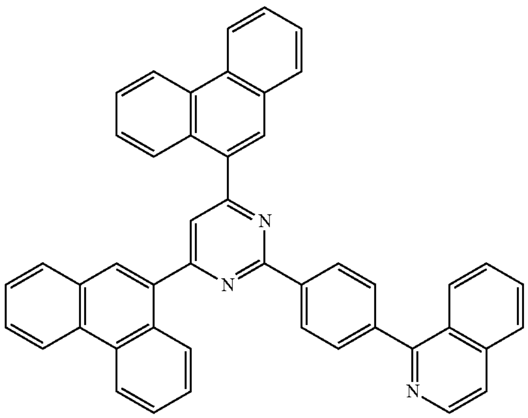
-continued
ET25
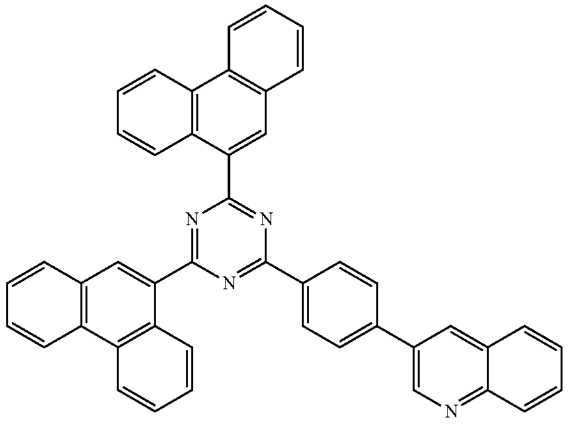
ET26
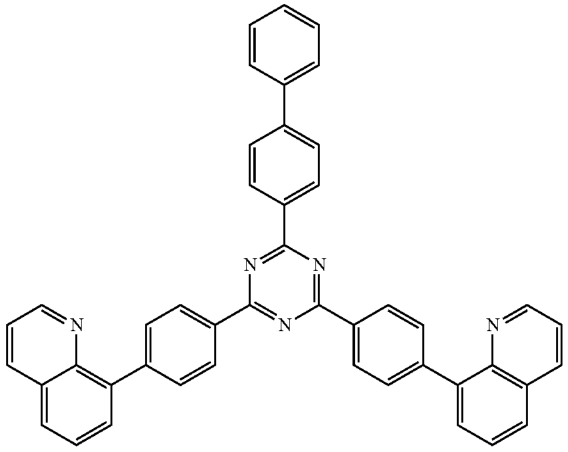
ET27
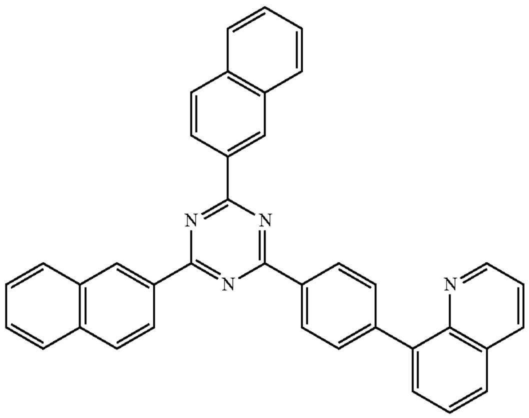

ET28
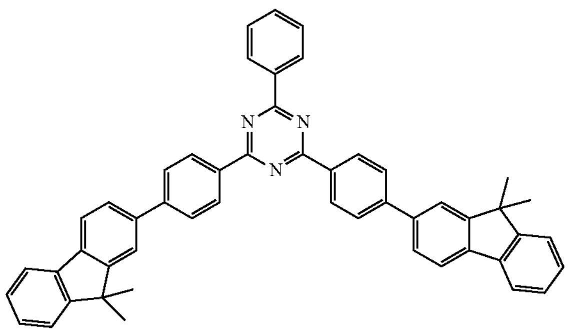
ET29
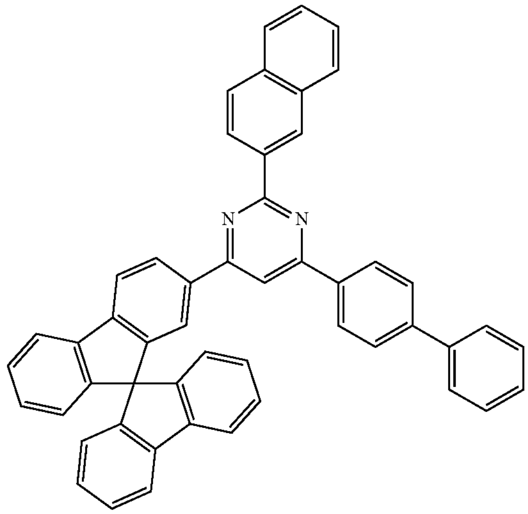
ET30
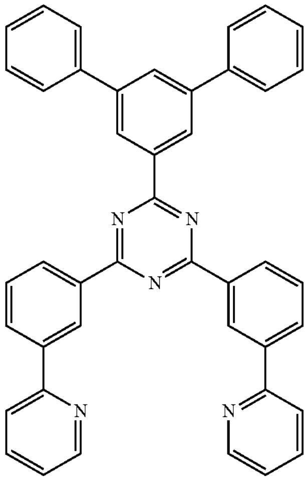
ET31
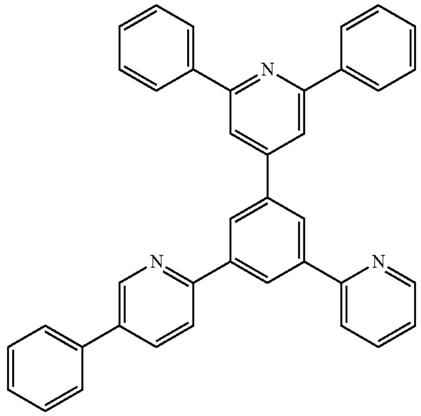
ET32
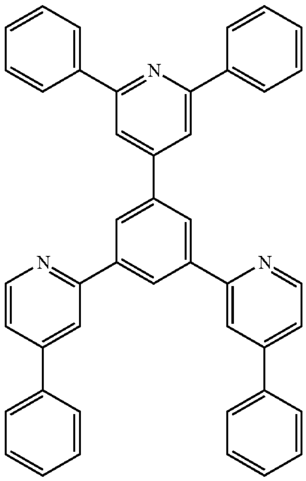
ET33
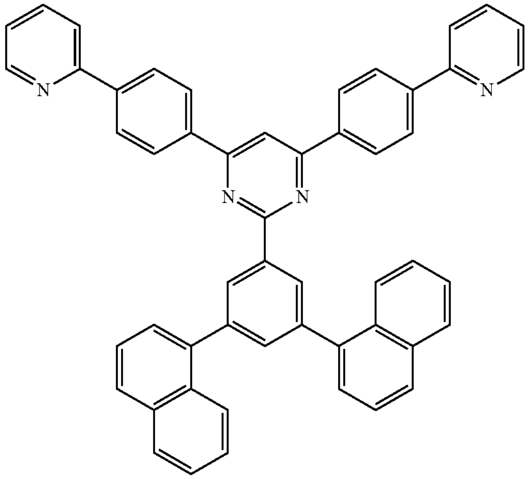

-continued

ET34

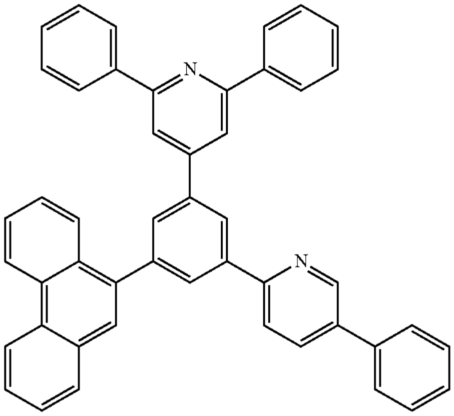

ET35

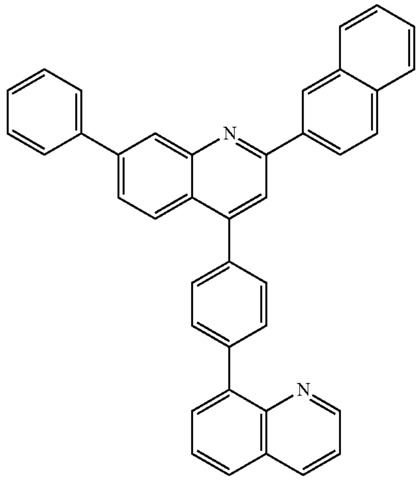

ET36

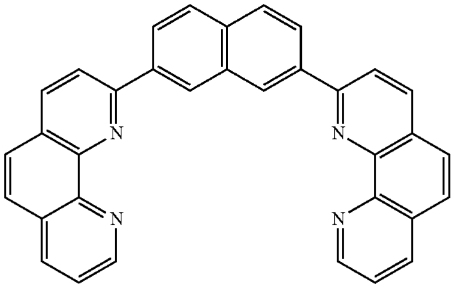

The electron transport region ETR may include: halogenated metals such as LiF, NaCl, CsF, RbCl, RbI, CuI, and KI; lanthanide metals such as Yb; or co-deposition materials of a halogenated metal and a lanthanide metal. For example, the electron transport region ETR may include KI:Yb, RbI:Yb, LiF:Yb, etc. as a co-deposition material. The electron transport region ETR may include a metal oxide such as $Li_2O$ and BaO, or 8-hydroxyl-lithium quinolate (Liq), etc., but embodiments are not limited thereto. In another embodiment, the electron transport region ETR may be formed of a mixture material of an electron transport material and an insulating organometallic salt. The organometallic salt may be a material having an energy band gap equal to or greater than about 4 eV. For example, the organometallic salt may include metal acetates, metal benzoates, metal acetoacetates, metal acetylacetonates, or metal stearates.

The electron transport region ETR may further include, for example, at least one of 2,9-dimethyl-4,7-diphenyl-1,10- phenanthroline (BCP), diphenyl(4-(triphenylsilyl)phenyl) phosphine oxide (TSPO1), and 4,7-diphenyl-1,10-phenanthroline (Bphen) in addition to the materials described above, but embodiments are not limited thereto.

The electron transport region ETR may include the compounds of the electron transport region described above in at least one of an electron injection layer, an electron transport layer, or a hole blocking layer.

When the electron transport region ETR includes an electron transport layer, the electron transport layer may have a thickness in a range of about 100 Å to about 1,000 Å For example, the electron transport layer may have a thickness in a range of about 150 Å to about 500 Å. When the thickness of the electron transport layer satisfies any of the above-described ranges, satisfactory electron transport properties may be obtained without a substantial increase in driving voltage. When the electron transport region ETR includes an electron injection layer, the electron injection layer may have a thickness in a range of about 1 Å to about 100 Å. For example, the electron injection layer may have a thickness in a range of about 3 Å to about 90 Å. When the thickness of the electron injection layer satisfies any of the above-described ranges, satisfactory electron injection properties may be obtained without a substantial increase in driving voltage.

The second electrode EL2 is provided on the electron transport region ETR. The second electrode EL2 may be a common electrode. The second electrode EL2 may be a cathode or an anode but embodiments are not limited thereto. For example, when the first electrode EL1 is an anode, the second electrode EL2 may be a cathode, and when the first electrode EL1 is a cathode, the second electrode EL2 may be an anode.

The second electrode may include Ag, Mg, Cu, Al, Pt, Pd, Au, Ni, Nd, Ir, Cr, Li, Ca, LiF, Mo, Ti, W, In, Sn, Zn, an oxide thereof, a compound thereof, or a mixture thereof.

The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (e.g., AgMg, AgYb, or MgAg). In another embodiment, the second electrode EL2 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the second electrode EL2 may include the above-described metal materials, a combination of two or more metal materials selected from the above-described metal materials, or oxides of the above-described metal materials.

Although not shown in the drawings, the second electrode EL2 may be electrically connected to an auxiliary electrode. When the second electrode EL2 is electrically connected to an auxiliary electrode, the resistance of the second electrode EL2 may decrease.

In an embodiment, the light emitting element ED may further include a capping layer disposed on the second electrode EL2. The capping layer may be a multilayer or a single layer.

In an embodiment, the capping layer may include an organic layer or an inorganic layer. For example, when the capping layer includes an inorganic material, the inorganic material may include an alkali metal compound such as LiF, an alkaline earth metal compound such as $MgF_2$, SiON, $SiN_X$, SiOy, etc.

For example, when the capping layer includes an organic material, the organic material may include α-NPD, NPB, TPD, m-MTDATA, $Alq_3$ CuPc, N4,N4,N4',N4'-tetra(biphenyl-4-yl)biphenyl-4,4'-diamine (TPD15), 4,4',4"-tris(carbazol-9-yl)triphenylamine (TCTA), etc., or may include epoxy resins or acrylates such as methacrylates. However, embodiments are not limited thereto. In an embodiment, the capping layer may include at least one of Compounds P1 to P5:

P1

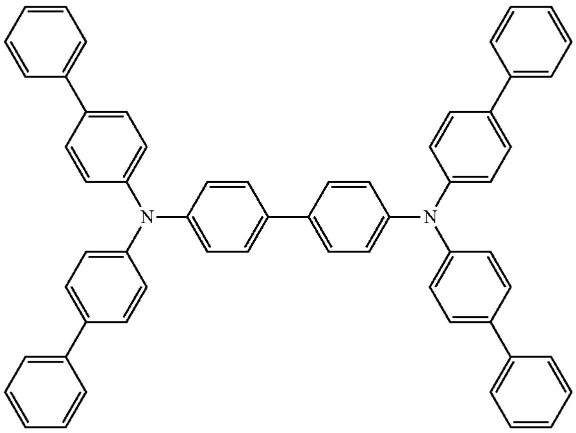

P2

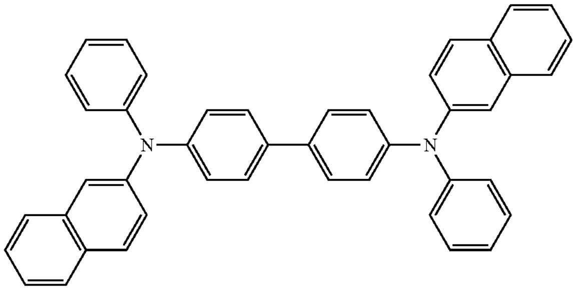

P3

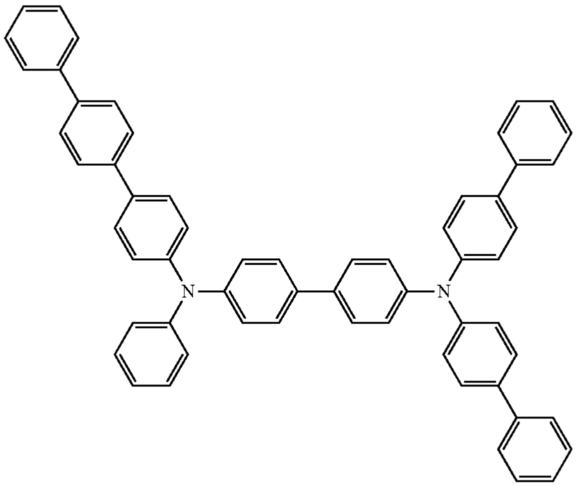

-continued

P4

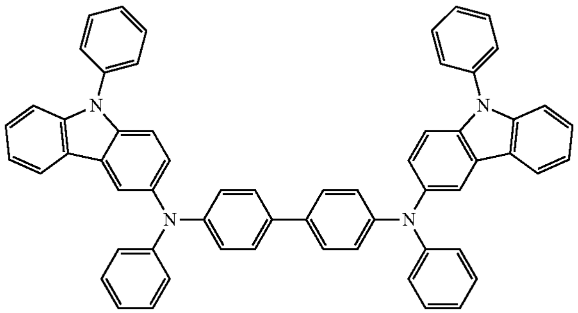

P5

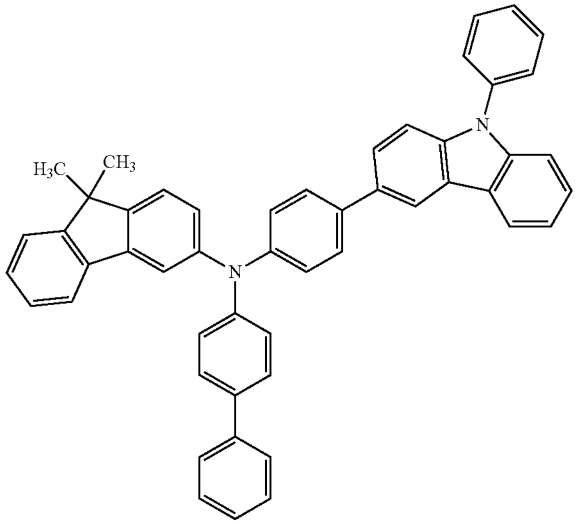

The capping layer may have a refractive index equal to or greater than about 1.6. For example, the capping layer may have a refractive index equal to or greater than about 1.6 with respect to light in a wavelength range of about 550 nm to about 660 nm.

Figure 5:
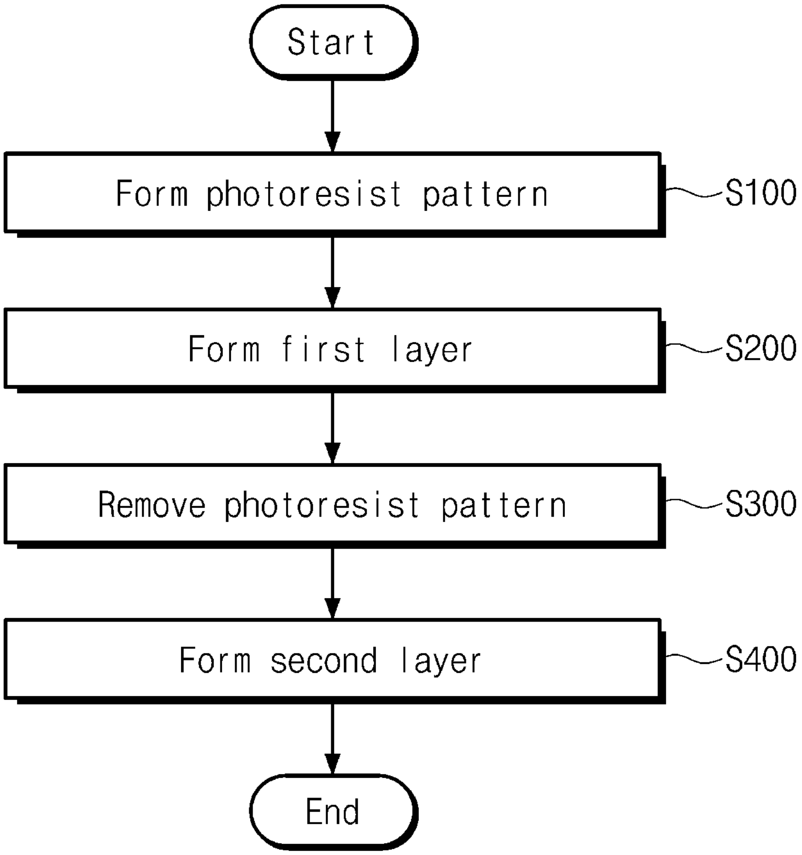
FIG. 5 is a flowchart of processes in a method for manufacturing a light emitting element according to an embodiment.

FIG. 5 is a flowchart of processes in a method for manufacturing a light emitting element according to an embodiment. FIGS. 6A to 6E are each a schematic cross-sectional view of processes in a method for manufacturing a display device according to an embodiment.

According to embodiments, a method for manufacturing a light emitting element includes forming a first electrode on a base layer, forming functional layers on the first electrode, and forming a second electrode on the functional layers.

FIGS. 5 and 6A to 6E show processes for forming a first electrode on a base layer in a method for manufacturing a light emitting element according to an embodiment. Hereinafter, the forming a first electrode on a base layer will be described with reference to FIGS. 5 and 6A to 6E, and the same reference symbols are given to components that are the same as the components described above, and thus, their detailed descriptions will not be explained again.

Referring to FIG. 5, the forming of the first electrode includes forming photoresist patterns on a base layer (S100), forming a first layer on the photoresist patterns (S200), removing the photoresist patterns (S300), and forming a second layer on the first layer (S400).

Figure 6A:
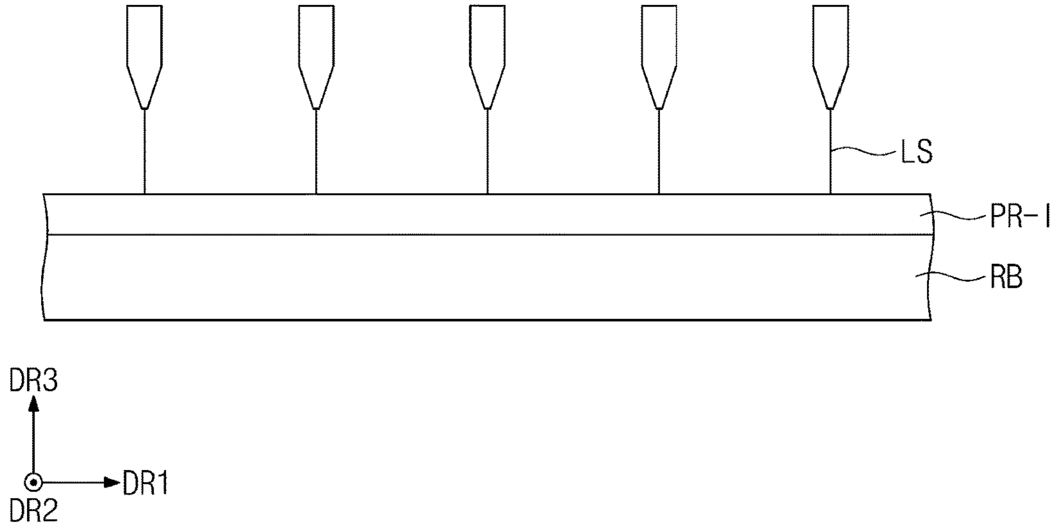
FIGS. 6A to 6E are each a schematic cross-sectional view of processes in a method for manufacturing a display device according to an embodiment.
Figure 6B:
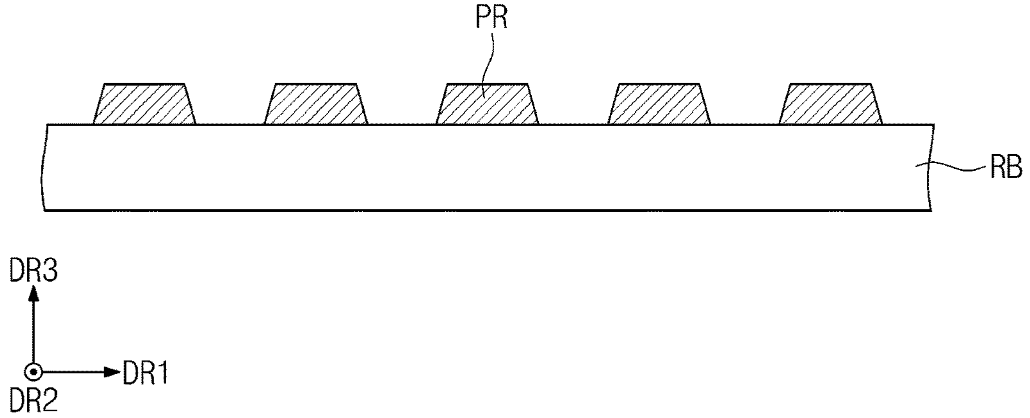
Figure 6C:
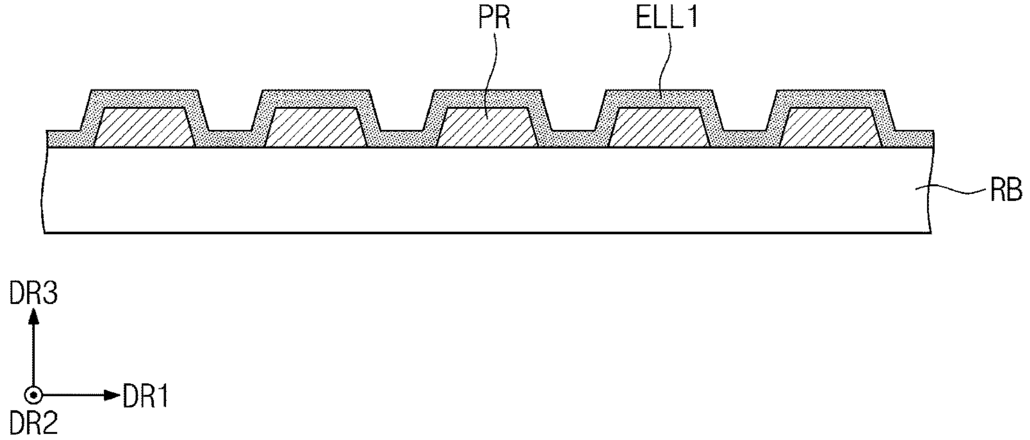

Referring to FIGS. 5, 6A, and 6B together, the method for manufacturing a light emitting element according to an embodiment includes forming photoresist patterns PR on a base layer RB. The photoresist patterns PR may be spaced apart from each other along a first direction DR1 and arranged in the form of a stripe extending along the second direction DR2. The photoresist patterns PR may have a substantially same shape as those of the photonic crystal pore patterns PCG described above in FIGS. 3A, 4A, and 4B.

The forming of the photoresist patterns PR may be performed by emitting light such as a laser LS after forming a preliminary photoresist layer PR-I. In an embodiment, as shown in FIGS. 6A and 6B, the photoresist patterns PR may be negative photoresist patterns in which, of the preliminary photoresist layer PR-I, patterns are formed on a portion irradiated with the laser LS and the remaining portion is removed. However, embodiments are not limited thereto, and the photoresist patterns PR according to an embodiment may be positive photoresist patterns.

In an embodiment, the forming of the photoresist patterns PR may be performed through laser interference lithography. In the method for manufacturing a light emitting element according to an embodiment, when forming photoresist patterns PR, using a laser interference lithography method, nanoscale patterns having a period may be formed on a large area through simple laser irradiation. Laser interference lithography is a technology that engraves a pattern by using an interference pattern of light, and a method in which two or more coherent light beams create an interference pattern having a certain periodicity, and after exposure to a photosensitizer applied onto a substrate, a nanopattern is formed through a developing process, and may thus be an effective method for fabricating periodic nanostructures. In the method for manufacturing a light emitting element according to an embodiment, photoresist patterns PR may be formed using laser interference lithography, and accordingly, photoresist patterns PR having a nano-scale stripe pattern may be formed with simplified process procedures and reduced process costs.

Referring to FIGS. 5, and 6B to 6D together, the method for manufacturing a light emitting element according to an embodiment may include forming a first layer ELL1 on photoresist patterns PR, and removing the photoresist patterns PR.

The forming of the first layer ELL1 may be performed by providing a transparent conductive oxide to cover the photoresist patterns PR. The transparent conductive oxide may be, for example, indium zinc oxide, indium tin oxide, or any combination thereof.

As the first layer ELL1 is provided on the photoresist patterns PR, an upper surface of the first layer ELL1 may be provided as an uneven surface instead of a flat surface. For example, the upper surface of the first layer ELL1 may be provided as a stepped surface having a step between a portion disposed on the photoresist patterns PR and a portion disposed between the photoresist patterns PR.

After the forming of the first layer ELL1, as the photoresist patterns PR are removed, photonic crystal pore patterns PCG may be formed between the base layer RB and the first layer ELL1. The photoresist patterns PR may be removed through, for example, sonication. As the photoresist patterns PR is removed through sonication or the like, the photonic crystal pore patterns PCG may be provided in a vacuum state. The photonic crystal pore patterns PCG may have a substantially same shape as the photoresist patterns PR which are removed. The photonic crystal pore patterns PCG may be spaced apart from each other along the first direction DR1 and arranged in the form of a stripe extending along the second direction DR2.

Figure 6D:
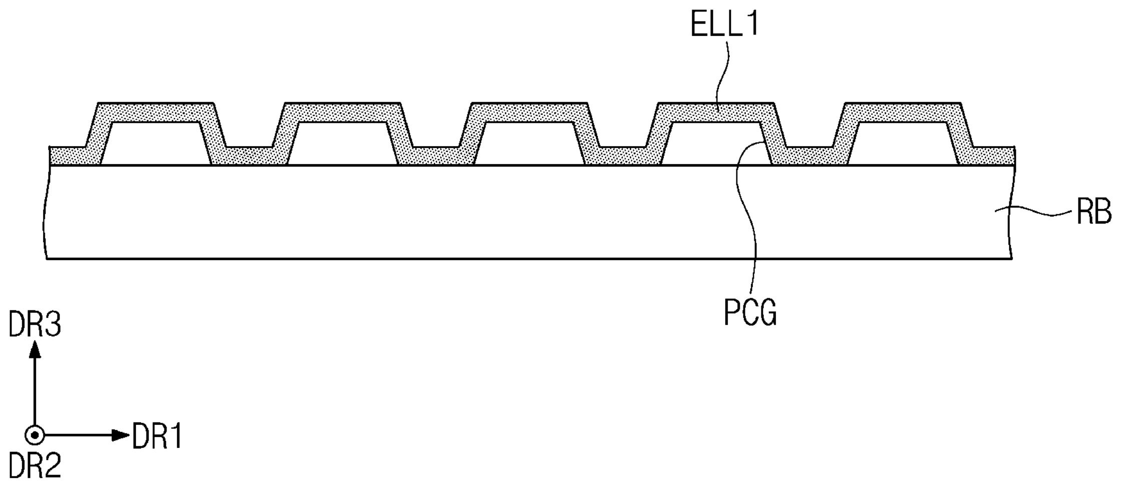
Figure 6E:
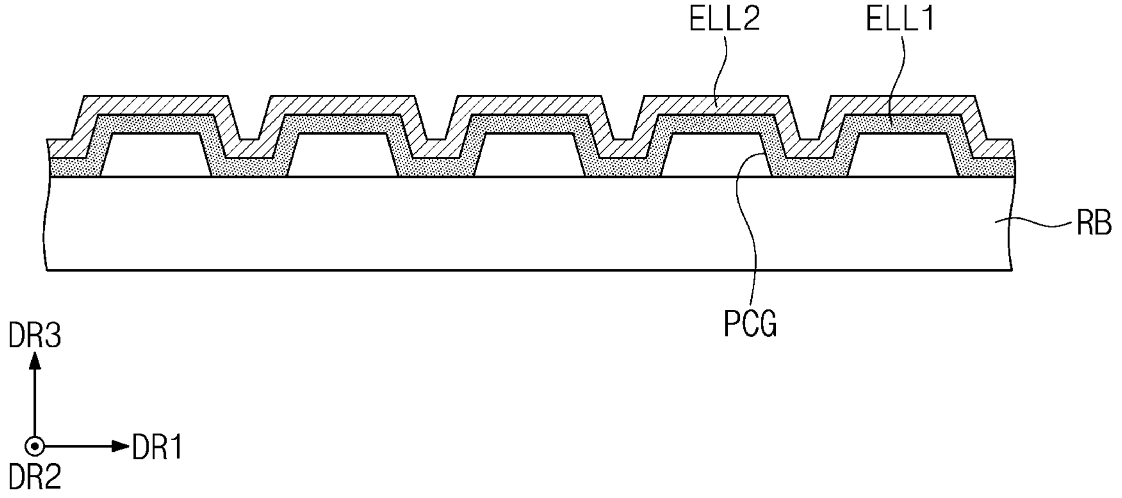

Referring to FIGS. 5, 6D, and 6E together, after the photoresist patterns PR are removed to form the photonic crystal pore patterns PCG, a second layer ELL2 is formed on the first layer ELL1. The second layer ELL2 may be formed by providing a reflective metal on the first layer ELL1. The reflective metal may include, for example, silver (Ag), gold (Au), aluminum (Al), or any combination thereof. The second layer ELL2 may be provided as an ultra-thin film having a small thickness. Although not shown in FIGS. 5, 6D, and 6E, a third layer ELL3 may be further included on the second layer ELL2, as shown in FIGS. 3B and 4D. The third layer ELL3 may include a transparent conductive oxide such as indium zinc oxide and indium tin oxide, and may cover an upper surface of the second layer ELL2 having a high surface roughness by including a metal such as silver (Ag).

Figure 7A:
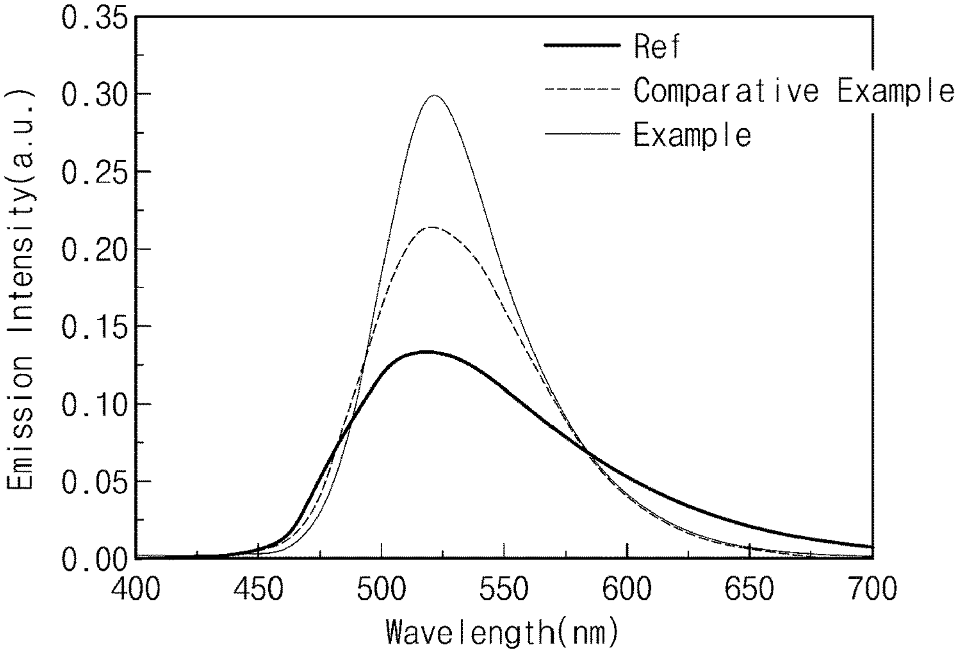
FIGS. 7A and 7B are each a graph of emission intensity for each wavelength of light emitting elements according to the Example, the Comparative Example, and the Reference Example.
Figure 7B:
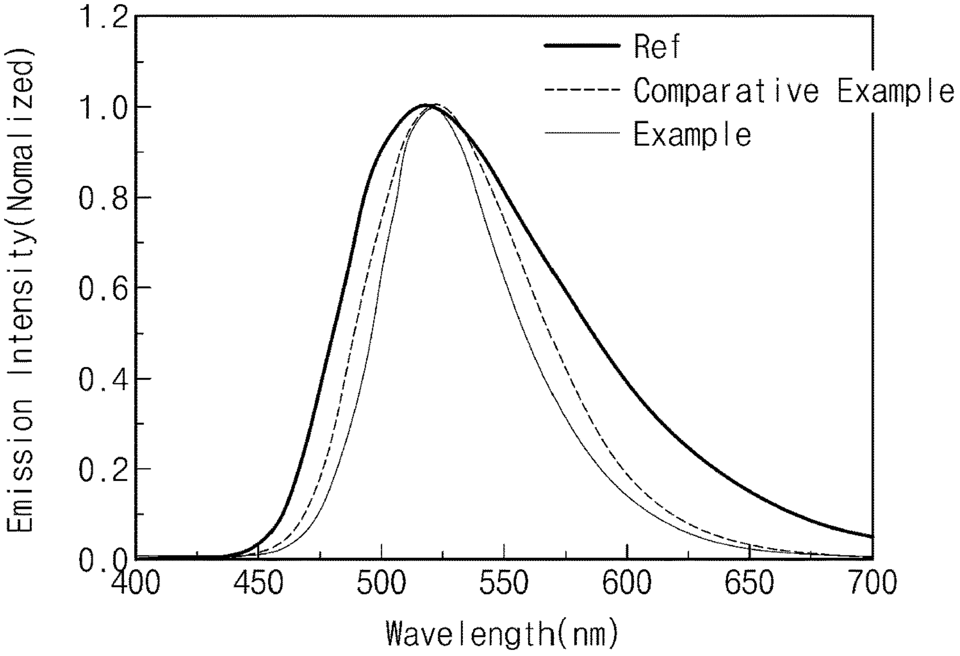
Figure 7C:
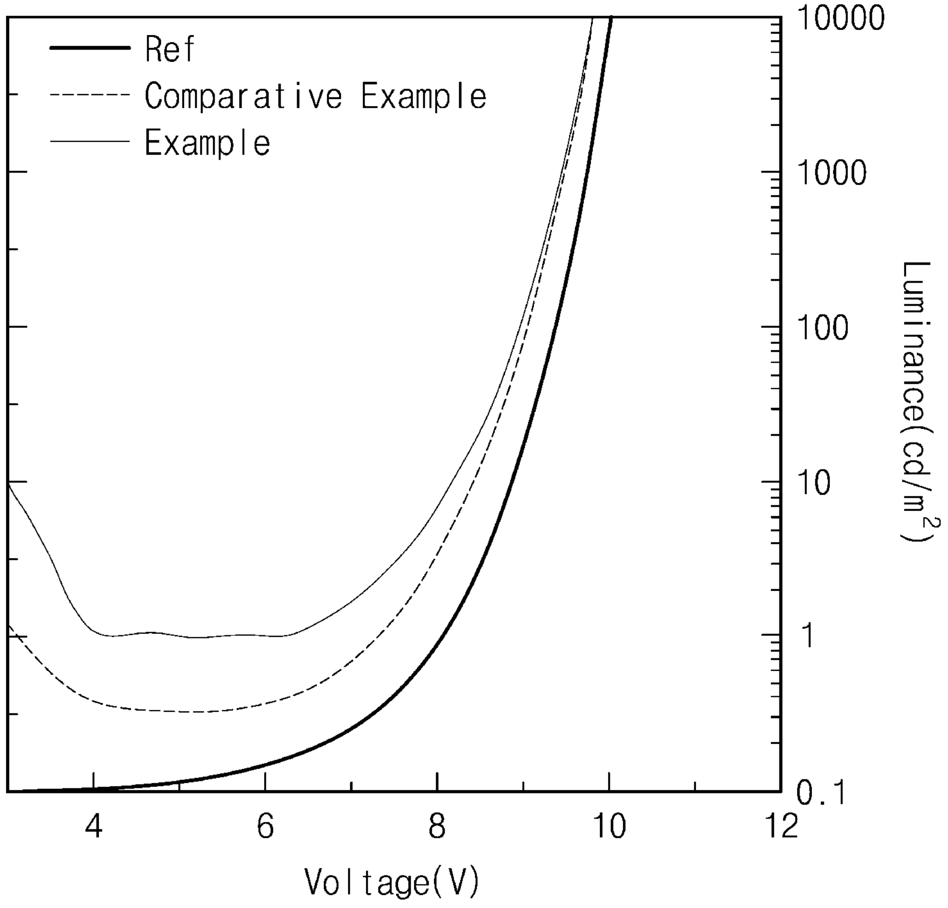
FIG. 7C is a graph of luminance for each voltage of light emitting elements according to the Example, the Comparative Example, and the Reference Example.

FIGS. 7A and 7B are each a graph of emission intensity for each wavelength of light emitting elements according to the Example, the Comparative Example, and the Reference Example. FIG. 7C is a graph of luminance for each voltage of light emitting elements according to the Example, the Comparative Example, and the Reference Example. FIG. 7A shows absolute values of emission intensity for each wavelength of light emitting elements according to the Example, the Comparative Example, and the Reference Example, and FIG. 7B shows normalized emission intensity for each wavelength of light emitting element according to the Example, the Comparative Example, and the Reference Example. As shown in FIG. 3B, in FIGS. 7A to 7C, the Example is a light emitting element in which a first electrode EL1' included in a light emitting element includes a structure of a first layer ELL1, a second layer ELL2, and a third layer ELL3, and photonic crystal pore patterns PCG defined between the first layer ELL1 and a base layer RB; the Comparative Example, different from the Example, is a light emitting element in which a first electrode includes only a first layer ELL1, and photonic crystal pore patterns defined between the first layer and a base layer; and the Reference Example is a light emitting element including a first electrode having a planarized first layer without a photonic crystal pore pattern.

Referring to FIGS. 7A and 7B, it is seen that the light emitting element of the Example has a higher emission intensity than that of the Comparative Example and that of the Reference Example in a wavelength range of 500 nm to 550 nm, which is a peak wavelength, and in a graph of normalized emission intensity, the light emitting element of the Example has narrower half-width than that of the Comparative Example and that of the Reference Example. Referring to FIG. 7C, it is seen that the light emitting element of the Example has a higher luminance value than that of the Comparative Example and that of Reference Example at the same voltage value. Accordingly, it is seen that the light emitting element according to an embodiment is capable of emitting light having high intensity and high luminance corresponding to a target emission wavelength, thereby improving luminous efficiency.

The light emitting element of an embodiment includes a first electrode having photonic crystal pore patterns defined in a lower portion, and including a first layer containing a transparent conductive oxide and a second layer in the form of a thin film containing a reflective metal. Accordingly, the luminous efficiency of the light emitting element may be improved, and optical properties such as viewing angle and color purity may be improved.

In embodiments, in the first electrode included in the light emitting element, photonic crystal pore patterns may provide a first layer structure defined in the lower portion to refract light generated through a photonic crystal structure. Accordingly, lost light may be emitted to improve luminous efficiency, and the viewing angle is controlled to prevent distortion. Since the photonic crystal pore pattern structure in the lower portion of the first electrode is formed by photoresist patterns of a stripe arrangement formed through laser interference lithography or the like, a nanoscale photonic crystal structure may be formed through a simple process, thereby simplifying processes, and reducing process costs.

The first electrode included in the light emitting element according to an embodiment includes a second layer in the form of a thin film containing a reflective metal on the first layer structure, and a microcavity effect may thus be achieved through the second layer structure formed of a semi-transparent reflective film. Accordingly, color purity of extracted light is improved, and intensity and luminance of light may be further improved to increase luminous efficiency of the light emitting element. For example, the light emitting element according to an embodiment is capable of achieving both improvement in light efficiency according to lost light refraction by a first layer having a photonic crystal structure in a first electrode, and improvement in light emission intensity by a second layer having a microcavity implementation structure through a semi-transparent reflective film, and may thus be provided as a light emitting element having high luminous efficiency and excellent color purity.

A light emitting element according to an embodiment may achieve both improvement in light efficiency by a layer having a photonic crystal structure, and improvement in light emission intensity by a layer having a microcavity implementation structure, and thus have high luminous efficiency and excellent color purity.

According to a method for manufacturing a light emitting element according to an embodiment, a light emitting element having a photonic crystal structure and a microcavity implementation structure may be manufactured through a simple process, thereby reducing process costs.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. A light emitting element comprising:
a base layer;
a first electrode disposed on the base layer;
a second electrode facing the first electrode; and
a plurality of functional layers disposed between the first electrode and the second electrode, wherein
the first electrode includes:
a first layer disposed on the base layer; and
a second layer disposed on the first layer and including a reflective metal, and
a plurality of photonic crystal pore patterns, each spaced apart along a first direction and extending along a second direction crossing the first direction, are defined between the base layer and the first layer.

2. The light emitting element of claim 1, wherein the plurality of photonic crystal pore patterns each have a width in the first direction in a range of about 50 nm to about 550 nm.

3. The light emitting element of claim 1, wherein the plurality of photonic crystal pore patterns each have a height in a third direction crossing each of the first direction and the second direction in a range of about 20 nm to about 110 nm.

4. The light emitting element of claim 1, wherein the first electrode further comprises a third layer disposed on the second layer and including a transparent conductive oxide.

5. The light emitting element of claim 4, wherein an upper surface of the third layer is a flat surface.

6. The light emitting element of claim 1, wherein the plurality of photonic crystal pore patterns is each in a vacuum state.

7. The light emitting element of claim 1, wherein the first layer comprises:
a first portion disposed between the plurality of photonic crystal pore patterns; and
a second portion extending from the first portion and disposed on the plurality of photonic crystal pore patterns.

8. The light emitting element of claim 7, wherein the second layer comprises:
a third portion disposed on the first portion; and
a fourth portion extending from the third portion and disposed on the second portion.

9. The light emitting element of claim 7, wherein a thickness of the first portion and a thickness of the second portion are substantially the same.

10. The light emitting element of claim 7, wherein
the first portion contacts an upper surface of the base layer, and
the plurality of photonic crystal pore patterns are defined between the base layer and the second portion.

11. The light emitting element of claim 1, wherein
the first layer comprises indium zinc oxide, indium tin oxide, or a combination thereof, and
the second layer comprises silver (Ag), gold (Au), aluminum (Al), or a combination thereof.

12. The light emitting element of claim 1, wherein the plurality of functional layers comprise:
a hole transport region disposed on the first electrode;
an emission layer disposed on the hole transport region; and
an electron transport region disposed on the emission layer.

13. The light emitting element of claim 1, wherein an upper surface of the base layer is a flat surface.

14. A light emitting element comprising:
a base layer;
a first electrode disposed on the base layer;
a second electrode facing the first electrode; and
a plurality of functional layers disposed between the first electrode and the second electrode, wherein
the first electrode includes:
a first layer disposed on the base layer, and having a portion thereof disposed directly on the base layer and a remaining portion thereof disposed to be spaced apart from the base layer with a void therebetween;
a second layer disposed on the first layer and including a reflective metal; and
a third layer disposed on the second layer and including a transparent conductive oxide.

15. A method for manufacturing a display device, the method comprising:

forming a first electrode on a base layer;

forming a plurality of functional layers on the first electrode; and forming a second electrode on the plurality of functional layers, wherein the forming of the first electrode includes:

forming a plurality of photoresist patterns each spaced apart along a first direction on the base layer and extending in a second direction crossing the first direction;

providing a transparent conductive oxide to cover the plurality of photoresist patterns to form a first layer;

removing the plurality of photoresist patterns after the forming of the first layer; and providing a reflective metal on the first layer to form a second layer.

16. The method of claim 15, wherein the forming of the first electrode further includes:

providing a transparent conductive oxide on the second layer to form a third layer.

17. The method of claim 15, wherein in the removing of the plurality of photoresist patterns, a plurality of photonic crystal pore patterns in a vacuum state are formed between the base layer and the first layer.

18. The method of claim 17, wherein the first layer comprises:

a first portion disposed between the plurality of photonic crystal pore patterns; and a second portion extending from the first portion and disposed on the plurality of photonic crystal pore patterns, and the first portion contacts an upper surface of the base layer, and the plurality of photonic crystal pore patterns are defined between the base layer and the second portion.

19. The method of claim 15, wherein the transparent conductive oxide comprises indium zinc oxide, indium tin oxide, or a combination thereof, and the reflective metal comprises silver (Ag), gold (Au), aluminum (Al), or a combination thereof.

20. The method of claim 15, wherein the forming of the plurality of photoresist patterns is performed through laser interference lithography.

* * * * *